United States Patent
Ohsawa et al.

(10) Patent No.: US 10,374,186 B2
(45) Date of Patent: Aug. 6, 2019

(54) LIGHT-EMITTING ELEMENT, DISPLAY MODULE, LIGHTING MODULE, LIGHT-EMITTING DEVICE, DISPLAY DEVICE, ELECTRONIC APPLIANCE, AND LIGHTING DEVICE

(71) Applicant: Semiconductor Energy Laboratory Co., Ltd., Atsugi-shi, Kanagawa-ken (JP)

(72) Inventors: Nobuharu Ohsawa, Kanagawa (JP); Yusuke Nonaka, Kanagawa (JP); Takahiro Ishisone, Kanagawa (JP); Satoshi Seo, Kanagawa (JP); Takuya Kawata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/983,223

(22) Filed: May 18, 2018

(65) Prior Publication Data

US 2018/0269418 A1    Sep. 20, 2018

Related U.S. Application Data

(63) Continuation of application No. 15/162,675, filed on May 24, 2016, now Pat. No. 10,026,917, which is a (Continued)

(30) Foreign Application Priority Data

| Dec. 2, 2013 | (JP) | ................................ 2013-249486 |
| May 9, 2014 | (JP) | ................................ 2014-097803 |
| Sep. 5, 2014 | (JP) | ................................ 2014-180913 |

(51) Int. Cl.
| H01L 51/50 | (2006.01) |
| H01L 27/32 | (2006.01) |
| H01L 51/00 | (2006.01) |

(52) U.S. Cl.
CPC ...... *H01L 51/5044* (2013.01); *H01L 27/3209* (2013.01); *H01L 51/5016* (2013.01);
(Continued)

(58) Field of Classification Search
None
See application file for complete search history.

(56) References Cited

U.S. PATENT DOCUMENTS

| 5,281,489 A | 1/1994 | Mori et al. |
| 6,995,509 B2 | 2/2006 | Yamazaki et al. |

(Continued)

FOREIGN PATENT DOCUMENTS

| CN | 102428589 A | 4/2012 |
| CN | 102683615 A | 9/2012 |

(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.

(Continued)

*Primary Examiner* — Evren Seven
(74) *Attorney, Agent, or Firm* — Fish & Richardson P.C.

(57) ABSTRACT

An object of one embodiment of the present invention is to provide a multicolor light-emitting element that utilizes fluorescence and phosphorescence and is advantageous for practical application. The light-emitting element has a stacked-layer structure of a first light-emitting layer containing a host material and a fluorescent substance, a separation layer containing a substance having a hole-transport
(Continued)

property and a substance having an electron-transport property, and a second light-emitting layer containing two kinds of organic compounds that form an exciplex and a substance that can convert triplet excitation energy into luminescence. Note that a light-emitting element in which light emitted from the first light-emitting layer has an emission spectrum peak on the shorter wavelength side than an emission spectrum peak of the second light-emitting layer is more effective.

18 Claims, 26 Drawing Sheets

Related U.S. Application Data continuation of application No. 14/548,947, filed on Nov. 20, 2014, now Pat. No. 9,362,517.

(52) U.S. Cl.
CPC ...... *H01L 51/5028* (2013.01); *H01L 51/5056* (2013.01); *H01L 51/5072* (2013.01); *H01L 51/006* (2013.01); *H01L 51/0051* (2013.01); *H01L 51/0052* (2013.01); *H01L 51/0054* (2013.01); *H01L 51/0058* (2013.01); *H01L 51/0061* (2013.01); *H01L 51/0067* (2013.01); *H01L 51/0072* (2013.01); *H01L 51/0074* (2013.01); *H01L 51/0085* (2013.01); *H01L 2251/5376* (2013.01); *H01L 2251/5384* (2013.01); *H01L 2251/558* (2013.01)

(56) References Cited

U.S. PATENT DOCUMENTS

| | | | |
|---|---|---|---|
| 7,009,338 B2 | 3/2006 | D'Andrade et al. |
| 7,175,922 B2 | 2/2007 | Jarikov et al. |
| 7,183,010 B2 | 2/2007 | Jarikov |
| 7,285,907 B2 | 10/2007 | D'Andrade et al. |
| 7,332,857 B2 | 2/2008 | Seo et al. |
| 7,572,522 B2 | 8/2009 | Seo et al. |
| 7,597,967 B2 | 10/2009 | Kondakova et al. |
| 7,943,925 B2 | 5/2011 | Yamazaki |
| 7,993,760 B2 | 8/2011 | Komori et al. |
| 8,034,465 B2 | 10/2011 | Liao et al. |
| 8,101,857 B2 | 1/2012 | Kido et al. |
| 8,247,086 B2 | 8/2012 | Inoue et al. |
| 8,274,214 B2 | 9/2012 | Ikeda et al. |
| 8,530,060 B2 | 9/2013 | Ushikubo et al. |
| 8,653,553 B2 | 2/2014 | Yamazaki et al. |
| 8,853,680 B2 | 10/2014 | Yamazaki et al. |
| 8,912,531 B2 | 12/2014 | Ogiwara et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,054,317 B2 | 6/2015 | Monkman et al. |
| 9,059,430 B2 | 6/2015 | Seo et al. |
| 9,076,976 B2 | 7/2015 | Seo et al. |
| 9,099,617 B2 | 8/2015 | Yamazaki et al. |
| 9,153,790 B2 | 10/2015 | Kuma et al. |
| 9,159,942 B2 | 10/2015 | Seo et al. |
| 9,175,213 B2 | 11/2015 | Seo et al. |
| 9,263,693 B2 | 2/2016 | Seo et al. |
| 9,356,250 B2 | 5/2016 | Ohsawa et al. |
| 9,525,149 B2 | 12/2016 | Seo et al. |
| 9,590,208 B2 | 3/2017 | Seo et al. |
| 9,604,928 B2 | 3/2017 | Shitagaki et al. |
| 9,786,860 B2 | 10/2017 | Yamazaki et al. |
| 9,893,303 B2 | 2/2018 | Suzuki et al. |
| 10,062,867 B2 | 8/2018 | Seo et al. |
| 2003/0091862 A1 | 5/2003 | Tokito et al. |
| 2003/0175553 A1 | 9/2003 | Thompson et al. |
| 2005/0048310 A1 | 3/2005 | Cocchi et al. |
| 2005/0221116 A1 | 10/2005 | Cocchi et al. |
| 2006/0134464 A1 | 6/2006 | Nariyuki |
| 2006/0228577 A1 | 10/2006 | Nagara |
| 2006/0279203 A1* | 12/2006 | Forrest ............... H01L 51/0072 313/504 |
| 2007/0090756 A1 | 4/2007 | Okada et al. |
| 2007/0244320 A1 | 10/2007 | Inoue et al. |
| 2007/0278937 A1* | 12/2007 | Forrest ............... H01L 51/5016 313/504 |
| 2008/0160345 A1 | 7/2008 | Inoue et al. |
| 2008/0286604 A1 | 11/2008 | Inoue et al. |
| 2009/0284139 A1 | 11/2009 | Ushikubo et al. |
| 2010/0052527 A1 | 3/2010 | Ikeda et al. |
| 2010/0145044 A1 | 6/2010 | Inoue et al. |
| 2010/0295445 A1 | 11/2010 | Kuma et al. |
| 2011/0001146 A1 | 1/2011 | Yamazaki et al. |
| 2011/0082296 A1 | 4/2011 | Inoue et al. |
| 2011/0210316 A1 | 9/2011 | Kadoma et al. |
| 2011/0215714 A1 | 9/2011 | Seo et al. |
| 2011/0248294 A1* | 10/2011 | Weaver ............... H01L 25/048 257/89 |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217486 A1 | 8/2012 | Takemura et al. |
| 2012/0217487 A1 | 8/2012 | Yamazaki et al. |
| 2012/0235127 A1 | 9/2012 | Takasu et al. |
| 2012/0256535 A1 | 9/2012 | Seo et al. |
| 2012/0248421 A1 | 10/2012 | Yamazaki et al. |
| 2012/0274201 A1 | 11/2012 | Seo et al. |
| 2012/0277427 A1 | 11/2012 | Inoue et al. |
| 2013/0048964 A1 | 2/2013 | Takeda et al. |
| 2013/0069090 A1 | 3/2013 | Sawabe et al. |
| 2013/0207088 A1 | 8/2013 | Seo |
| 2013/0240851 A1 | 9/2013 | Seo et al. |
| 2013/0270531 A1 | 10/2013 | Seo et al. |
| 2013/0277653 A1 | 10/2013 | Osaka et al. |
| 2013/0277654 A1 | 10/2013 | Seo et al. |
| 2013/0277655 A1 | 10/2013 | Seo et al. |
| 2013/0277656 A1 | 10/2013 | Seo et al. |
| 2013/0292656 A1 | 11/2013 | Seo et al. |
| 2013/0292664 A1 | 11/2013 | Nishimura et al. |
| 2013/0306945 A1 | 11/2013 | Seo |
| 2014/0034926 A1 | 2/2014 | Matsubara et al. |
| 2014/0034927 A1 | 2/2014 | Seo et al. |
| 2014/0034929 A1 | 2/2014 | Hamada et al. |
| 2014/0034930 A1 | 2/2014 | Seo et al. |
| 2014/0034931 A1 | 2/2014 | Inoue et al. |
| 2014/0034932 A1 | 2/2014 | Seo et al. |
| 2014/0042469 A1 | 2/2014 | Seo et al. |
| 2014/0061604 A1 | 3/2014 | Seo et al. |
| 2014/0084269 A1* | 3/2014 | Weaver ............... H01L 27/3209 257/40 |
| 2014/0084274 A1 | 3/2014 | Yamazaki et al. |
| 2014/0284578 A1 | 9/2014 | Takeda et al. |
| 2014/0319492 A1 | 10/2014 | Seo et al. |
| 2014/0339522 A1 | 11/2014 | Nonaka et al. |
| 2015/0001502 A1 | 1/2015 | Seo et al. |
| 2015/0053958 A1 | 2/2015 | Ishisone et al. |
| 2015/0069352 A1 | 3/2015 | Kim et al. |
| 2017/0092878 A1 | 3/2017 | Seo et al. |
| 2018/0108854 A1 | 4/2018 | Yamazaki et al. |
| 2018/0151815 A1 | 5/2018 | Suzuki et al. |

FOREIGN PATENT DOCUMENTS

| | | |
|---|---|---|
| CN | 102757782 A | 10/2012 |
| CN | 103000820 A | 3/2013 |
| CN | 103081155 A | 5/2013 |
| CN | 104471733 A | 3/2015 |
| EP | 1202608 A | 5/2002 |
| EP | 2120275 A | 11/2009 |
| EP | 2434559 A | 3/2012 |
| EP | 2571073 A | 3/2013 |
| JP | 2004-522276 | 7/2004 |
| JP | 2004-241374 A | 8/2004 |

(56) References Cited

FOREIGN PATENT DOCUMENTS

| | | | |
|---|---|---|---|
| JP | 2008-288344 A | 11/2005 | |
| JP | 2006-024791 A | 1/2006 | |
| JP | 2006-024830 A | 1/2006 | |
| JP | 2006-120689 A | 5/2006 | |
| JP | 2009-302041 A | 12/2009 | |
| JP | 2010-171363 A | 8/2010 | |
| JP | 2012-004526 A | 1/2012 | |
| JP | 2012-186461 A | 9/2012 | |
| JP | 2012-195517 A | 10/2012 | |
| JP | 2012-238854 A | 12/2012 | |
| JP | 2013-065428 A | 4/2013 | |
| JP | 2013-125653 A | 6/2013 | |
| JP | 2013-219024 A | 10/2013 | |
| JP | 2013-219347 A | 10/2013 | |
| JP | 2013-239704 A | 11/2013 | |
| JP | 2014-078699 A | 5/2014 | |
| JP | 2014-209607 A | 11/2014 | |
| KR | 2009-0119731 A | 11/2009 | |
| KR | 2012-0024624 A | 3/2012 | |
| KR | 2012-0106621 A | 9/2012 | |
| KR | 2013-0030187 A | 3/2013 | |
| KR | 2013-0115027 A | 10/2013 | |
| KR | 2013-0133911 A | 12/2013 | |
| KR | 2014-0038886 A | 3/2014 | |
| KR | 2014-0136027 A | 11/2014 | |
| TW | 201246649 | 11/2012 | |
| TW | 201301603 | 1/2013 | |
| TW | 201307528 | 2/2013 | |
| TW | 201314985 | 4/2013 | |
| TW | 201723145 | 7/2017 | |
| WO | WO-2000/070655 | 11/2000 | |
| WO | WO-2010/134352 | 11/2010 | |
| WO | WO-2012/099241 | 7/2012 | |
| WO | WO-2012/111579 | 8/2012 | |
| WO | WO-2013/137088 | 9/2013 | |
| WO | WO-2013/137089 | 9/2013 | |
| WO | WO-2013/154342 | 10/2013 | |
| WO | WO-2013/157506 | 10/2013 | |
| WO | WO-2014/185434 | 11/2014 | |

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Gu.G et al., "Transparent Organic Light Emitting Devices", Appl. Phys. Lett. (Applied Physics Letters), May 6, 1996, vol. 68, No. 19, pp. 2606-2608.
Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.
Adachi.C et al., "Nearly 100% Internal Phosphorescence Efficiency in an Organic Light Emitting Device", J. Appl. Phys. (Journal of Applied Physics), Nov. 15, 2001, vol. 90, No. 10, pp. 5048-5051.
Baldo.M et al., "Prospects for Electrically Pumped Organic Lasers", Phys. Rev. B (Physical Review B), Jul. 19, 2002, vol. 66, pp. 035321-1-035321-16.
Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647.
Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.
Kondakova.M et al., "High-efficiency, low-voltage phosphorescent organic light-emitting diode devices with mixed host", J. Appl. Phys. (Journal of Applied Physics), Nov. 4, 2008, vol. 104, pp. 094501-1-094501-17.
Seo.J et al., "Efficient blue-green organic light-emitting diodes based on heteroleptic tris-cyclometalated iridium(III) complexes", Thin Solid Films, Sep. 25, 2008, vol. 517, No. 5, pp. 1807-1810.
Goushi.K et al., "Efficient organic light-emitting diodes through up-conversion from triplet to singlet excited states of exciplexes", Appl. Phys. Lett. (Applied Physics Letters), Jul. 12, 2012, vol. 101, No. 2, pp. 023306-1-023306-4.
Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.
International Search Report (Application No. PCT/IB2014/066182) dated Mar. 3, 2015.
Written Opinion (Application No. PCT/IB2014/066182) dated Mar. 3, 2015.
Gould.I et al., "Mechanisms of Exciplex Formation. Roles of Superexchange, Solvent Polarity, and Driving Force for Electron Transfer", J. Am. Chem. Soc. (Journal of the American Chemical Society), 1994, vol. 116, No. 18, pp. 8176-8187.
Yersin.H et al., Highly Efficient OLEDs with Phosphorescent Materials, 2008, pp. 1-97,283-309.
Tokito.S et al., "Improvement in performance by doping", Organic EL Display, Aug. 20, 2004, pp. 67-99, Ohmsha.
Jeon.W et al., "Ideal host and guest system in phosphorescent OLEDs", Organic Electronics, 2009, vol. 10, pp. 240-246, Elsevier.
Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.
Rausch.A et al., "Matrix Effects on the Triplet State of the OLED Emitter 1r(4,6-dFppy)2(pic)(FIrpic):Investigations by High-Resolution Optical Spectroscopy", Inorg. Chem. (Inorganic Chemistry), 2009, vol. 48, No. 5, pp. 1928-1937.
Gong.X et al., "Phosphorescence from iridium complexes doped into polymer blends", J. Appl. Phys. (Journal of Applied Physics), Feb. 1, 2004, vol. 95, No. 3, pp. 948-953.
Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006. vol. 25, No. 15, pp. 3631-3638.
Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794.
Tsuboyama.A et al., "Homoieptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.
Chen.F et al., "Triplet Exciton Confinement in Phosphorescent Polymer Light-Emitting Diodes", Appl. Phys. Lett. (Applied Physics Letters), Feb. 17, 2003, vol. 82, No. 7, pp. 1006-1008.
Lee.J et al., "Stabilizing the efficiency of phosphorescent organic light-emitting diodes", SPIE Newsroom, Apr. 21, 2008, pp. 1-3.
Tokito.S et al., "Confinement of Triplet Energy on Phosphorescent Molecules for Highly-Efficient Organic Blue-Light-Emitting Devices", Appl. Phys. Lett. (Applied Physics Letters), Jul. 21, 2003, vol. 83, No. 3, pp. 569-571.
Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98. No. 8, pp. 083302-1-083302-3.
Park.Y et al., "Efficient triplet harvesting by fluorescent molecules through exciplexes for high efficiency organic light emitting diodes", Appl. Phys. Lett. (Applied Physics Letters), Apr. 18, 2013, vol. 102, No. 15, pp. 153306-1-153306-5.
Tamayo.A et al., "Synthesis and Characterization of Facial and Meridional Tris-cyclometalated Iridium (III). Complesz", J. AM. CHEM. soc. (Journal Of The American Chemical Society), Jun. 18, 2005, vol. 125, No. 24, pp. 7377-7387.

\* cited by examiner

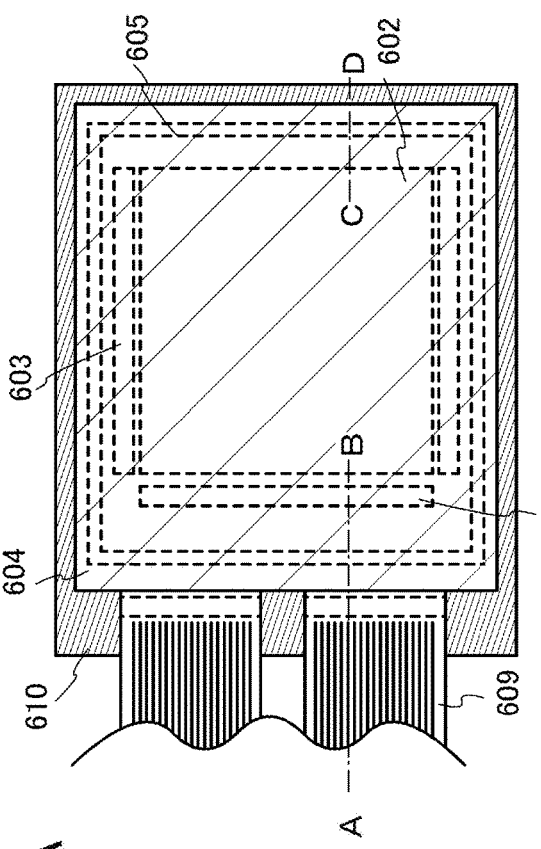
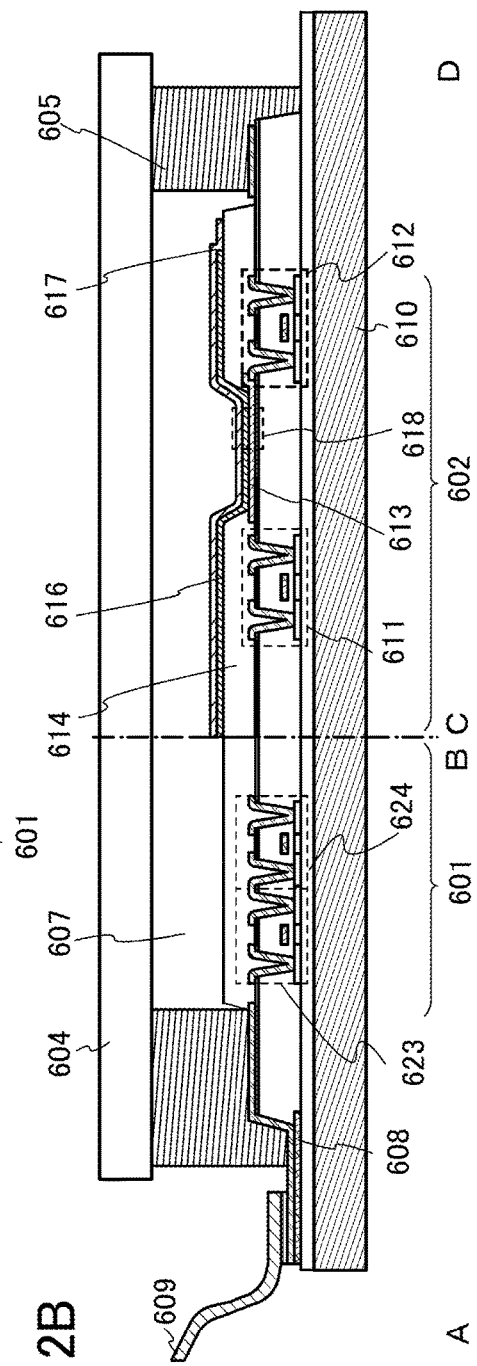
FIG. 2A
FIG. 2B

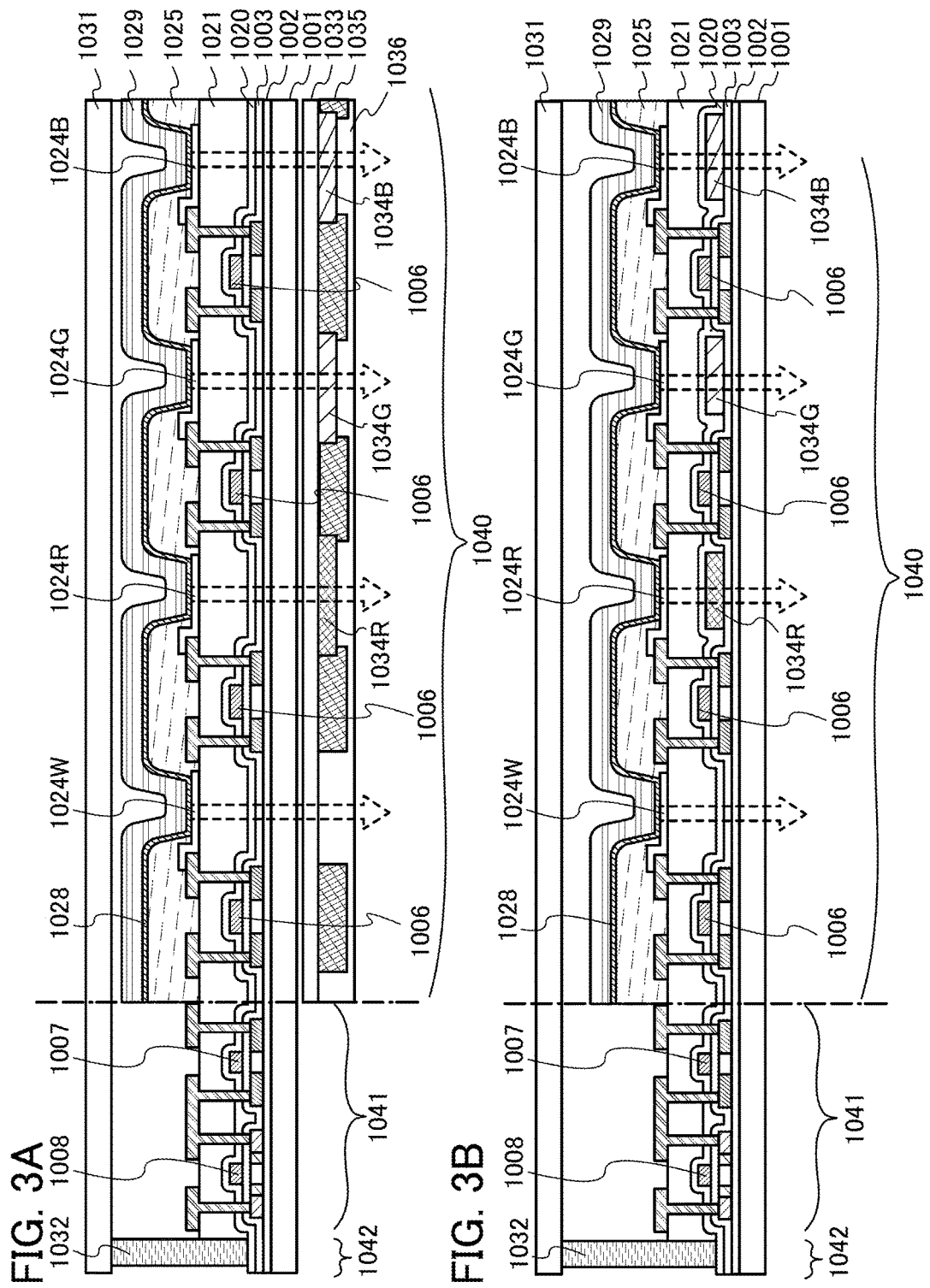

FIG. 7A
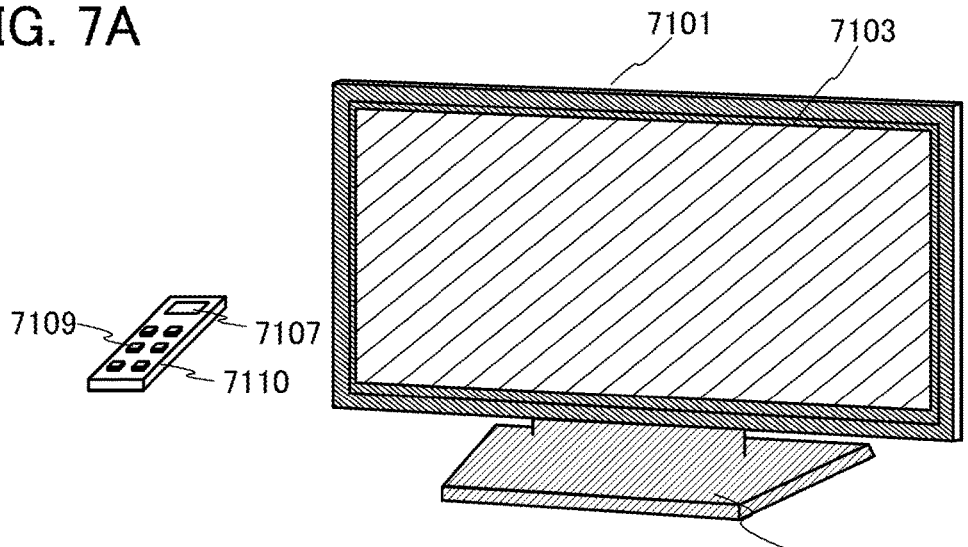
FIG. 7B1
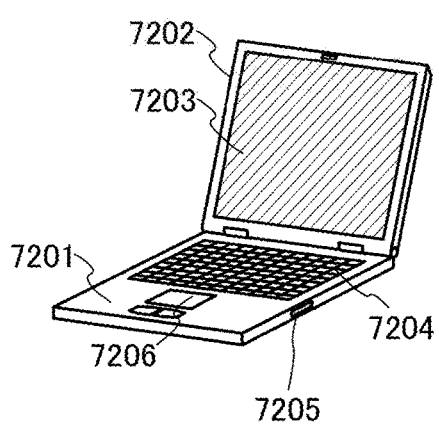
FIG. 7B2
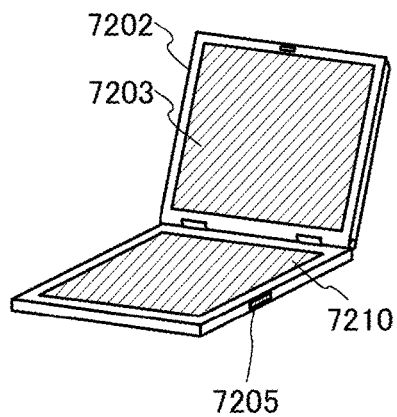
FIG. 7C
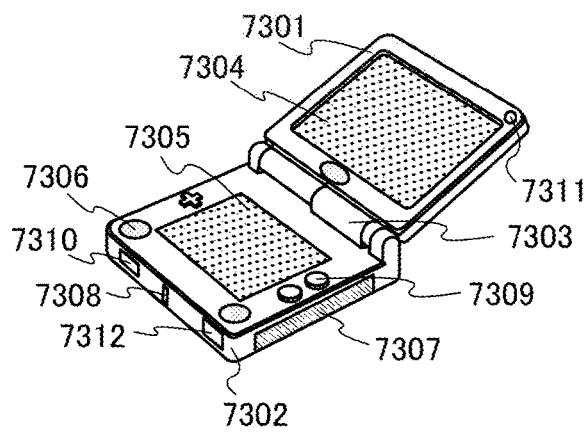
FIG. 7D
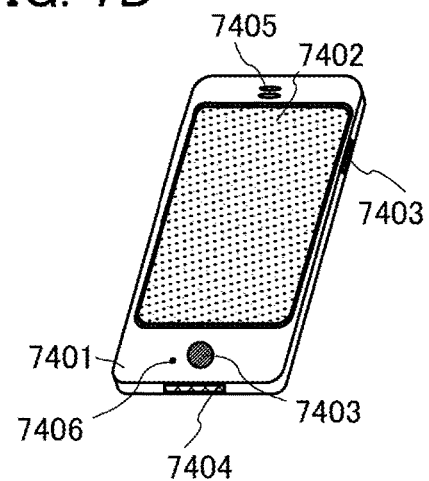

LIGHT-EMITTING ELEMENT, DISPLAY MODULE, LIGHTING MODULE, LIGHT-EMITTING DEVICE, DISPLAY DEVICE, ELECTRONIC APPLIANCE, AND LIGHTING DEVICE

CROSS-REFERENCE TO RELATED APPLICATIONS

This application is a continuation of U.S. application Ser. No. 15/162,675, filed May 24, 2016, now allowed, which is a continuation of U.S. application Ser. No. 14/548,947, filed Nov. 20, 2014, now U.S. Pat. No. 9,362,517, which issued on Jun. 7, 2016, which claims the benefit of foreign priority applications filed in Japan as Serial No. 2013-249486 on Dec. 2, 2013, Serial No. 2014-097803 on May 9, 2014, and Serial No. 2014-180913 on Sep. 5, 2014, all of which are incorporated by reference.

TECHNICAL FIELD

One embodiment of the present invention relates to a light-emitting element containing an organic compound as a light-emitting substance, a display module, a lighting module, a display device, a light-emitting device, an electronic appliance, and a lighting device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method of driving any of them, and a method of manufacturing any of them.

BACKGROUND ART

In recent years, research and development of a light-emitting element (organic EL element) that uses an organic compound and utilizes electroluminescence (EL) have been actively promoted. In a basic structure of such a light-emitting element, an organic compound layer containing a light-emitting substance (an EL layer) is interposed between a pair of electrodes. By applying voltage to the element, light can be emitted from the light-emitting substance.

The light-emitting element is a self-luminous element and thus has advantages that the visibility of a pixel is higher than that of a liquid crystal display and that a backlight is not needed, and is considered suitable as a flat panel display element. In addition, it is also a great advantage that a display including the light-emitting element can be fabricated as a thin and lightweight display and has very fast response speed.

The light-emitting element can provide planar light emission. This feature is difficult to obtain with point light sources typified by incandescent lamps and LEDs or linear light sources typified by fluorescent lamps. Thus, the light-emitting element has great potential as a light source applicable to a lighting device and the like.

In such an organic EL element, electrons from a cathode and holes from an anode are injected into an EL layer. By recombination of the injected electrons and holes, the organic compound having a light-emitting property is excited and provides light emission.

The excited state of an organic compound can be a singlet excited state or a triplet excited state, and light emission from the singlet excited state (S*) is referred to as fluorescence, and light emission from the triplet excited state (T*) is referred to as phosphorescence. The statistical generation ratio of the excited states in the light-emitting element is considered to be S*:T*=1:3.

In a compound that emits light from the singlet excited state (hereinafter, referred to as fluorescent substance), at room temperature, generally phosphorescence is not observed while only fluorescence is observed. Therefore, the internal quantum efficiency (the ratio of generated photons to injected carriers) of a light-emitting element using a fluorescent substance is assumed to have a theoretical limit of 25% based on the ratio of S* to T* that is 1:3.

In contrast, in a compound that emits light from the triplet excited state (hereinafter, referred to as a phosphorescent compound), phosphorescence can be observed at normal temperature. Since intersystem crossing (transfer of excitation energy from the singlet excited state to the triplet excited state) easily occurs in a phosphorescent compound, the internal quantum efficiency can be increased to 100% in theory. That is, a light-emitting element using a phosphorescent substance can have higher emission efficiency than a light-emitting element using a fluorescent substance. For this reason, light-emitting elements using phosphorescent compounds are now under active development in order to obtain highly efficient light-emitting elements.

A white light-emitting element disclosed in Patent Document 1 includes a light-emitting region containing a plurality of kinds of light-emitting dopants that emit phosphorescence. An element disclosed in Patent Document 2 includes an intermediate layer (a charge-generation layer) between a fluorescent layer and a phosphorescent layer (i.e., the element is what is called a tandem element).

REFERENCE

Patent Document 1: Japanese Translation of PCT International Application No. 2004-522276
Patent Document 2: Japanese Published Patent Application No. 2006-120689

DISCLOSURE OF INVENTION

As a multicolor light-emitting element typified by a white light-emitting element, as in Patent Document 2, an element including a fluorescent layer (a layer emitting light with a short wavelength), a phosphorescent layer (a layer emitting light with a long wavelength), and an intermediate layer (a charge-generation layer) between the fluorescent layer and the phosphorescent layer has been developed and partly put into practical application. This element has a structure in which two light-emitting elements are connected in series with the intermediate layer sandwiched therebetween.

In this structure, fluorescence is used as light with a short wavelength that has a problem in the lifetime and phosphorescence is used as light with a long wavelength. With this structure, a multicolor light-emitting element with stable characteristics can be obtained though its emission efficiency is lower than that of an element in which phosphorescence is used as light with a long wavelength and light with a short wavelength.

The multicolor light-emitting element with the above-described structure has high reliability and is suitable for practical application; on the other hand, a larger number of films need to be formed to obtain one light-emitting element, which hinders the practical application of the light-emitting element.

There are some reasons for providing the intermediate layer between the phosphorescent layer and the fluorescent layer in the multicolor element. One of the reasons is for preventing quenching of phosphorescence caused by the fluorescent layer.

In the fluorescent layer, a substance having a condensed aromatic ring (especially, a condensed aromatic hydrocarbon ring) skeleton, typified by anthracene, is often used as a host material. This is because when the substance having a condensed aromatic ring skeleton is used as a host material of the fluorescent layer, a light-emitting element with favorable characteristics can be stably obtained; on the other hand, a substance having a condensed aromatic ring skeleton generally has a disadvantage of low triplet level. Thus, in the case where the fluorescent layer is formed in contact with a phosphorescent layer, the triplet excitation energy generated in the phosphorescent layer is transferred to the triplet level of the host material of the fluorescent layer to be quenched. Since a triplet exciton has a long lifetime, the diffusion length of the exciton is long and excitation energy generated in the phosphorescent layer as well as excitation energy generated at the interface between the fluorescent layer and the phosphorescent layer are quenched by the host material of the fluorescent layer. Thus, a significant reduction in emission efficiency is caused.

The above-described problems are solved by using a host material with high triple excitation energy for the fluorescent layer. In that case, however, the singlet excitation energy of the host material is higher than the triplet excitation energy, so that an energy difference between the singlet excitation energy of the host material and the singlet excitation energy of a fluorescent dopant becomes too large and thus energy is not sufficiently transferred from the host material to the fluorescent dopant. This results in insufficient emission efficiency in the fluorescent layer. As a result, non-radiative decay of the host material is accelerated to degrade the characteristics (especially, lifetime) of the element in some cases. When the singlet excitation energy of the host material is higher, the HOMO-LUMO gap of the host material is necessarily large. This leads to an increase in drive voltage.

In view of the above, an object of one embodiment of the present invention is to provide a novel light-emitting element. Another object of one embodiment of the present invention is to provide a multicolor light-emitting element that utilizes fluorescence and phosphorescence and is advantageous for practical application. Another object of one embodiment of the present invention is to provide a multicolor light-emitting element that utilizes fluorescence and phosphorescence, has a small number of fabrication steps owing to a relatively small number of layers to be formed, and is advantageous for practical application.

Another object of one embodiment of the present invention is to provide a multicolor light-emitting element that utilizes fluorescence and phosphorescence and has high emission efficiency.

Another object of one embodiment of the present invention is to provide a multicolor light-emitting element that utilizes fluorescence and phosphorescence, has a relatively small number of layers to be formed, is advantageous for practical application, and has high emission efficiency. Another object of one embodiment of the present invention is to provide a novel light-emitting element.

Another object of one embodiment of the present invention is to provide a display module, a lighting module, a light-emitting device, a display device, an electronic appliance, and a lighting device that can be fabricated at low cost by using the light-emitting element.

Another object of one embodiment of the present invention is to provide a display module, a lighting module, a light-emitting device, a display device, an electronic appliance, and a lighting device that have reduced power consumption by using the light-emitting element.

It is only necessary that at least one of the above-described objects be achieved in the present invention.

The above-described objects can be achieved by a light-emitting element that has a stacked-layer structure of a first light-emitting layer containing a host material and a fluorescent substance, a separation layer, and a second light-emitting layer containing two kinds of organic compounds that form an exciplex and a substance that can convert triplet excitation energy into luminescence. Note that a light-emitting element in which the first light-emitting layer has an emission spectrum peak on the shorter wavelength side than the second light-emitting layer more effectively achieves the above-described objects.

One embodiment of the present invention is a light-emitting element including a pair of electrodes and an EL layer positioned between the pair of electrodes. The EL layer includes at least a first light-emitting layer, a second light-emitting layer, and a separation layer positioned between the first and second light-emitting layers. An emission spectrum of the first light-emitting layer is in a shorter wavelength region than an emission spectrum of the second light-emitting layer. The first light-emitting layer contains at least a fluorescent substance and a host material. The second light-emitting layer contains at least a substance capable of converting triplet excitation energy into light emission, a first organic compound, and a second organic compound. The first organic compound and the second organic compound form an exciplex.

Another embodiment of the present invention is a light-emitting element having the above-described structure in which the separation layer contains a substance having a hole-transport property and a substance having an electron-transport property.

Another embodiment of the present invention is a light-emitting element having the above-described structure in which the substance having a hole-transport property and the substance having an electron-transport property forms a second exciplex.

Another embodiment of the present invention is a light-emitting element having the above-described structure in which the thickness of the separation layer is greater than 0 nm and less than or equal to 20 nm.

Another embodiment of the present invention is a light-emitting element having the above-described structure in which the thickness of the separation layer is greater than or equal to 1 nm and less than or equal to 10 nm.

Another embodiment of the present invention is a light-emitting element having the above-described structure in which a combination of the substance having a hole-transport property and the substance having an electron-transport property is the same as a combination of the first organic compound and the second organic compound.

Another embodiment of the present invention is a light-emitting element having the above-described structure in which energy is transferred from the first exciplex to the substance capable of converting triplet excitation energy into light emission.

Another embodiment of the present invention is a light-emitting element having the above-described structure in which the singlet excited level of the host material is higher than the singlet excited level of the fluorescent substance, and the triplet excited level of the host material is lower than the triplet excited level of the fluorescent substance.

Another embodiment of the present invention is a light-emitting element having the above-described structure in which the triplet excited level of the host material is lower than the triplet excited level of the substance having a hole-transport property and the triplet excited level of the substance having an electron-transport property.

Another embodiment of the present invention is a light-emitting element having the above-described structure in which the host material is an organic compound having a condensed aromatic ring skeleton.

Another embodiment of the present invention is a light-emitting element having the above-described structure in which the host material is an organic compound having an anthracene skeleton.

Another embodiment of the present invention is a light-emitting element having the above-described structure in which the host material is an organic compound having an anthracene skeleton, and the fluorescent substance is an organic compound having a pyrene skeleton.

Another embodiment of the present invention is a light-emitting element having the above-described structure in which the second light-emitting layer includes n (n is an integer of 2 or larger) layers, and the n layers contain n kinds of substances having different emission spectra and capable of converting triplet excitation energy into light emission.

Another embodiment of the present invention is a light-emitting element having the above-described structure in which the second light-emitting layer contains a first phosphorescent substance and a second phosphorescent substance that have different emission spectra as the substance capable of converting triplet excitation energy into light emission.

Another embodiment of the present invention is a light-emitting element having the above-described structure in which the first phosphorescent substance emits light in a red region, the second phosphorescent substance emits light in a green region, and the fluorescent substance emits light in a blue region.

Another embodiment of the present invention is a light-emitting element having the above-described structure in which the first phosphorescent substance has a peak of an emission spectrum of 580 nm to 680 nm, the second phosphorescent substance has a peak of an emission spectrum of 500 nm to 560 nm, and the fluorescent substance has a peak of an emission spectrum of 400 nm to 480 nm.

Another embodiment of the present invention is a light-emitting element having the above-described structure in which the second light-emitting layer comprises a first phosphorescent layer and a second phosphorescent layer, the first phosphorescent layer contains the first phosphorescent substance, and the second phosphorescent layer contains the second phosphorescent substance.

Another embodiment of the present invention is a light-emitting element having the above-described structure in which the first phosphorescent substance exhibits a carrier-trapping property in the first phosphorescent layer.

Another embodiment of the present invention is a light-emitting element having the above-described structure in which the carrier-trapping property is an electron-trapping property.

Another embodiment of the present invention is a display module including any of the above-described light-emitting elements.

Another embodiment of the present invention is a lighting module including any of the above-described light-emitting elements.

Another embodiment of the present invention is a light-emitting device including any of the above-described light-emitting elements and a unit for controlling the light-emitting element.

Another embodiment of the present invention is a display device including any of the above-described light-emitting elements in a display portion and a unit for controlling the light-emitting element.

Another embodiment of the present invention is a lighting device including any of the above-described light-emitting elements in a lighting portion and a unit for controlling the light-emitting element.

Another embodiment of the present invention is an electronic appliance including any of the above-described light-emitting elements.

Note that the light-emitting device in this specification includes, in its category, an image display device that uses a light-emitting element. The category of the light-emitting device in this specification includes a module in which a light-emitting element is provided with a connector such as an anisotropic conductive film or a tape carrier package (TCP); a module having a TCP at the tip of which a printed wiring board is provided; and a module in which an integrated circuit (IC) is directly mounted on a light-emitting element by a chip on glass (COG) method. Furthermore, the category includes a light-emitting device that is used in lighting equipment or the like.

In one embodiment of the present invention, a novel light-emitting element can be provided.

In one embodiment of the present invention, a multicolor light-emitting element that utilizes fluorescence and phosphorescence, has a relatively small number of layers to be formed, and is advantageous for practical application can be provided.

In another embodiment of the present invention, a multicolor light-emitting element that utilizes fluorescence and phosphorescence and has high emission efficiency can be provided.

In another embodiment of the present invention, a multicolor light-emitting element that utilizes fluorescence and phosphorescence, has a relatively small number of layers to be formed, is advantageous for practical application, and has high emission efficiency can be provided.

In another embodiment of the present invention, a display module, a lighting module, a light-emitting device, a display device, an electronic appliance, and a lighting device that can be fabricated at low cost by using any of the above-described light-emitting elements can be provided.

In another embodiment of the present invention, a display module, a lighting module, a light-emitting device, a display device, an electronic appliance, and a lighting device that have reduced power consumption by using any of the above-described light-emitting elements can be provided. Note that the description of these effects does not disturb the existence of other effects. One embodiment of the present invention does not necessarily achieve all these effects. Other effects will be apparent from and can be derived from the description of the specification, the drawings, the claims, and the like.

BRIEF DESCRIPTION OF DRAWINGS

FIGS. 2A and 2B are conceptual diagrams of an active matrix light-emitting device.

FIGS. 3A and 3B are conceptual diagrams of active matrix light-emitting devices.

FIGS. 7A to 7D illustrate electronic appliances.

BEST MODE FOR CARRYING OUT THE INVENTION

Hereinafter, embodiments of the present invention will be described with reference to the drawings. Note that the present invention is not limited to the description below, and it is easily understood by those skilled in the art that various changes and modifications can be made without departing from the spirit and scope of the present invention. Therefore, the invention should not be construed as being limited to the description in the following embodiments.

Figure 1A:
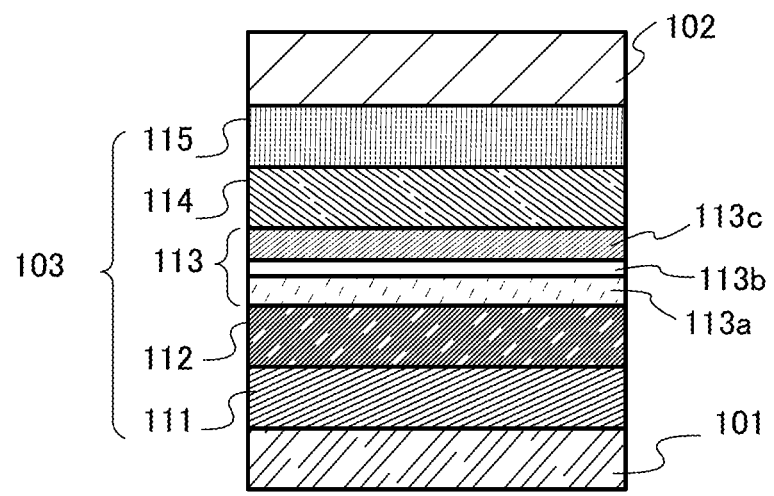
FIGS. 1A and 1B are conceptual diagrams of light-emitting elements.

FIG. 1A is a diagram illustrating a light-emitting element of one embodiment of the present invention. The light-emitting element includes at least a pair of electrodes (a first electrode 101 and a second electrode 102) and the EL layer 103 including a light-emitting layer 113. The light-emitting layer 113 has a stacked structure in which the first light-emitting layer 113a, the separation layer 113b, and the second light-emitting layer 113c are stacked in this order to be in contact with one another.

FIG. 1A also illustrates a hole-injection layer 111, a hole-transport layer 112, an electron-transport layer 114, and an electron-injection layer 115 in the EL layer 103. However, this stacked-layer structure is an example, and the structure of the EL layer 103 in the light-emitting element of one embodiment of the present invention is not limited thereto. Note that in FIG. 1A, the first electrode 101 functions as an anode, and the second electrode 102 functions as a cathode.

The first light-emitting layer 113a contains a fluorescent substance and a host material. The second light-emitting layer 113c contains a first organic compound, a second organic compound, and a phosphorescent compound. In the light-emitting layer having the structure, a combination of the first organic compound and the second organic compound preferably forms a first exciplex.

This structure enables light originating from the fluorescent substance to be emitted efficiently from the first light-emitting layer 113a and light originating from the phosphorescent substance to be emitted efficiently from the second light-emitting layer 113c. Note that even when the light-emitting element does not include a charge-generation layer between the first light-emitting layer 113a and the second light-emitting layer 113c (i.e., even when the light-emitting element is not a tandem element), both fluorescence and phosphorescence can be obtained efficiently.

In general, when a fluorescent layer and a phosphorescent layer are included in the same EL layer without being separated by a charge-generation layer to emit light, emission efficiency is significantly reduced. A factor of this is as follows: the triplet excitation energy of a host material of the fluorescent layer is low because a substance having a condensed aromatic ring (especially, a condensed aromatic hydrocarbon ring) skeleton, which is typified by anthracene, is generally used as the host material, and triplet excitation energy generated in the phosphorescent layer is transferred to the fluorescent layer, which results in non-radiative decay. At present, it is difficult to obtain a desired emission wavelength, favorable element characteristics, or high reliability without using a substance having a condensed aromatic ring skeleton for the fluorescent layer; thus, it is difficult to achieve favorable characteristics of a light-emitting element having the structure in which the fluorescent layer and the phosphorescent layer are included in the same EL layer.

Since a triplet excited state has a long relaxation time, the diffusion length of an exciton is long, many of the excitons generated in the phosphorescent layer are transferred to the fluorescent layer because of diffusion, and non-radiative decay of the excitons is caused. This makes the problem more serious.

At present, it is difficult to obtain a desired emission wavelength, favorable element characteristics, or high reliability with the use of a material that does not have a condensed aromatic ring skeleton. Therefore, it is difficult to achieve favorable characteristics of a light-emitting element in which a fluorescent layer and a phosphorescent layer are formed adjacent to each other.

In a light-emitting element of this embodiment, the first organic compound and the second organic compound form an exciplex in the second light-emitting layer 113c, and the triplet excitation energy is transferred from the exciplex to the phosphorescent substance, so that light emission can be obtained. This structure can solve the above-described problems.

An exciplex is an excited state formed from two kinds of substances (the first organic compound and the second organic compound in one embodiment of the present invention). When an exciplex releases energy, the two kinds of substances that have formed the exciplex serve as the original different substances. In other words, an exciplex itself does not have a ground state, and energy transfer between exciplexes or energy transfer to an exciplex from another substance is unlikely to occur in principle.

A process in which one of the first organic compound and the second organic compound as a cation and the other of the first organic compound and the second organic compound as an anion are adjacent to each other to form an exciplex (an electroplex process) is considered dominant for the generation of the exciplex in the light-emitting element. Even when one of the first organic compound and the second organic compound comes into an excited state, the one quickly interacts with the other of the first organic compound and the second organic compound, so that to form an exciplex; thus, most excitons in the second light-emitting layer 113c exist as exciplexes. The exciplex has a smaller band gap than the first organic compound and the second organic compound. Furthermore, when the first organic compound and the second organic compound are selected such that the exciplex has lower triplet excitation energy than at least one of (preferably each of) the first organic compound and the second organic compound has, energy transfer from the exciplex to the first organic compound and the second organic compound hardly occurs. In addition, energy transfer between exciplexes hardly occurs as described above. As a result, excitation energy of the exciplex is transferred to the phosphorescent substance and converted into light emission. Accordingly, diffusion of excitons in the second light-emitting layer 113c hardly occurs. Therefore, the above-mentioned problems can be solved.

Here, in the case where the first light-emitting layer 113a that is a fluorescent layer and the second light-emitting layer 113c that is a phosphorescent layer are in contact with each other, energy transfer from an exciplex or a phosphorescent dopant to the host material of the first light-emitting layer 113a (especially triplet-triplet energy transfer) slightly occurs at this interface. As described above, excitons of exciplexes are unlikely to diffuse and easily transferred to the phosphorescent dopant; therefore, an influence of the excitons is relatively small. However, when the phosphorescent dopant in contact with the host material of the first light-emitting layer 113a exists at the interface, the host material drastically quenches light emission of the phosphorescent dopant due to an energy transfer by Dexter mechanism. Accordingly, by providing the separation layer 113b between the first light-emitting layer 113a and the second light-emitting layer 113c, energy transfer at the interface between the first light-emitting layer 113a and the second light-emitting layer 113c can be suppressed, and both phosphorescence and fluorescence with better characteristics can be emitted.

In one embodiment of the present invention, when the first light-emitting layer 113a has a structure in which a singlet excited state is generated easily by triplet-triplet annihilation (T-T annihilation: TTA), the triplet excitation energy generated in the first light-emitting layer 113a can be converted into fluorescence in the first light-emitting layer 113a. This enables energy loss of the light-emitting element of one embodiment of the present to be reduced. In order that the light-emitting layer 113a can have the structure in which the single excited state is generated easily by TTA, it is preferable to select a host material and a fluorescent substance in the first light-emitting layer 113a so that the singlet excitation level of the host material is higher than the singlet excitation level of the fluorescent substance and the triplet excitation level of the host material is lower than the triplet excitation level of the fluorescent substance. As a combination of the host material and the fluorescent substance that are in such a relation, a combination of a material having an anthracene skeleton as the host material and a material having a pyrene skeleton as the fluorescent substance, or the like is preferable.

Note that when the first light-emitting layer 113a is too thick, emission from the second light-emitting layer 113c is difficult to obtain. In addition, when the first light-emitting layer 113a is too thin, emission from the first light-emitting layer 113a is difficult to obtain. For those reasons, the thickness of the first light-emitting layer 113a is preferably greater than or equal to 5 nm and less than or equal to 20 nm.

In the case where the first light-emitting layer 113a is formed on the anode side, the first light-emitting layer 113a preferably has a hole-transport property. In that case, a bipolar material having a high hole-transport property is preferably used. A material having an anthracene skeleton is preferable as such a material. Furthermore, when the fluorescent substance has a high hole-trapping property (e.g., a condensed aromatic amine compound described later), the concentration of the fluorescent substance is preferably lower than or equal to 5%, further preferably higher than or equal to 1% and lower than or equal to 4%, still further preferably higher than or equal to 1% and lower than or equal to 3%, in which case phosphorescence and fluorescence can be obtained in a balanced manner and with high efficiency. Note that the fluorescent substance exhibits a hole-trapping property when the HOMO level of the fluorescent substance is higher than the HOMO level of the host material.

Although there is no limitation on the combination of the first organic compound and the second organic compound in the second light-emitting layer 113c as long as an exciplex can be formed, one organic compound is preferably a substance having a hole-transport property and the other organic compound is preferably a substance having an electron-transport property. In that case, a donor-acceptor excited state is formed easily, which allows an exciplex to be formed efficiently. In the case where the combination of the first organic compound and the second organic compound is a combination of the substance having a hole-transport property and the substance having an electron-transport property, the carrier balance can be controlled easily by adjusting the mixing ratio. Specifically, the weight ratio of the substance having a hole-transport property to the substance having an electron-transport property is preferably 1:9 to 9:1. Since the carrier balance can be easily controlled in the light-emitting element having the above-described structure, a recombination region can also be easily adjusted. The light-emitting element of one embodiment of the present invention also has a feature in that an emission color can be adjusted by controlling the carrier balance as described above.

The lowest-energy absorption band of the phosphorescent substance overlaps the emission spectrum of the first exciplex in the second light-emitting layer 113c, whereby energy transfer from the first exciplex to the phosphorescent substance is optimized and the light-emitting element can have favorable emission efficiency. The difference in equivalent energy value between a peak wavelength in the lowest-energy absorption band of the phosphorescent substance and a peak wavelength of the emission spectrum of the exciplex is preferably less than or equal to 0.2 eV, in which case the overlap between the absorption band and the emission spectrum is large. Note that the lowest-energy absorption band of the phosphorescent substance is preferably a triplet absorption band, and in the case where a thermally activated delayed fluorescence (TADF) material is used instead of the phosphorescent substance, the lowest-energy absorption band is preferably a singlet absorption band.

In the light-emitting element of one embodiment of the present invention, a light-emitting substance contained in the second light-emitting layer 113c is preferably a substance capable of converting triplet excitation energy into light emission. In this specification, the term "phosphorescent substance" can be replaced with the term "TADF material", and the term "phosphorescent layer" can be replaced with the term "TADF light-emitting layer". The TADF material is a substance that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excitation level and the singlet excitation level is greater than or equal to 0 eV and less than or equal to 0.2 eV, preferably greater than or equal to 0 eV and less than or equal to 0.1 eV. The phosphorescent substance and the TADF material are both substances that can convert triplet excitation energy into light emission.

In the light-emitting element of this embodiment, it is preferable that a carrier recombination region be not locally formed but distributed to some extent. For that, it is preferable that each light-emitting layer have a moderate degree of carrier-trapping property. In the structure where the first light-emitting layer 113a is formed on the anode side and the second light-emitting layer 113c is formed on the cathode side, the fluorescent substance in the first light-emitting layer 113a preferably has a hole-trapping property, and the phosphorescent substance in the second light-emitting layer 113c preferably has an electron-trapping property. In the structure where the first light-emitting layer 113a is formed on the cathode side and the second light-emitting layer 113c is formed on the anode side, the fluorescent substance in the first light-emitting layer 113a preferably has an electron-trapping property, and the phosphorescent substance in the second light-emitting layer 113c preferably has a hole-trapping property. Examples of a substance having a high electron-trapping property include transition metal complexes (e.g., an iridium complex and a platinum complex) whose ligands include a diazine skeleton such as a pyrimidine skeleton or a pyrazine skeleton. Note that the phosphorescent substance exhibits an electron-trapping property when the LUMO level of the phosphorescent substance is lower than the LUMO levels of both of the first organic compound and the second organic compound.

Although the separation layer 113b may be formed with a single substance, the separation layer 113b preferably contains a substance having a hole-transport property and a substance having an electron-transport property. It is more preferable that these substances form an exciplex. By changing the mixture ratio of the substance having a hole-transport property to the substance having an electron-transport property, the carrier balance can be easily controlled and light emission color can be adjusted as in the case of the second light-emitting layer 113c.

It is preferable that the singlet excitation energy and the triplet excitation energy of a material that forms the separation layer 113b be the same as or higher than those of the host material of the first light-emitting layer 113a. Note that in the case where a second exciplex is formed in the separation layer 113b, the singlet excitation energy and the triplet excitation energy of the second exciplex may be lower than those of the host material because energy transfer to the exciplex hardly occurs as described above.

The singlet excitation energy and the triplet excitation energy of a material that forms the separation layer 113b are not limited by the singlet excitation energy and the triplet excitation energy of the first exciplex in the second light-emitting layer 113c. In other words, the singlet excitation energy and the triplet excitation energy of the material that forms the separation layer 113b may be higher or lower than those of the first exciplex in the second light-emitting layer 113c. In a general structure, when the excitation energy of the separation layer is lower than the excitation energy of the second light-emitting layer 113c, light emission of the second light-emitting layer 113c is significantly reduced; however, in the structure of one embodiment of the present invention, most of all excitons in the second light-emitting layer 113c exist as exciplexes, so that the excitons hardly diffuse and energy loss is small.

In the case where the separation layer 113b contains the substance having a hole-transport property and a substance having an electron-transport property, the combination of these substances is preferably the same as the combination of the first organic compound and the second organic compound which form the second light-emitting layer 113c, in which case an increase in drive voltage is suppressed. That is, it is preferable that one of the first organic compound and the second organic compound be the substance having a hole-transport property in the separation layer 113b and the other of the first organic compound and the second organic compound be the substance having an electron-transport property in the separation layer 113b. In other words, the second exciplex formed in the separation layer 113b is preferably the same as the first exciplex formed in the second light-emitting layer 113c.

Note that in the light-emitting element, light emitted from the first light-emitting layer 113a preferably has a peak on the shorter wavelength side than light emitted from the second light-emitting layer 113c. The luminance of a light-emitting element using the phosphorescent substance emitting light with a short wavelength tends to degrade quickly. In view of the above, the fluorescence substance emitting light with a short wavelength is used, so that a light-emitting element with less degradation of luminance can be provided. In this light-emitting element, only the separation layer 113b with a thickness of several nanometers is provided between the first light-emitting layer 113a that is a fluorescent layer and the second light-emitting layer 113c that is a phosphorescent layer. Therefore, the number and thickness of layers forming the EL layer in this light-emitting element are smaller than those in a tandem element; thus, the light-emitting element of one embodiment of the present invention is cost-effective and suitable for mass production. In addition, the number of layers forming the EL layer is small as described above; thus, the thickness of the EL layer can be small and the light-emitting element is optically advantageous (i.e., the outcoupling efficiency is high). Furthermore, the light-emitting element can have low drive voltage and provide both fluorescence and phosphorescence efficiently at a drive voltage of 5 V or lower.

Moreover, although the fluorescent layer and the phosphorescent layer are adjacent to each other, deactivation of the triplet excitation energy is unlikely to occur owing to the use of the above-described exciplex in the phosphorescent layer; thus, both phosphorescence and fluorescence can be obtained easily.

In the light-emitting element of this embodiment, light with different emission wavelengths are obtained from the first light-emitting layer 113a and the second light-emitting layer 113c, so that the light-emitting element can be a multicolor light-emitting element. Therefore, the light-emitting element can provide various emission colors with a combination of light emitted from a plurality of light-emitting substances.

Such a light-emitting element is suitable for obtaining white light emission. When the first light-emitting layer 113a and the second light-emitting layer 113c emit light of complementary colors, white light emission can be obtained. In addition, white light emission with a high color rendering property that is formed of three primary colors or four or more colors can be obtained by using a plurality of light-emitting substances emitting light with different wavelengths for one or both of the light-emitting layers. In that case, each of the light-emitting layers may be divided into layers and the divided layers may contain different light-emitting substances. Such a white light-emitting element utilizes phosphorescence, has high emission efficiency, and can be provided at lower cost because the white light-emitting element has a smaller number of layers and a smaller thickness than a tandem light-emitting element. In addition, the white light-emitting element improves light extraction efficiency due to its small thickness.

Next, an example of the structure of the above-mentioned light-emitting element is described in detail below with reference to FIG. 1A.

A light-emitting element in this embodiment includes, between a pair of electrodes, an EL layer including a plurality of layers. In this embodiment, the light-emitting element includes the first electrode 101, the second electrode 102, and the EL layer 103 provided between the first electrode 101 and the second electrode 102. Note that in this embodiment, the first electrode 101 functions as an anode and the second electrode 102 functions as a cathode. Note that the stacking order may be reversed. In other words, the first light-emitting layer 113a may be formed on the cathode side and the second light-emitting layer 113c may be formed on the anode side.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Films of these electrically conductive metal oxides are usually formed by a sputtering method but may be formed by application of a sol-gel method or the like. For example, indium oxide-zinc oxide is deposited by a sputtering method using a target obtained by adding 1 wt % to 20 wt % of zinc oxide to indium oxide. A film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (e.g., titanium nitride), and the like can be given. Graphene can also be used. Note that when a composite material described later is used for a layer that is in contact with the first electrode 101 in the EL layer 103, an electrode material can be selected regardless of its work function.

There is no particular limitation on the stacked-layer structure of the EL layer 103 as long as the light-emitting layer 113 has the above-described structure. For example, the EL layer 103 can be formed by combining a hole-injection layer, a hole-transport layer, the light-emitting layer, an electron-transport layer, an electron-injection layer, a carrier-blocking layer, an intermediate layer, and the like as appropriate. In this embodiment, the EL layer 103 has a structure in which the hole-injection layer 111, the hole-transport layer 112, the light-emitting layer 113, the electron-transport layer 114, and the electron-injection layer 115 are stacked in this order over the first electrode 101. Specific examples of materials used for each layer are given below.

The hole-injection layer 111 is a layer containing a substance having a hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD); a high molecule compound such as poly(3,4-ethylenedioxythiophene)/poly(styrenesulfonic acid) (PEDOT/PSS); or the like.

Alternatively, a composite material in which a substance having a hole-transport property contains a substance having an acceptor property can be used for the hole-injection layer 111. Note that the use of such a substance having a hole-transport property which contains a substance having an acceptor property enables selection of a material used to form an electrode regardless of its work function. In other words, besides a material having a high work function, a material having a low work function can be used for the first electrode 101. As the acceptor substance, 7,7,8,8-tetracyano-2,3,5,6-tetrafluoroquinodimethane (abbreviation: $F_4$-TCNQ), chloranil, and the like can be given. Moreover, oxides of metals belonging to Groups 4 to 8 of the periodic table can be used. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easily handled.

As the substance having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably a substance having a hole-transport property. Specifically, a substance having a hole mobility of $10^{-6}$ cm$^2$/Vs or higher is preferably used. Specific examples of the organic compound that can be used as a substance having a hole-transport property in the composite material are given below.

Examples of the aromatic amine compounds are N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivatives that can be used for the composite material are 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the carbazole derivatives that can be used for the composite material are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon that can be used for the composite material are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples are pentacene and coronene. The aromatic hydrocarbon that has a hole mobility of $1\times10^{-6}$ cm$^2$/Vs or higher and has 14 to 42 carbon atoms is particularly preferable.

Note that the aromatic hydrocarbons that can be used for the composite material may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples are high molecular compounds such as poly(N-vinylcarbazole) (abbreviation: PVK), poly(4-vinyltriphenylamine) (abbreviation: PVTPA), poly[N-(4-{NV-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

By providing a hole-injection layer, a high hole-injection property can be achieved to allow a light-emitting element to be driven at a low voltage.

The hole-transport layer 112 is a layer containing a substance having a hole-transport property. Examples of the substance having a hole-transport property are aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and 4-phenyl-4'-(9-phenylfluoren-9-yl)triphenylamine (abbreviation: BPAFLP). The substances listed here have high hole-transport properties and are mainly ones that have a hole mobility of $10^{-6}$ cm$^2$/Vs or higher. An organic compound given as an example of the substance having a hole-transport property in the composite material described above can also be used for the hole-transport layer 112. Moreover, a high molecular compound such as poly(N-vinylcarbazole) (abbreviation: PVK) and poly(4-vinyltriphenylamine) (abbreviation: PVTPA) can also be used. Note that the layer that contains a substance having a hole-transport property is not limited to a single layer, and may be a stack of two or more layers including any of the above substances.

In the case where the first light-emitting layer 113a is provided on the anode side in the light-emitting element of one embodiment of the present invention, the HOMO level of a substance used for the hole-transport layer 112 and the HOMO level of a host material in the first light-emitting layer 113a are preferably close to each other (an energy difference of 0.2 eV or less). This can prevent capture of too many holes by trap states and enables holes to flow into the separation layer 113b and the second light-emitting layer 113c. Thus, fluorescence and phosphorescence can be easily obtained in a balanced manner with high efficiency.

The light-emitting layer 113 has the above-mentioned structure. In other words, the first light-emitting layer 113a, the separation layer 113b, and the second light-emitting layer 113c are stacked in this order over the first electrode. A host material and a fluorescent substance are contained in the first light-emitting layer 113a. A first organic compound, a second organic compound, and a substance that can convert triplet excitation energy into luminescence (a phosphorescent compound or a TADF material) are contained in the second light-emitting layer 113c.

Examples of a material that can be used as the fluorescent substance in the first light-emitting layer 113a are given below. Fluorescent materials other than those given below can also be used.

Examples of the fluorescent substance are 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9-phenyl-9H-fluoren-9-yl)phenyl]-N,N'-diphenyl-pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPm), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation:

TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N, 9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[i]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-α]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). Condensed aromatic diamine compounds typified by pyrenediamine compounds such as 1,6FLPAPm and 1,6mMemFLPAPm are particularly preferable because of their high hole-trapping properties, high emission efficiency, and high reliability.

Examples of a substance that can be used as the host material in the first light-emitting layer 113a are given below.

The examples include anthracene compounds such as 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthryl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). The use of a substance having an anthracene skeleton as the host material enables a light-emitting layer that has high emission efficiency and durability to be provided. In particular, CzPA, cgDBCzPA, 2mBnfPPA, and PCzPA are preferable because of their excellent characteristics.

A phosphorescent substance and a TADF material can be used as the substance that can convert triplet excitation energy into luminescence in the second light-emitting layer 113c. Examples of the phosphorescent substance and the TADF material are given below.

Examples of the phosphorescent substance are an organometallic iridium complex having a 4H-triazole skeleton, such as tris{2-[5-(2-methylphenyl)-4-(2,6-dimethylphenyl)-4H-1,2,4-triazol-3-yl-kN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium(III) (abbreviation: Ir(iPrptz-3b)$_3$); an organometallic iridium complex having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) or tris(1-methyl-5-phenyl-3-propyl-1H-1,2,4-triazolato)iridium(III) (abbreviation: Ir(Prptz1-Me)$_3$); an organometallic iridium complex having an imidazole skeleton, such as fac-tris[1-(2,6-diisopropylphenyl)-2-phenyl-1H-imidazole]iridium(III) (abbreviation: Ir(iPrpmi)$_3$), or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis {2-[3',5'-bis(trifluoromethyl)phenyl]pyridinato-N,$C^{2'}$}iridium(III) picolinate (abbreviation: Ir(CF3ppy)$_2$(pic)), or bis[2-(4',6'-difluorophenyl)pyridinato-N,$C^{2'}$]iridium(III) acetylacetonate (abbreviation: FIr(acac)). These are compounds emitting blue phosphorescence and have an emission peak at 440 nm to 520 nm.

Other examples are organometallic iridium complexes having pyrimidine skeletons, such as tris(4-methyl-6-phenylpyrimidinato)iridium(III) (abbreviation: Ir(mppm)$_3$), tris (4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), bis[2-(6-tert-butyl-4-pyrimidinyl-xN3)phenyl-κC](2,4-pentanedionato-$κ^2$O,O')iridium(III) (abbreviation: Ir(tBuppm)$_2$(acac)), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium (III) (abbreviation: Ir(mpmppm)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,$C^{2'}$)iridium(III) (abbreviation: Ir(ppy)$_3$), bis(2-phenylpyridinato-N,$C^{2'}$)iridium(III) acetylacetonate (abbreviation: Ir(ppy)$_2$acac)), bis(benzo[h]quinolinato)iridium(III) acetylacetonate (abbreviation: Ir(bzq)$_2$(acac)), tris (benzo[h]quinolinato)iridium(III) (abbreviation: Ir(bzq)$_3$), tris(2-phenylquinolinato-N,$C^{2'}$)iridium(III) (abbreviation: Ir(pq)$_3$), and bis(2-phenylquinolinato-N,$C^{2'}$)iridium(III) acetylacetonate (abbreviation: Ir(pq)$_2$(acac)); and a rare earth metal complex such as tris(acetylacetonato) (monophenanthroline)terbium(III) (abbreviation: Tb(acac)$_3$ (Phen)). These are mainly compounds emitting green phosphorescence and have an emission peak at 500 nm to 600 nm. Note that an organometallic iridium complex having a pyrimidine skeleton has distinctively high reliability and emission efficiency and is thus especially preferable.

Other examples are (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(dlnpm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). These are compounds emitting red phosphorescence and have an emission peak at 600 nm to 700 nm. The organometallic iridium complex having a pyrazine skeleton can provide red light emission with favorable chromaticity.

Phosphorescent materials other than those given above may be used.

Materials given below can be used as the TADF material.

A fullerene, a derivative thereof, an acridine derivative such as proflavine, eosin, or the like can be used. A metal-containing porphyrin such as a porphyrin containing magnesium (Mg), zinc (Zn), cadmium (Cd), tin (Sn), platinum (Pt), indium (In), or palladium (Pd) can be used. Examples of the metal-containing porphyrin are a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)), which are represented by Structural Formulae below.

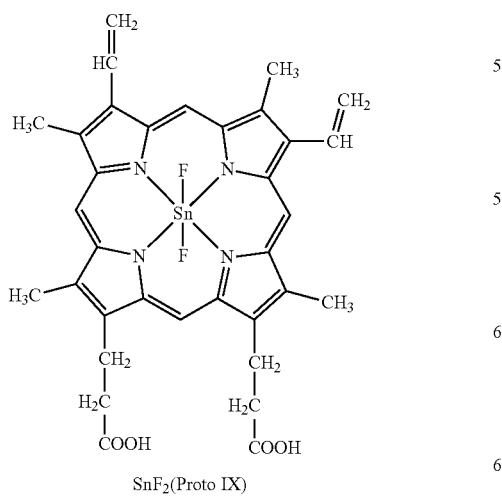

SnF$_2$(Proto IX)

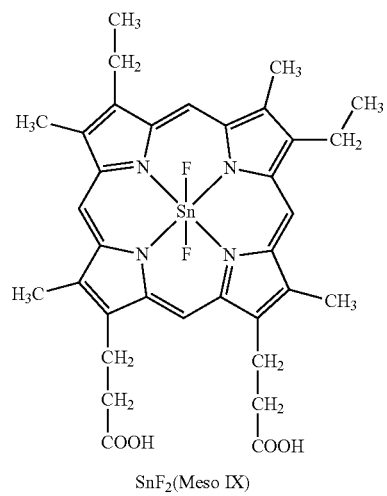

SnF$_2$(Meso IX)

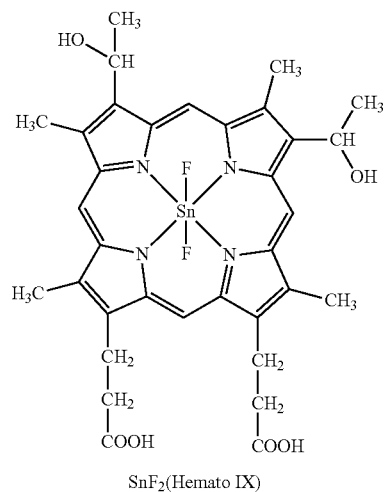

SnF$_2$(Hemato IX)

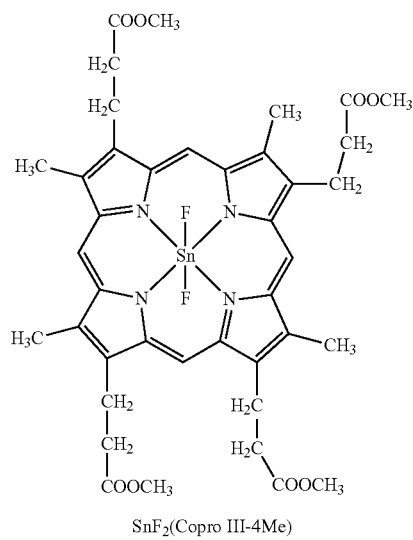

SnF$_2$(Copro III-4Me)

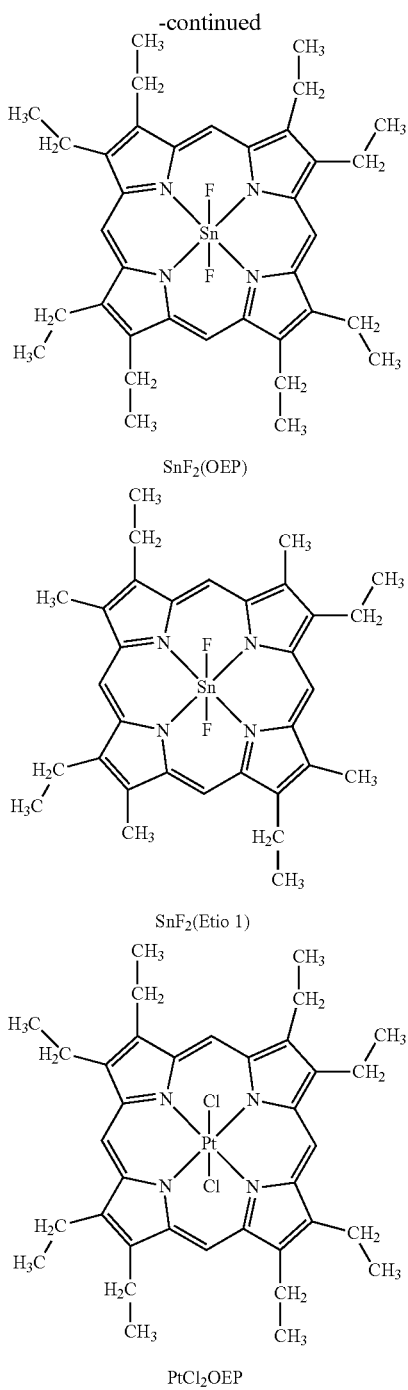

SnF₂(OEP)

SnF₂(Etio 1)

PtCl₂OEP

Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-a]carbazol-11-yl)-1,3,5-triazine (abbreviation: PIC-TRZ), which is represented by Structural Formula below. The heterocyclic compound is preferably used because of the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased and the energy difference between the $S_1$ level and the $T_1$ level becomes small.

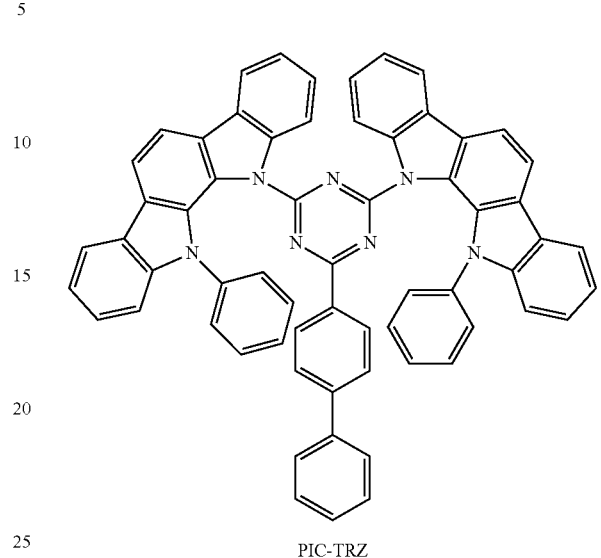

PIC-TRZ

There is no particular limitation on the materials that can be used as the first organic compound and the second organic compound as long as the combination of the materials satisfies the above-mentioned conditions. A variety of carrier-transport materials can be selected.

Examples of the substance having an electron-transport property are a heterocyclic compound having a polyazole skeleton, such as bis(10-hydroxybenzo[h]quinolinato)beryllium(II) (abbreviation: BeBq₂), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 2-[3'-(dibenzothiophen-4-yl)biphenyl-3-yl]dibenzo[f,h]quinoline (abbreviation: 2mDBTBPDBQu-II), 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB). Among the above materials, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in drive voltage.

Examples of the substance having a hole-transport property are a compound having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4''-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, a compound having an aromatic amine skeleton and a compound having a carbazole skeleton are preferable because these compounds are highly reliable and have high hole-transport properties to contribute to a reduction in drive voltage.

Carrier-transport materials can be selected from a variety of substances as well as from the carrier-transport materials given above. Note that as the first organic compound and the second organic compound, substances having a triplet level (a difference in energy between a ground state and a triplet excited state) higher than the triplet level of the phosphorescent compound are preferably selected. In addition, it is preferable that the combination of the first organic compound and the second organic compound be selected so that an exciplex which exhibits light emission whose wavelength overlaps a wavelength of a lowest-energy absorption band of the phosphorescent substance is formed.

Furthermore, the combination of a substance having an electron-transport property as one of the first organic compound and the second organic compound and a substance having a hole-transport property as the other organic compound is advantageous for the formation of an exciplex. The transport property of the light-emitting layer can be easily adjusted and a recombination region can be easily adjusted by changing the contained amount of each compound. The ratio of the contained amount of the substance having a hole-transport property to the contained amount of the substance having an electron-transport property may be 1:9 to 9:1.

As materials that form the separation layer 113b, the above-mentioned materials that can be used as the first organic compound and the second organic compound can be used.

The second light-emitting layer 113c may be divided into two or more layers, and the divided layers preferably contain different light-emitting substances. In particular, a structure in which the second light-emitting layer 113c is divided into a first phosphorescent layer that emits red light (i.e., light having an emission spectrum peak at 580 nm to 680 nm) and a second phosphorescent layer that emits green light (i.e., light having an emission spectrum peak at 500 nm to 560 nm) and the first light-emitting layer 113a emits blue light (i.e., light having an emission spectrum peak at 400 nm to 480 nm) is preferably employed, in which case white light emission with a favorable color rendering property can be obtained. Note that in that case, the first light-emitting layer 113a, the first phosphorescent layer, and the second phosphorescent layer are preferably stacked in this order for high durability. Furthermore the first light-emitting layer 113a is preferably formed on the anode side, in which case favorable characteristics can be obtained.

The electron-transport layer 114 is a layer containing a substance having an electron-transport property. For example, the electron-transport layer 114 is formed using a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like. A metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can also be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances listed here have high electron-transport properties and are mainly ones that have an electron mobility of $10^{-6}$ cm$^2$/Vs or higher. Note that any of the substances having electron-transport properties, which are listed above, may be used for the electron-transport layer 114.

The electron-transport layer 114 is not limited to a single layer, and may be a stack of two or more different layers each containing any of the substances listed above A layer for controlling transport of electron carriers may be provided between the electron-transport layer and the light-emitting layer. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (e.g., a reduction in element lifetime) caused when electrons pass through the light-emitting layer.

An electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride ($CaF_2$), can be used. For example, a layer that is formed using a substance having an electron-transport property and contains an alkali metal, an alkaline earth metal, or a compound thereof can be used. Note that a layer that is formed using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium 5 (Yb), and alloys thereof. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. These conductive materials can be deposited by a sputtering method, an ink-jet method, a spin coating method, or the like.

Any of a variety of methods can be used to form the EL layer 103 regardless whether it is a dry process or a wet process. For example, a vacuum evaporation method, an ink-jet method, or a spin coating method may be employed. A different formation method may be employed for each electrode or each layer.

The electrode may be formed by a wet method using a sol-gel method, or by a wet method using paste of a metal material. Alternatively, the electrode may be formed by a dry method such as a sputtering method or a vacuum evaporation method.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In contrast, in the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

Note that the structure of the layer provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

In order that transfer of energy from an exciton generated in the light-emitting layer can be suppressed, preferably, the hole-transport layer and the electron-transport layer that are in contact with the light-emitting layer 113, particularly a carrier-transport layer in contact with a side closer to the light-emitting region in the light-emitting layer 113, are formed using a substance having a wider band gap than the light-emitting substance of the light-emitting layer or the emission center substance contained in the light-emitting layer.

The light-emitting element of this embodiment may be formed over a glass substrate, a quartz substrate, a semiconductor substrate, a plastic substrate (polyester, polyolefin, polyamide (e.g., nylon or aramid), polyimide, polycarbonate, or an acrylic resin). Alternatively, the light-emitting element may be formed over a glass substrate, a quartz substrate, or a semiconductor substrate and then transferred to a plastic substrate.

In a light-emitting device, although one light-emitting element may be fabricated over one substrate, a plurality of light-emitting elements may be fabricated over one substrate. With a plurality of light-emitting elements as described above formed over one substrate, a lighting device in which elements are separated or a passive-matrix light-emitting device can be fabricated. A light-emitting element may be formed over an electrode electrically connected to a field-effect transistor (FET), for example, that is formed over a substrate of glass, plastic, or the like, so that an active matrix light-emitting device in which the FET controls the drive of the light-emitting element can be fabricated. Note that the structure of the FET is not particularly limited. In addition, crystallinity of a semiconductor used for the FET is not particularly limited either; an amorphous semiconductor or a crystalline semiconductor may be used. In addition, a driver circuit formed in an FET substrate may be formed with an n-type FET and a p-type FET, or with either an n-type FET or a p-type FET.

Note that this embodiment can be combined with any of the other embodiments as appropriate.

Next, one mode a light-emitting element with a structure in which a plurality of light-emitting units are stacked (hereinafter also referred to as a stacked-type element) is described with reference to FIG. 1B. In this light-emitting element, a plurality of light-emitting units are provided between a first electrode and a second electrode. One light-emitting unit has a structure similar to that of the EL layer 103, which is illustrated in FIG. 1A. In other words, the light-emitting element illustrated in FIG. 1A includes a single light-emitting unit; the light-emitting element in this embodiment includes a plurality of light-emitting units.

Figure 1B:
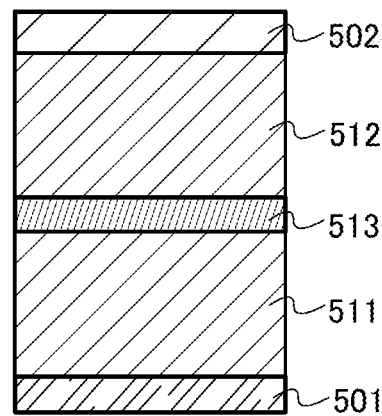

In FIG. 1B, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 illustrated in FIG. 1A, and the materials given in the description for FIG. 1A can be used. Furthermore, the first light-emitting unit 511 and the second light-emitting unit 512 may have the same structure or different structures.

The charge-generation layer 513 contains a composite material of an organic compound and a metal oxide. As the composite material of the organic compound and the metal oxide, the composite material which can be used for the hole-injection layer 111 illustrated in FIG. 1A can be used. Note that when a surface of a light-emitting unit on the anode side is in contact with a charge generation layer, the charge generation layer can also serve as a hole-transport layer of the light-emitting unit; thus, a hole-transport layer does not need to be formed in the light-emitting unit.

The charge generation layer 513 may have a stacked-layer structure of a layer containing the composite material of an organic compound and a metal oxide and a layer containing another material. For example, a layer containing a composite material of the organic compound and the metal oxide may be combined with a layer containing a compound of a substance selected from substances with an electron-donating property and a substance with an electron-transport property. Moreover, a layer containing a composite material of the organic compound and the metal oxide may be combined with a transparent conductive film.

The light-emitting element having two light-emitting units is described with reference to FIG. 1B; however, the present invention can be similarly applied to a light-emitting element in which three or more light-emitting units are stacked. With a plurality of light-emitting units partitioned by the charge generation layer between a pair of electrodes as in the light-emitting element of this embodiment, it is possible to provide a light-emitting element which can emit light with high luminance with the current density kept low. As a result, it is possible to achieve a light-emitting device which can be driven at low voltage and has low power consumption.

When the above-described structure of the light-emitting layer 113 is applied to at least one of the plurality of units, the number of manufacturing steps of the unit can be reduced; thus, a multicolor light-emitting element which is advantageous for practical application can be provided.

The above-described structure can be combined with any of the structures in this embodiment and the other embodiments.

(Light-emitting Device)

Next, a light-emitting device of one embodiment of the present invention is described.

The light-emitting device of one embodiment of the present invention is manufactured using the above-described light-emitting element. Note that FIG. 2A is a top view illustrating the light-emitting device and FIG. 2B is a cross-sectional view taken along the lines A-B and C-D in FIG. 2A. This light-emitting device includes a driver circuit portion (source line driver circuit) 601, a pixel portion 602, and a driver circuit portion (gate line driver circuit) 603, which control light emission of the light-emitting element and are denoted by dotted lines. A reference numeral 604 denotes a sealing substrate; 605, a sealant; and 607, a space surrounded by the sealant 605. The space 607 may be filled with a dry inert gas or a resin for solid sealing. The sealant 605 may be the same as or different from the resin for solid sealing.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 2B. The driver circuit portion and the pixel portion are formed over an element substrate 610. The source line driver circuit 601, which is a driver circuit portion, and one of the pixels in the pixel portion 602 are illustrated here.

In the source line driver circuit 601, a CMOS circuit is formed in which an n-channel FET 623 and a p-channel FET 624 are combined. In addition, the driver circuit may be formed with any of a variety of circuits such as a CMOS circuit, a PMOS circuit, and an NMOS circuit. Although a driver-integrated type in which a driver circuit is formed over a substrate is described in this embodiment, one embodiment of the present invention is not limited to this type, and the driver circuit can be formed outside the substrate.

The pixel portion 602 includes a plurality of pixels including a switching FET 611, a current controlling FET 612, and a first electrode 613 electrically connected to a drain of the current controlling FET 612. An insulator 614 is formed to cover end portions of the first electrode 613. In this embodiment, the insulator 614 is formed using a positive photosensitive acrylic resin film.

In order to improve the coverage, the insulator 614 preferably has a curved surface with curvature at an upper end portion or a lower end portion thereof. For example, in the case where a positive photosensitive acrylic resin is used for a material of the insulator 614, only the upper end portion of the insulator 614 preferably has a surface with a curvature radius (0.2 μm to 3 μm). As the insulator 614, either a negative photosensitive resin or a positive photosensitive resin can be used.

An EL layer 616 and a second electrode 617 are formed over the first electrode 613. As a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has a structure similar to that illustrated in FIG. 1A or FIG. 1B. As another material contained in the EL layer 616, any of low-molecular-weight compounds and high-molecular-weight compounds (including oligomers and dendrimers) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

The sealing substrate 604 is attached to the element substrate 610 with the sealant 605, so that the light-emitting element 618 is provided in the space 607 surrounded by the element substrate 610, the sealing substrate 604, and the sealant 605. The space 607 may be filled with filler, and may be filled with an inert gas (such as nitrogen or argon), a resin, or the sealant 605. It is preferable that the sealing substrate be provided with a recessed portion and a drying agent be provided in the recessed portion, in which case deterioration due to influence of moisture can be suppressed.

An epoxy-based resin or glass frit is preferably used for the sealant 605. It is preferable that such a material not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

The light-emitting device of one embodiment of the present invention can have small power consumption. The lighting device can also be inexpensive.

FIGS. 3A and 3B each illustrate an example of a light-emitting device in which full color display is achieved by forming a light-emitting element exhibiting white light emission and providing a coloring layer (a color filter) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G and 1024B of light-emitting elements, a partition wall 1025, an EL layer 1028, a second electrode 1029 of the light-emitting elements, a sealing substrate 1031, a sealant 1032, and the like are illustrated.

In FIG. 3A, coloring layers (a red coloring layer 1034R, a green coloring layer 1034G and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 3A, light emitted from part of the light-emitting layer does not pass through the coloring layers, while light emitted from the other part of the light-emitting layer passes through the coloring layers. Since light that does not pass through the coloring layers is white and light that passes through any one of the coloring layers is red, blue, or green, an image can be displayed using pixels of the four colors.

FIG. 3B illustrates an example in which the coloring layers (the red coloring layer 1034R, the green coloring layer 1034G and the blue coloring layer 1034B) are provided between the gate insulating film 1003 and the first interlayer insulating film 1020. As shown in FIG. 3B, the coloring layers may be provided between the substrate 1001 and the sealing substrate 1031.

Figure 4:
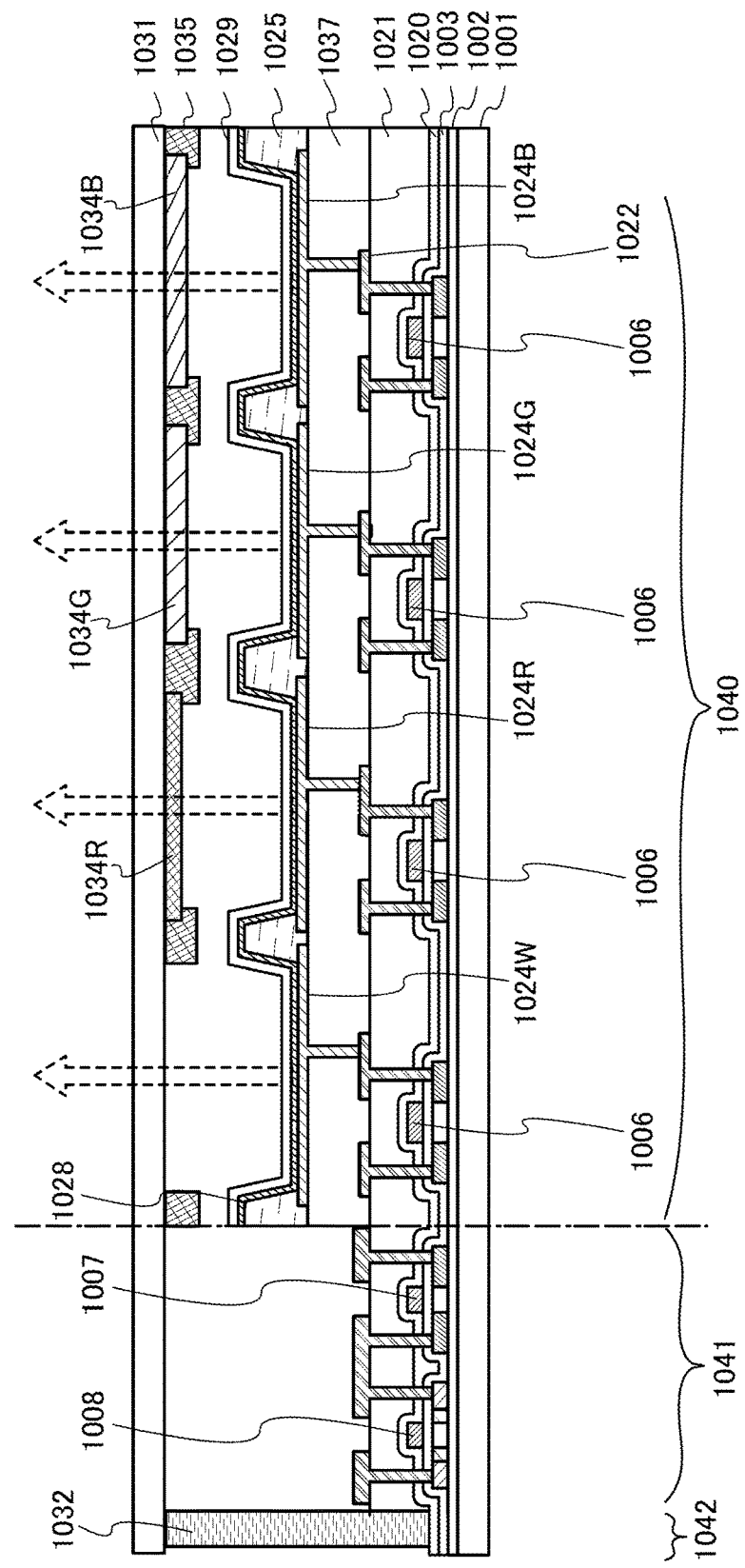
FIG. 4 is a conceptual diagram of an active matrix light-emitting device.

The above-described light-emitting device has a structure in which light is extracted from the substrate 1001 side where the FETs are formed (a bottom emission structure), but may have a structure in which light is extracted from the sealing substrate 1031 side (a top emission structure). FIG. 4 is a cross-sectional view of a light-emitting device having a top emission structure. In this case, a substrate that does not transmit light can be used as the substrate 1001. The process up to the step of forming of a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other materials.

The first electrodes 1024W, 1024R, 1024G and 1024B of the light-emitting elements each serve as an anode here, but may serve as a cathode. In the case of a light-emitting device having a top emission structure as illustrated in FIG. 4, the first electrodes are preferably reflective electrodes. The EL layer 1028 is formed to have a structure similar to the structure of the EL layer 103 illustrated in FIG. 1A, with which white light emission can be obtained.

In the case of a top emission structure as illustrated in FIG. 4, sealing can be performed with the sealing substrate 1031 on which the coloring layers (the red coloring layer 1034R, the green coloring layer 1034G and the blue coloring layer 1034B) are provided. The sealing substrate 1031 may be provided with the black layer (the black matrix) 1035 that is positioned between pixels. The coloring layers (the red coloring layer 1034R, the green coloring layer 1034G and the blue coloring layer 1034B) and the black layer (the black matrix) 1035 may be covered with an overcoat layer. Note that a light-transmitting substrate is used as the sealing substrate 1031.

Although an example in which full color display is performed using four colors of red, green, blue, and white is shown here, there is no particular limitation and full color display using three colors of red, green, and blue may be performed.

The light-emitting device in this embodiment is fabricated using the light-emitting element illustrated in FIG. 1A or FIG. 1B and thus can have favorable characteristics. Specifically, since the light-emitting element illustrated in FIG. 1A or FIG. 1B has high emission efficiency, the light-emitting device can have reduced power consumption. In addition, since the light-emitting element illustrated in FIG. 1A or FIG. 1B is relatively easily mass-produced, the light-emitting device can be provided at low cost.

Figure 5A:
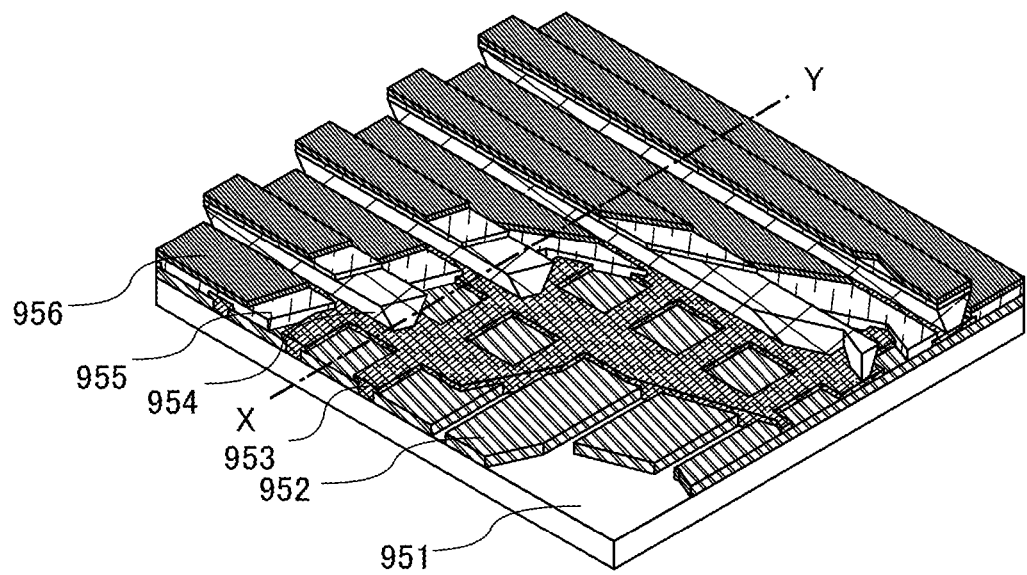
FIGS. 5A and 5B are conceptual diagrams of a passive matrix light-emitting device.
Figure 5B:
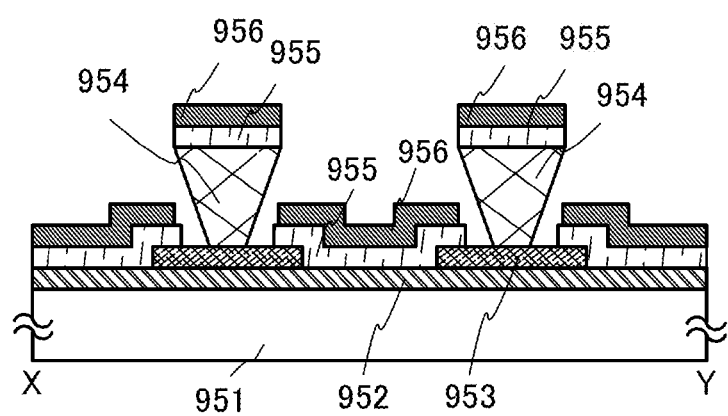

An active matrix light-emitting device is described above, whereas a passive matrix light-emitting device is described below. FIGS. 5A and 5B illustrate a passive matrix light-emitting device fabricated using one embodiment of the present invention. FIG. 5A is a perspective view of the light-emitting device, and FIG. 5B is a cross-sectional view taken along the line X-Y in FIG. 5A. In FIGS. 5A and 5B, an EL layer 955 is provided between an electrode 952 and an electrode 956 over a substrate 951. An end portion of the electrode 952 is covered with an insulating layer 953. In addition, a partition layer 954 is provided over the insulating layer 953. The sidewalls of the partition layer 954 slope so that the distance between one sidewall and the other sidewall gradually decreases toward the surface of the substrate. In other words, a cross section taken along the direction of the short side of the partition layer 954 is trapezoidal, and the base (a side which is in the same direction as a plane direction of the insulating layer 953 and in contact with the insulating layer 953) is shorter than the upper side (a side which is in the same direction as the plane direction of the insulating layer 953 and not in contact with the insulating layer 953). By providing the partition layer 954 in such a manner, a defect of the light-emitting element due to static electricity or the like can be prevented. The passive matrix light-emitting device also includes the light-emitting element illustrated in FIG. 1A or FIG. 1B, which has high emission efficiency, and thus can have less power consumption. Moreover, since the light-emitting element is easily mass-produced, the light-emitting device can be provided at low cost.

Since many minute light-emitting elements arranged in a matrix in the light-emitting device described above can each be controlled, the light-emitting device can be suitably used as a display device for displaying images.

(Lighting Device)

Figure 6A:
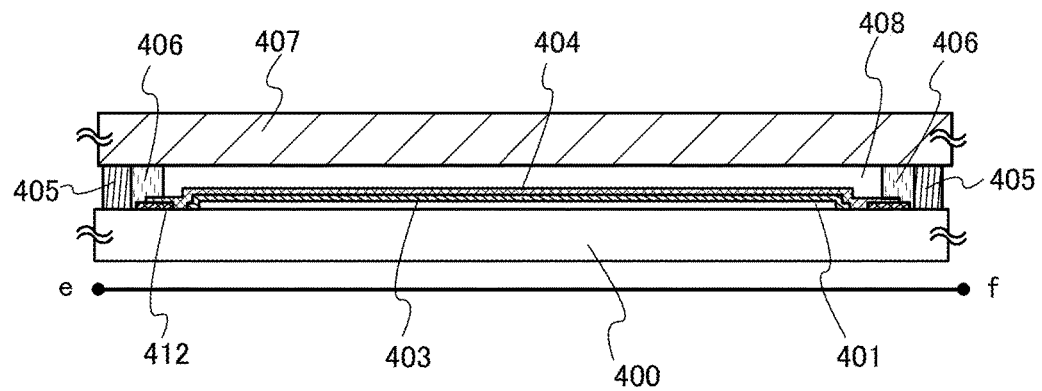
FIGS. 6A and 6B illustrate a lighting device.
Figure 6B:
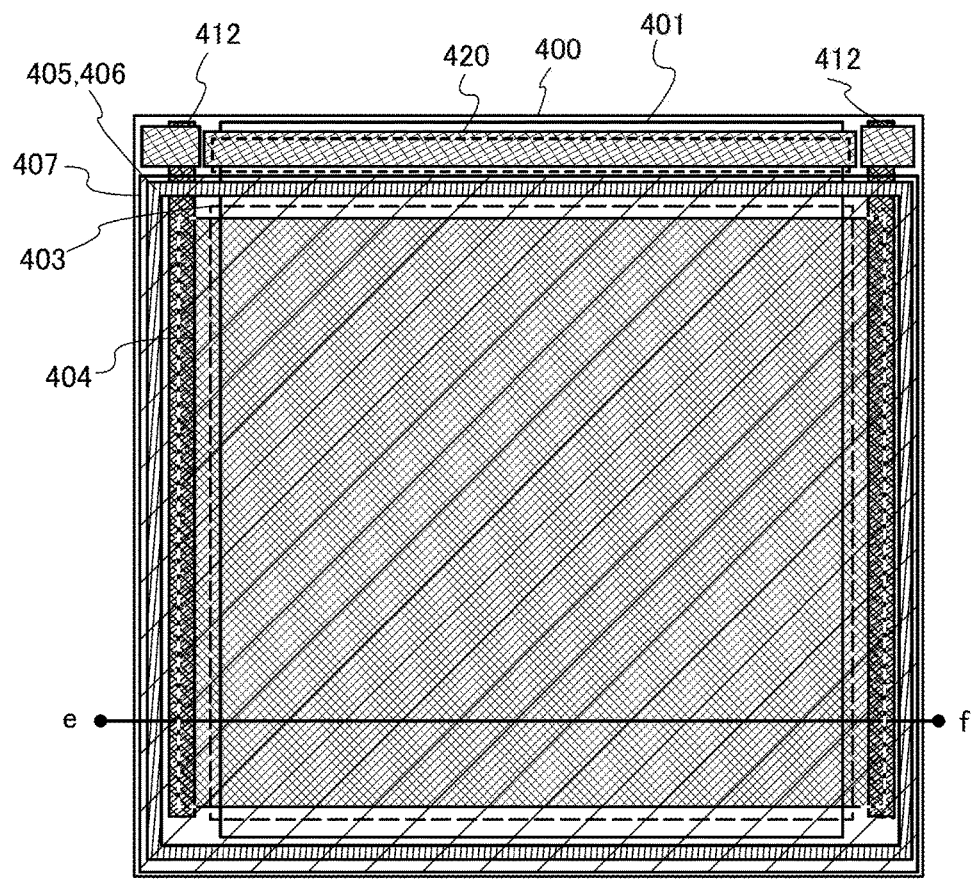

An example in which the light-emitting element illustrated in FIG. 1A or FIG. 1B is used for a lighting device is described with reference to FIGS. 6A and 6B. FIG. 6B is a top view of the lighting device, and FIG. 6A is a cross-sectional view taken along the line e-f in FIG. 6B.

In the lighting device in this embodiment, a first electrode 401 is formed over a substrate 400 which is a support and has a light-transmitting property. The first electrode 401 corresponds to the first electrode 101 in FIG. 1A. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in FIG. 1A, or the structure in which the first light-emitting unit 511, the second light-emitting unit 512, and the charge-generation layer 513 in FIG. 1B are combined. For these structures, the corresponding description can be referred to.

The second electrode 404 is formed to cover the EL layer 403. The second electrode 404 corresponds to the second electrode 102 in FIG. 1A. The second electrode 404 is formed using a material having high reflectance when light is extracted through the first electrode 401 side. The second electrode 404 is connected to the pad 412, whereby voltage is applied thereto.

As described above, the lighting device of one embodiment of the present invention includes a light-emitting element including the first electrode 401, the EL layer 403, and the second electrode 404.

The light-emitting element having the above structure is fixed to a sealing substrate 407 with sealants 405 and 406 and sealing is performed, whereby the lighting device is completed. It is possible to use only either the sealant 405 or the sealant 406. In addition, the inner sealant 406 (not illustrated in FIG. 6B) can be mixed with a desiccant that enables moisture to be adsorbed, which results in improved reliability.

When parts of the pad 412 and the first electrode 401 are extended to the outside of the sealants 405 and 406, the extended parts can serve as external input terminals. An IC chip 420 mounted with a converter or the like may be provided over the external input terminals.

As described above, since the lighting device described in this embodiment includes the light-emitting element illustrated in FIG. 1A or FIG. 1B as an EL element, the lighting device can have low power consumption. In addition, the light-emitting device can have low drive voltage. Furthermore, the light-emitting device can be inexpensive.

(Electronic Appliance)

Next, examples of electronic appliances each including the light-emitting element illustrated in FIG. 1A or FIG. 1B are described. The light-emitting element illustrated in FIG. 1A or FIG. 1B has high emission efficiency and reduced power consumption. As a result, the electronic appliances described in this embodiment can each include a light-emitting portion having reduced power consumption. The light-emitting element illustrated in FIG. 1A or FIG. 1B includes a smaller number of layers to be formed; thus, the electronic appliances can be inexpensive.

Examples of the electronic appliance to which the above light-emitting element is applied include television devices (also referred to as TV or television receivers), monitors for computers and the like, cameras such as digital cameras and digital video cameras, digital photo frames, mobile phones (also referred to as cellular phones or cellular phone devices), portable game machines, portable information terminals, audio playback devices, and large game machines such as pachinko machines. Specific examples of these electronic appliances are given below.

FIG. 7A illustrates an example of a television device. In the television device, a display portion 7103 is incorporated in a housing 7101. In addition, here, the housing 7101 is supported by a stand 7105. Images can be displayed on the display portion 7103 where the light-emitting elements illustrated in FIG. 1A or FIG. 1B are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the receiver, general television broadcasts can be received. Moreover, when the display device is connected to a communication network with or without wires via the modem, one-way (from a sender to a receiver) or two-way (between a sender and a receiver or between receivers) data communication can be performed.

FIG. 7B1 illustrates a computer that includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203, which are the same as that illustrated in FIG. 1A or FIG. 1B. The computer illustrated in FIG. 7B1 may have a structure illustrated in FIG. 7B2. A computer illustrated in FIG. 7B2 is provided with a second display portion 7210 instead of the keyboard 7204 and the pointing device 7206. The second display portion 7210 is a touch screen, and input can be performed by operation of display for input on the second display portion 7210 with a finger or a dedicated pen. The second display portion 7210 can also display images other than the display for input. The display portion 7203 may also be a touchscreen. Connecting the two screens with a hinge can prevent troubles; for example, the screens can be prevented from being cracked or broken while the computer is being stored or carried. Note that this computer is manufactured by arranging the light-emitting elements illustrated in FIG. 1A or FIG. 1B in a matrix in the display portion 7203.

FIG. 7C illustrates a portable game machine that includes two housings, a housing 7301 and a housing 7302, which are connected with a joint portion 7303 so that the portable game machine can be opened or folded. The housing 7301 incorporates a display portion 7304 including the light-emitting elements illustrated in FIG. 1A or FIG. 1B and arranged in a matrix, and the housing 7302 incorporates a display portion 7305. In addition, the portable game machine illustrated in FIG. 7C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above structure as long as the display portion including the light-emitting elements each of which is illustrated in FIG. 1A or FIG. 1B and which are arranged in a matrix is used as at least either the display portion 7304 or the display portion 7305, or both, and the structure can include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above functions.

FIG. 7D illustrates an example of a mobile phone. The mobile phone is provided with a display portion 7402 incorporated in a housing 7401, an operation button 7403, an external connection port 7404, a speaker 7405, a microphone 7406, and the like. Note that the mobile phone has the display portion 7402 including the light-emitting elements each of which is illustrated in FIG. 1A or FIG. 1B and which are arranged in a matrix.

When the display portion 7402 of the mobile phone illustrated in FIG. 7D is touched with a finger or the like, data can be input into the mobile phone. In this case, operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device which includes a sensor for detecting inclination, such as a gyroscope or an acceleration sensor, is provided inside the mobile phone, the direction of the mobile phone (whether the mobile phone is placed horizontally or vertically for a landscape mode or a portrait mode) is determined so that display on the screen of the display portion 7402 can be automatically switched.

The screen modes are switched by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, by providing a backlight or a sensing light source that emits near-infrared light in the display portion, an image of a finger vein, a palm vein, or the like can be taken.

As described above, the application range of the light-emitting device including the light-emitting element illustrated in FIG. 1A or FIG. 1B is so wide that the light-emitting device can be applied to electronic appliances in a variety of fields. By using the light-emitting element illustrated in FIG. 1A or FIG. 1B, an electronic appliance having reduced power consumption can be obtained.

Figure 8:
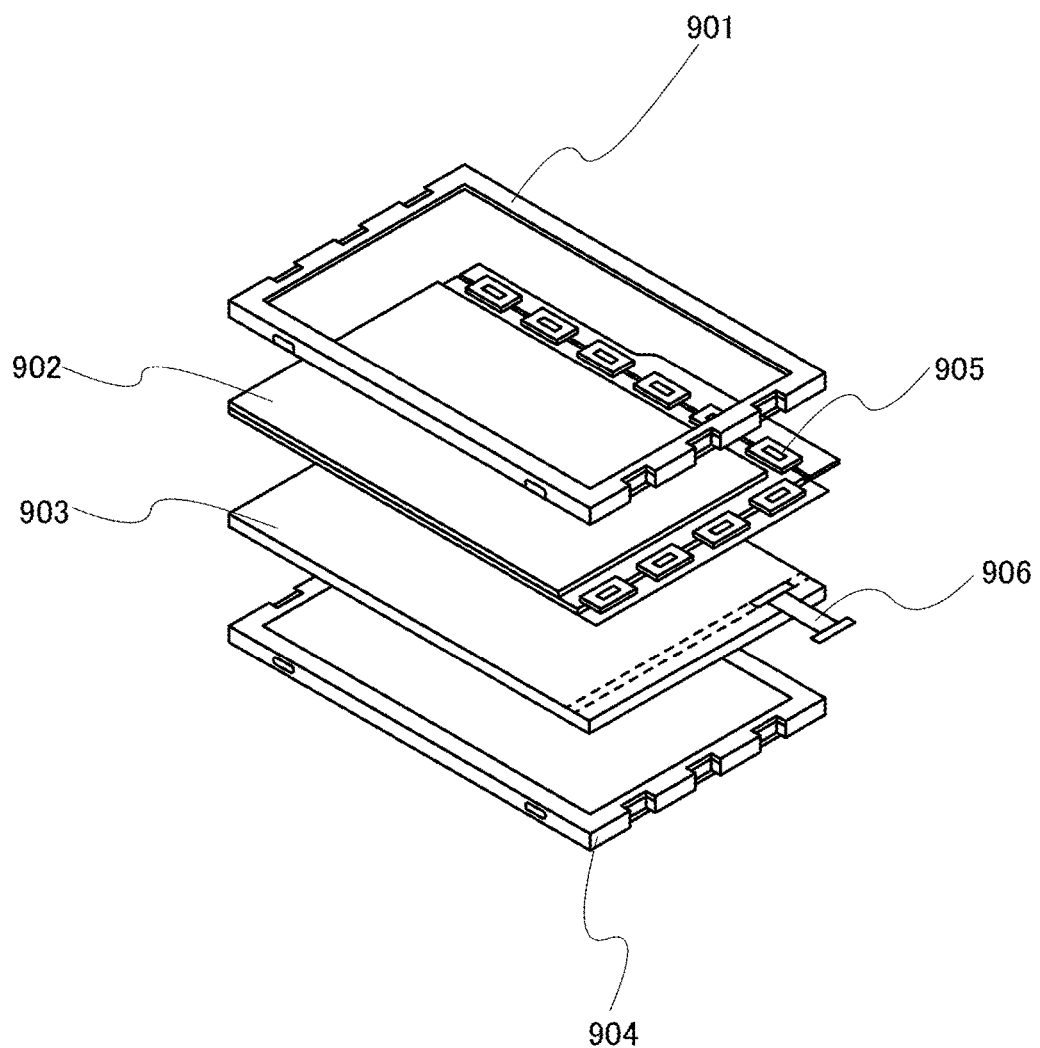
FIG. 8 illustrates a light source device.

FIG. 8 illustrates an example of a liquid crystal display device using the light-emitting element illustrated in FIG. 1A or FIG. 1B for a backlight. The liquid crystal display device illustrated in FIG. 8 includes a housing 901, a liquid crystal layer 902, a backlight unit 903, and a housing 904. The liquid crystal layer 902 is connected to a driver IC 905. The light-emitting element illustrated in FIG. 1A or FIG. 1B is used for the backlight unit 903, to which current is supplied through a terminal 906.

The light-emitting element illustrated in FIG. 1A or FIG. 1B is used for the backlight of the liquid crystal display device; thus, the backlight can have reduced power consumption. In addition, the use of the light-emitting element illustrated in FIG. 1A or FIG. 1B enables fabrication of a planar-emission lighting device and further a larger-area planar-emission lighting device; therefore, the backlight can be a larger-area backlight, and the liquid crystal display device can also be a larger-area device. Furthermore, the light-emitting device using the light-emitting element illustrated in FIG. 1A or FIG. 1B can be thinner than a conventional one; accordingly, the display device can also be thinner.

Figure 9:
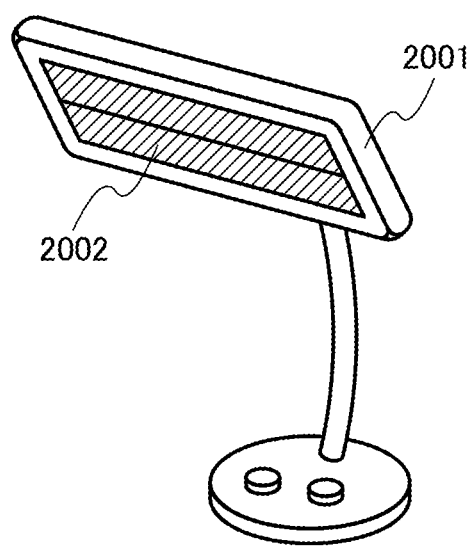
FIG. 9 illustrates a lighting device.

FIG. 9 illustrates an example in which the light-emitting element illustrated in FIG. 1A or FIG. 1B is used for a table lamp that is a lighting device. The table lamp illustrated in FIG. 9 includes a housing 2001 and a light source 2002. The lighting element illustrated in FIG. 1A or FIG. 1B are used for the light source 2002.

Figure 10:
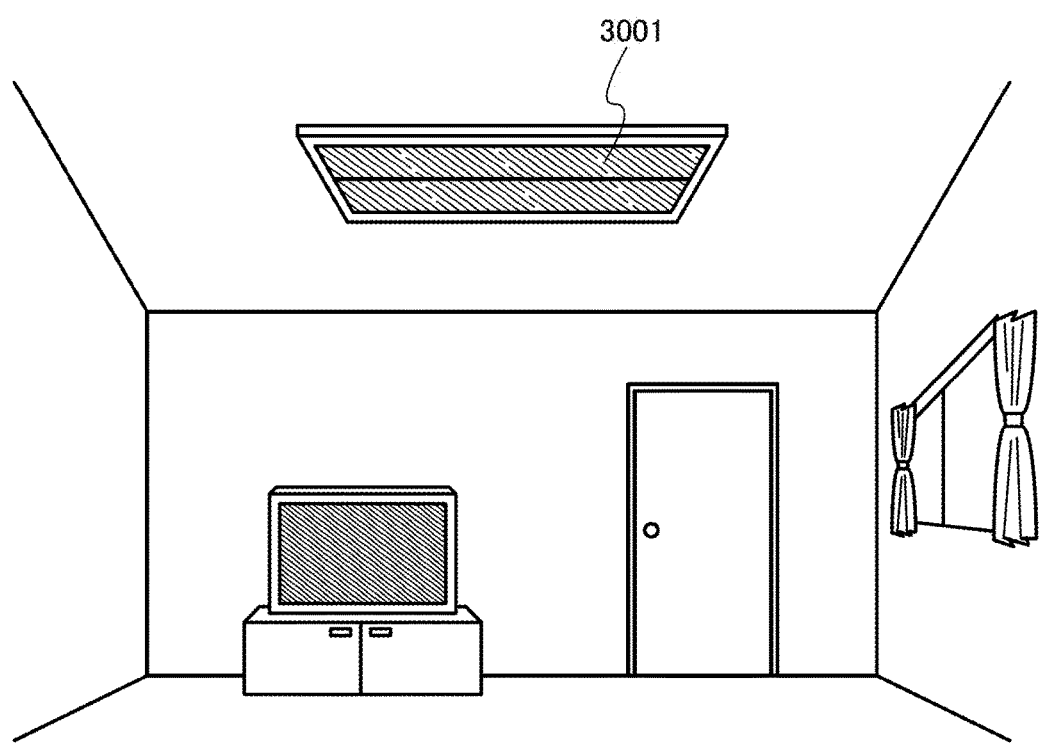
FIG. 10 illustrates a lighting device.

FIG. 10 illustrates an example in which the light-emitting element illustrated in FIG. 1A or FIG. 1B is used for an indoor lighting device 3001. Since the light-emitting element illustrated in FIG. 1A or FIG. 1B can have a large area, the light-emitting element can be used for a large-area lighting device. Furthermore, since the light-emitting element illustrated in FIG. 1A or FIG. 1B is thin, the light-emitting element can be used for a lighting device having a reduced thickness.

Figure 11:
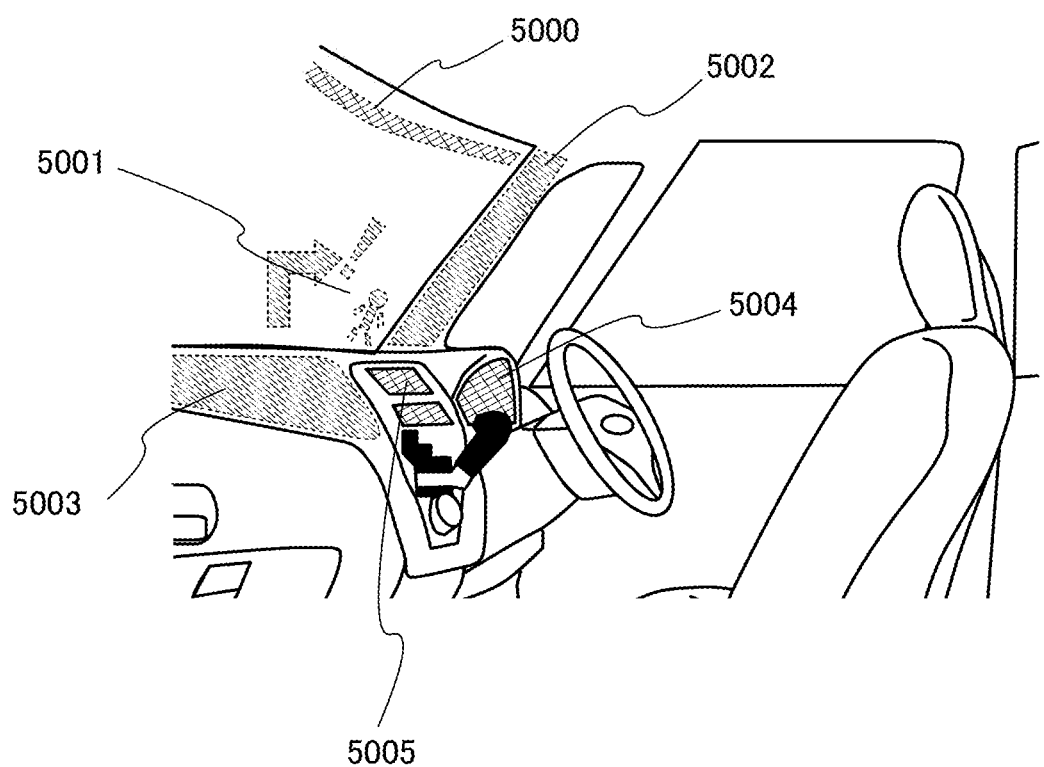
FIG. 11 illustrates in-vehicle display devices and lighting devices.

The light-emitting element illustrated in FIG. 1A or FIG. 1B can also be used for an automobile windshield or an automobile dashboard. FIG. 11 illustrates one mode in which the light-emitting element illustrated in FIG. 1A or FIG. 1B is used for an automobile windshield and an automobile dashboard. Displays regions 5000 to 5005 each include the light-emitting element illustrated in FIG. 1A or FIG. 1B.

The display region 5000 and the display region 5001 are provided in the automobile windshield in which the light-emitting elements illustrated in FIG. 1A or FIG. 1B are incorporated. The light-emitting element illustrated in FIG. 1A or FIG. 1B can be formed into what is called a see-through display device, through which the opposite side can be seen, by including a first electrode and a second electrode formed of electrodes having light-transmitting properties. Such a see-through display device does not hinder the vision and thus can be provided in the automobile windshield. Note that in the case where a transistor for driving or the like is provided, a transistor having a light-transmitting property, such as an organic transistor using an organic semiconductor material or a transistor using an oxide semiconductor, is preferably used.

A display region 5002 is provided in a pillar portion in which the light-emitting element illustrated in FIG. 1A or FIG. 1B are incorporated. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area that a driver cannot see, makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The contents or layout of the display can be changed by a user as appropriate. Note that such information can also be shown by the display regions 5000 to 5003. The display regions 5000 to 5005 can also be used as lighting devices.

The light-emitting element illustrated in FIG. 1A or FIG. 1B can have high emission efficiency and low power consumption. Therefore, load on a battery is small even when a number of large screens such as the display regions 5000 to 5005 are provided, which provides comfortable use. For that reason, the light-emitting device and the lighting device each of which includes the light-emitting element illustrated in FIG. 1A or FIG. 1B can be suitably used as an in-vehicle light-emitting device and an in-vehicle lighting device.

Figure 12A:
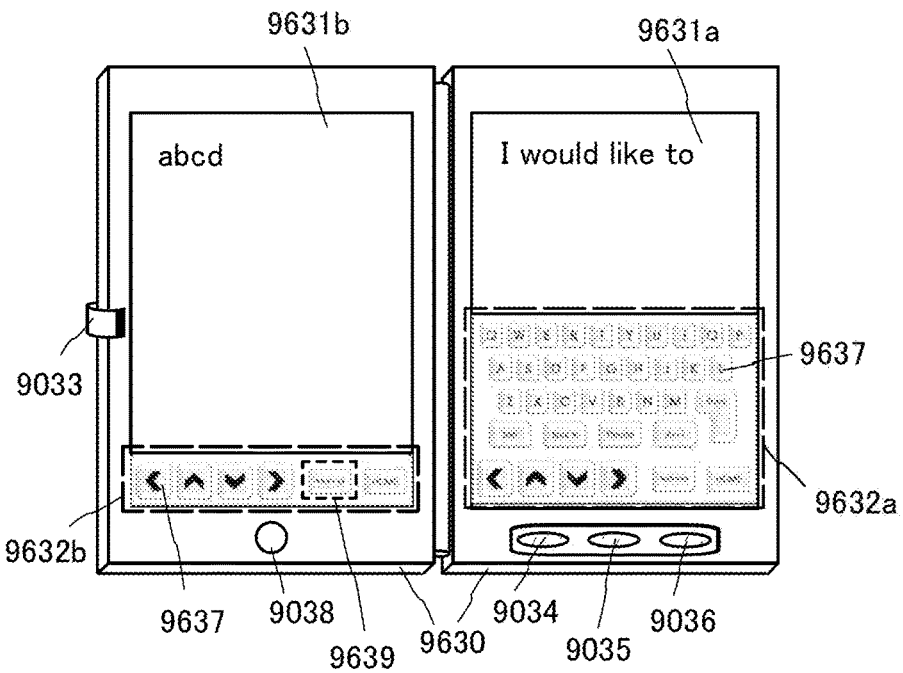
FIGS. 12A to 12C illustrate an electronic appliance.
Figure 12B:
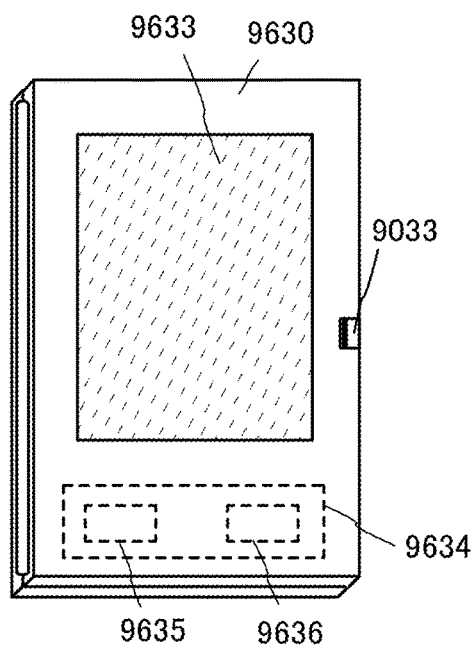

FIGS. 12A and 12B illustrate an example of a foldable tablet terminal. In FIG. 12A, the tablet terminal is opened and includes a housing 9630, a display portion 9631a, a display portion 9631b, a display-mode switching button 9034, a power button 9035, a power-saving-mode switching button 9036, a clip 9033, and an operation button 9038. Note that in the tablet terminal, one or both of the display portion 9631a and the display portion 9631b is/are formed using a light-emitting device which includes the light-emitting element illustrated in FIG. 1A or FIG. 1B.

Part of the display portion 9631a can be a touchscreen region 9632a and data can be input when a displayed operation key 9637 is touched. Although a structure in which a half region in the display portion 9631a has only a display function and the other half region also has a touchscreen function is illustrated as an example, the structure of the display portion 9631a is not limited thereto. The whole area of the display portion 9631a may have a touchscreen function. For example, the whole area of the display portion 9631a can display keyboard buttons and serve as a touchscreen while the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed concurrently on the touchscreen regions 9632a and 9632b.

The display-mode switching button 9034 allows switching between a portrait mode and a landscape mode, and between monochrome display and color display, for example. With the power-saving-mode switching button 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 12A, one embodiment of the present invention is not limited to this example. The display portion 9631a and the display portion 9631b may have different areas or different display quality. For example, one of them may be a display panel that can display higher-definition images than the other.

In FIG. 12B, the tablet terminal is folded and includes the housing 9630, a solar cell 9633, a charge and discharge control circuit 9634, a battery 9635, and a DC-to-DC converter 9636. Note that FIG. 12B illustrates an example in which the charge and discharge control circuit 9634 includes the battery 9635 and the DC-to-DC converter 9636.

Since the tablet terminal is foldable, the housing 9630 can be closed when the tablet terminal is not used. Thus, the display portions 9631a and 9631b can be protected, whereby a tablet terminal with high endurance and high reliability for long-term use can be provided.

The tablet terminal illustrated in FIGS. 12A and 12B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on the surface of the tablet terminal, supplies electric power to a touchscreen, a display portion, an image signal processor, and the like. Note that the solar cell 9633 is preferably provided on one or two surfaces of the housing 9630, in which case the battery 9635 can be charged efficiently.

Figure 12C:
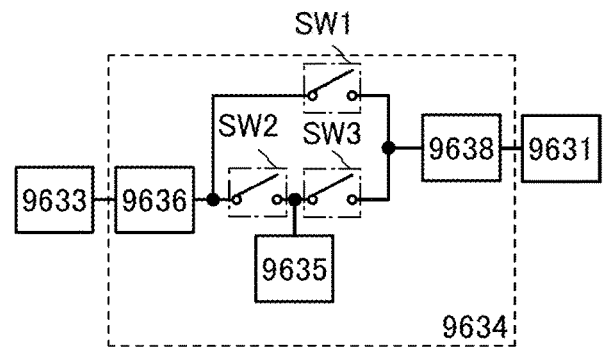

The structure and operation of the charge and discharge control circuit 9634 illustrated in FIG. 12B are described with reference to a block diagram of FIG. 12C. FIG. 12C illustrates the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 in FIG. 12B.

First, an example of operation in the case where power is generated by the solar cell 9633 using external light is described. The voltage of power generated by the solar cell is raised or lowered by the DC-to-DC converter 9636 so that the power has voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 may be performed.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module that is capable of charging by transmitting and receiving power by wireless (without contact), or another charge means used in combination, and the power generation means is not necessarily provided.

One embodiment of the present invention is not limited to the tablet terminal having the shape illustrated in FIGS. 12A to 12C as long as the display portion 9631 is included.

EXAMPLE 1

In this example, methods of fabricating Light-emitting elements 1 to 3 each of which is one embodiment of the present invention and Light-emitting element 4 which is a comparative light-emitting element and characteristics thereof are described. Structural formulae of organic compounds used for Light-emitting elements 1 to 4 are shown below.

(i)

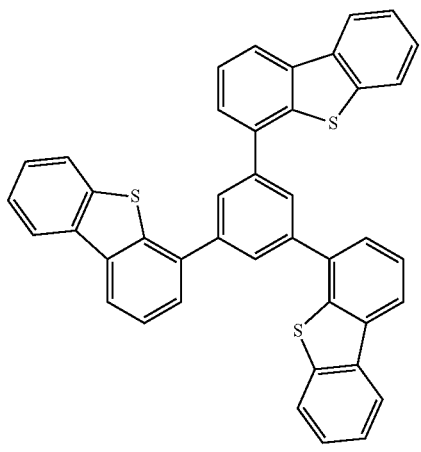

DBT3P-II (ii)

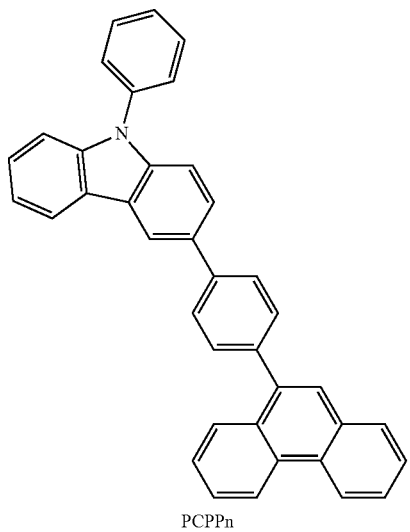

PCPPn (iii)

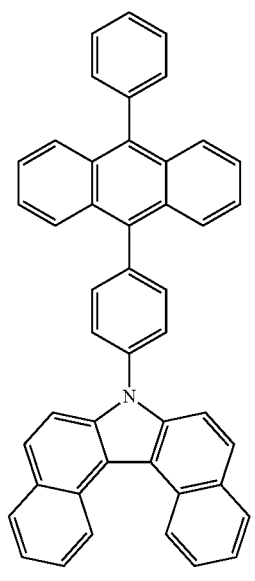

cgDBCzPA (iv)

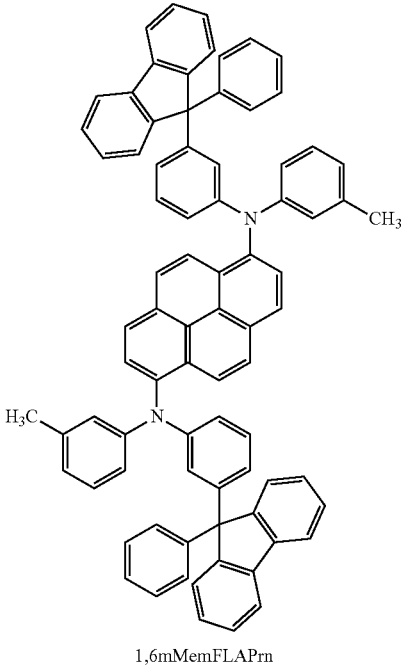

1,6mMemFLAPrn (v)

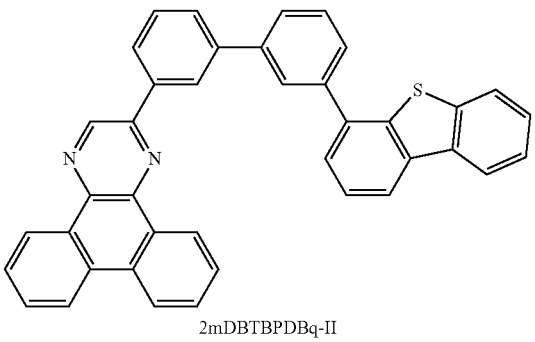

2mDBTBPDBq-II

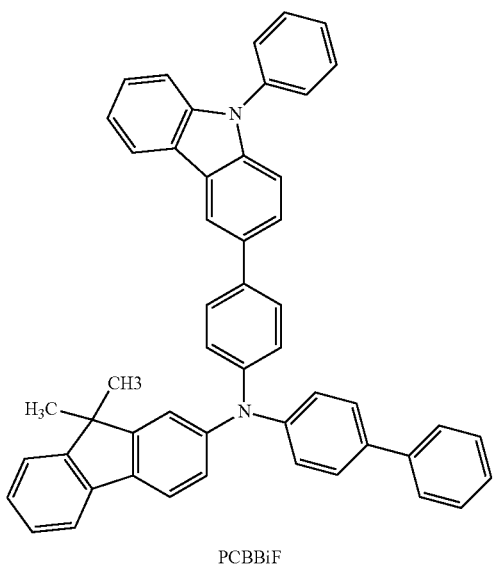

PCBBiF

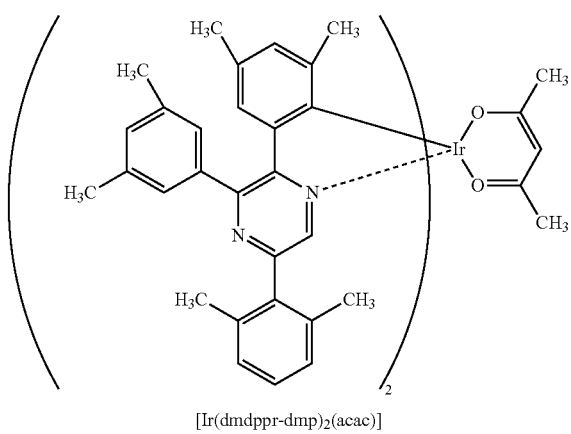

[Ir(dmdppr-dmp)₂(acac)]

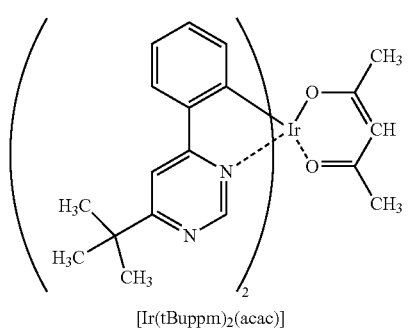

[Ir(tBuppm)₂(acac)]

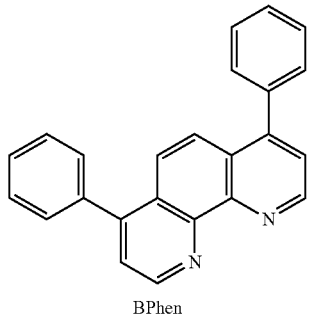

BPhen (Method of Fabricating Light-Emitting Element 1)

A film of indium tin oxide containing silicon oxide (ITSO) was formed over a glass substrate by a sputtering method to form the first electrode 101. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 40 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, on the hole-injection layer 111, 3-[4-(9-phenanthryl)-phenyl]-9-phenyl-9H-carbazole (abbreviation: PCPPn) represented by Structural Formula (ii) was deposited to a thickness of 20 nm; thus, the hole-transport layer 112 was formed.

On the hole-transport layer 112, 7-[4-(10-phenyl-9-anthryl)phenyl]-7H-dibenzo[c,g]carbazole (abbreviation: cgDBCzPA) represented by Structural Formula (iii) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by Structural Formula (iv) were deposited by co-evaporation to a thickness of 5 nm such that the weight ratio of cgDBCzPA to 1,6mMemFLPAPm was 1:0.03 (=cgDBCzPA: 1,6mMemFLPAPm); thus, the first light-emitting layer 113*a* that was a fluorescent layer was formed. Next, 2-[3'-(dibenzothiophen-4-yl)biphenyl-3-yl]dibenzo[f,h]quinoxaline (abbreviation: 2mDBTBPDBq- II) represented by Structural Formula (v) and N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (vi) were deposited by co-evaporation to a thickness of 2 nm such that the weight ratio of 2mDBTBPDBq-II to PCBBiF was 0.6:0.4 (=2mDBTBPDBq-II:PCBBiF); thus, the separation layer 113b was formed. Then, the first phosphorescent layer 113c-1 was formed in such a manner that 2mDBTBPDBq-II, PCBBiF, and bis{4,6-dimethyl-2-[5-(2,6-dimethylphenyl)-3-(3,5-dimethylphenyl)-2-pyrazinyl-κN]phenyl-κC}(2,4-pentanedionato-κ²O,O')iridium(III) (abbreviation: [Ir(dmdppr-dmp)$_2$(acac)]) represented by Structural Formula (vii) were deposited by co-evaporation to a thickness of 5 nm such that the weight ratio of 2mDBTBPDBq-II to PCBBiF and [Ir(dmdppr-dmp)$_2$(acac)] was 0.2:0.8:0.05 (=2mDBTBPDBq-II:PCBBiF: [Ir(dmdppr-dmp)$_2$(acac)]); the second phosphorescent layer 113c-2 was successively formed in such a manner that 2mDBTBPDBq-II, PCBBiF, and bis[2-(6-tert-butyl-4-pyrimidinyl-xN3)phenyl-κC](2,4-pentanedionato-κ²O,O')iridium(III) (abbreviation: [Ir(tBuppm)$_2$(acac)]) represented by Structural Formula (viii) were deposited by co-evaporation to a thickness of 20 nm such that the weight ratio of 2mDBTBPDBq-II to PCBBiF and [Ir(tBuppm)$_2$(acac)] was 0.7:0.3:0.05 (=2mDBTBPDBq-II:PCBBiF:[Ir(tBuppm)$_2$(acac)]). Through the above steps, the second light-emitting layer 113c that was a phosphorescent layer was formed. In Light-emitting element 1, the light-emitting layer 113 includes the first light-emitting layer 113a and the second light-emitting layer 113c.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, Light-emitting element 1 of this example was fabricated.

Note that in all the above evaporation steps, evaporation was performed by a resistance-heating method.

(Method of Fabricating Light-emitting Elements 2 and 3)

Light-emitting element 2 and Light-emitting element 3 are elements in which the thickness of the separation layer 113b of Light-emitting element 1 is changed to 5 nm and 10 nm, respectively.

(Method of Fabricating Light-emitting Element 4)

Light-emitting element 4 has a structure in which the separation layer 113b is removed from the structure of Light-emitting element 1.

In a glove box under a nitrogen atmosphere, each of Light-emitting elements 1 to 4 was sealed with a glass substrate so as not to be exposed to the air (specifically, a sealant was applied onto an outer edge of the element, and at the time of sealing, UV treatment was performed and then heat treatment was performed at 80° C. for 1 hour). Then, the reliability of these light-emitting elements was measured. Note that the measurement was performed at room temperature (in the atmosphere kept at 25° C.).

Table 1 shows the element structures of Light-emitting elements 1 to 4.

TABLE 1

| Hole-injection layer | Hole-transport layer | First light-emitting layer | Separation layer | Second light-emitting layer | Electron-transport layer | | Electron-injection layer |
|---|---|---|---|---|---|---|---|
| DBT3P-II: MoOx 2:1 | PCPPn | cgDBCzPA: 1,6mMemFLPAPrn 1:0.03 | * | ** | *** | 2mDBTBPDBq-II | BPhen | LiF |
| 40 nm | 20 nm | 5 nm | X | 5 nm | 20 nm | 10 nm | 15 nm | 1 nm |

* 2mDBTBPDBq-II:PCBBiF = 0.6:0.4
X: Light-emitting element 1 2 nm, Light-emitting element 2 5 nm, Light-emitting element 3 10 nm, Light-emitting element 4 0 nm
** 2mDBTBPDBq-II:PCBBiF:Ir(dmdppr-dmp)$_2$(acac) = 0.2:0.8:0.05
*** 2mDBTBPDBq-II:PCBBiF:Ir(tBuppm)$_2$(acac) = 0.7:0.3:0.05

Note that 2mDBTBPDBq-II and PCBBiF form an exciplex in the phosphorescent layer (the second light-emitting layer 113c). This emission wavelength overlaps absorption bands on the longest wavelength sides of [Ir(dmdppr-dmp)$_2$(acac)] and [Ir(tBuppm)$_2$(acac)], so that energy transfer efficiency is high.

The singlet excitation energy of cgDBCzPA that is a host material in the fluorescent layer (the first light-emitting layer 113a) is higher than the singlet excitation energy of 1,6mMemFLPAPrn that is a fluorescent substance. In addition, the triplet excitation energy of cgDBCzPA is lower than the triplet excitation energy of 1,6mMemFLPAPrn. Thus, in the fluorescent layer (the first light-emitting layer 113a), regeneration of a singlet exciton associated with triplet-triplet annihilation and light emission are obtained easily.

After that, on the phosphorescent layer (the second light-emitting layer 113c), 2mDBTBPDBq-II was deposited to a thickness of 10 nm, and bathophenanthroline (abbreviation: BPhen) represented by Structural Formula (ix) was deposited to a thickness of 15 nm to form the electron-transport layer 114.

Figure 13:
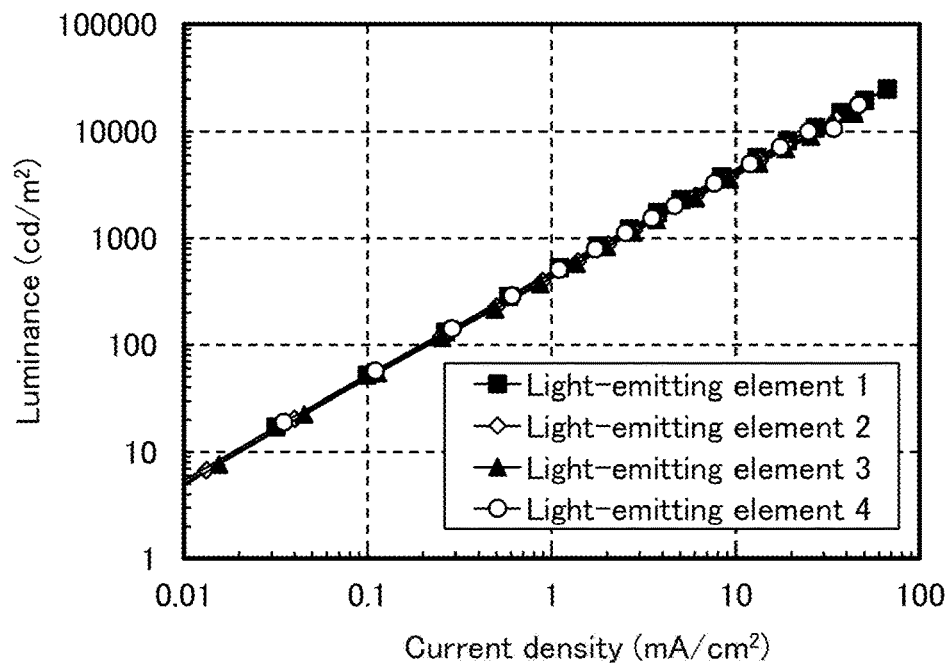
FIG. 13 shows the current density-luminance characteristics of Light-emitting elements 1 to 4.
Figure 14:
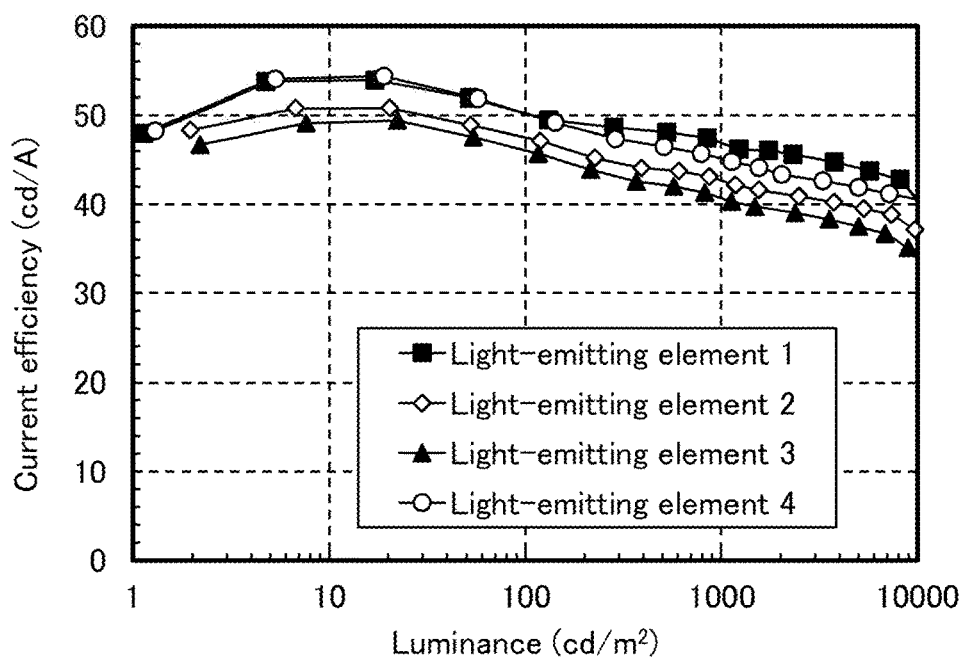
FIG. 14 shows the luminance-current efficiency characteristics of Light-emitting elements 1 to 4.
Figure 15:
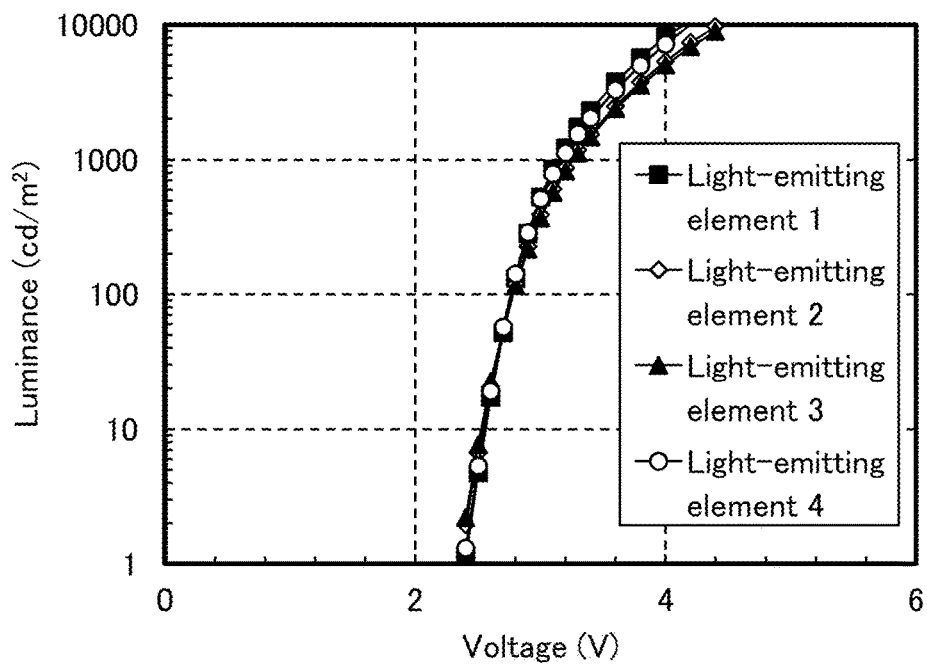
FIG. 15 shows the voltage-luminance characteristics of Light-emitting elements 1 to 4.
Figure 16:
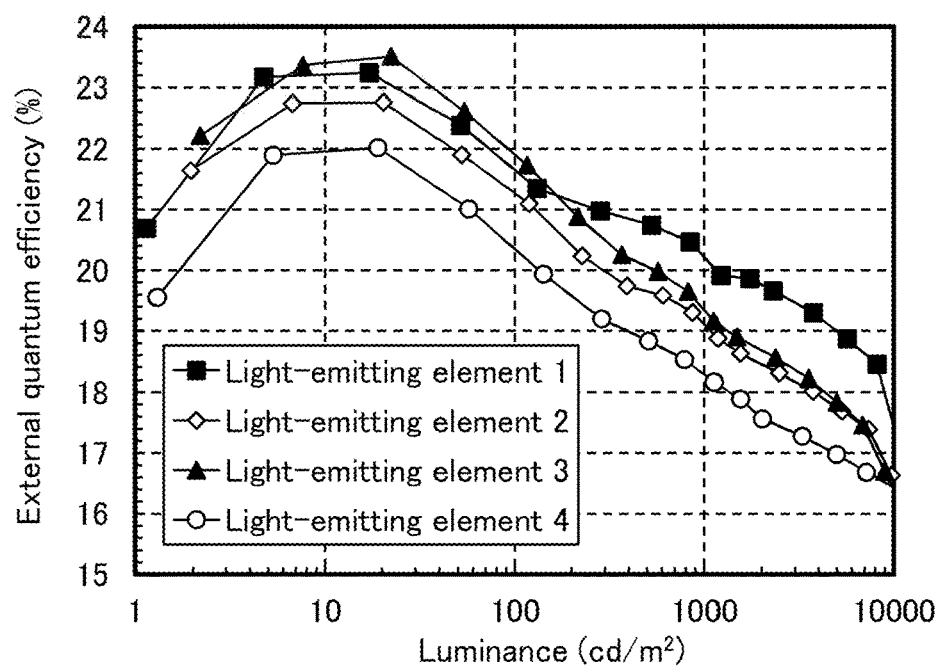
FIG. 16 shows the luminance-external quantum efficiency characteristics of Light-emitting elements 1 to 4.
Figure 17:
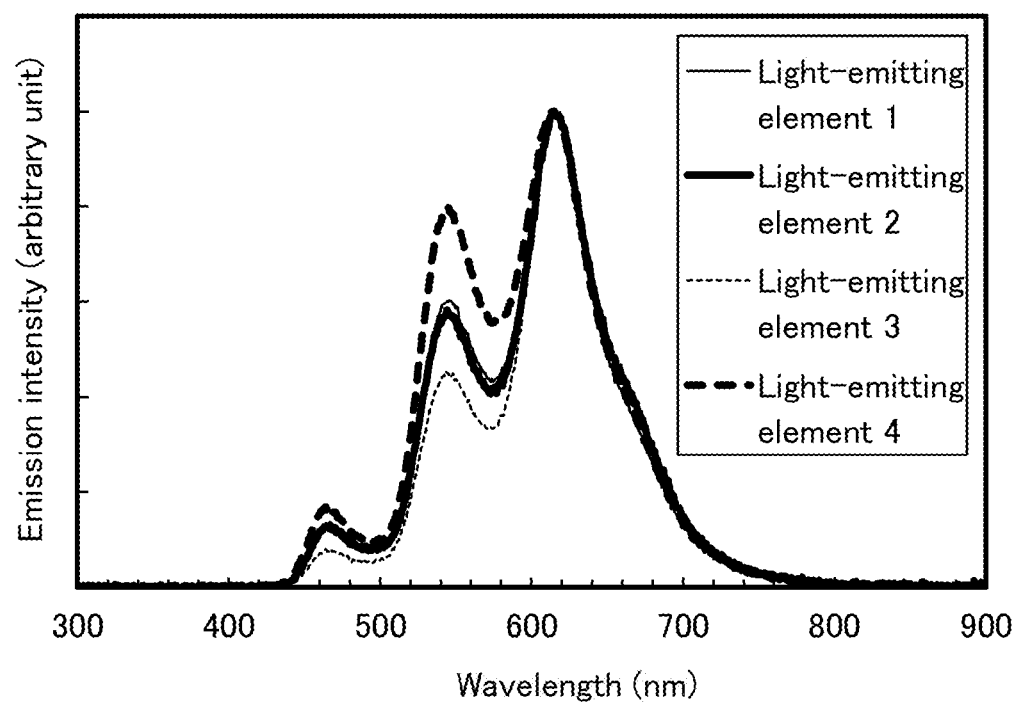
FIG. 17 shows the emission spectra of Light-emitting elements 1 to 4.

FIG. 13 shows current density-luminance characteristics of Light-emitting elements 1 to 4. FIG. 14 shows luminance-current efficiency characteristics Light-emitting elements 1 to 4. FIG. 15 shows voltage-luminance characteristics of Light-emitting elements 1 to 4. FIG. 16 shows luminance-external quantum efficiency characteristics of Light-emitting elements 1 to 4. FIG. 17 shows emission spectra of Light-emitting elements 1 to 4.

As can be seen from the characteristics, although Light-emitting elements 1 to 4 did not include an intermediate layer, Light-emitting elements 1 to 4 had a current efficiency of 40 cd/A or higher at around 1000 cd/m$^2$ and an external quantum efficiency of 18% or higher. This indicates that Light-emitting elements 1 to 4 had high emission efficiency. The drive voltage at around 1000 cd/m$^2$ is as low as in the 3-V range, which is much lower than the drive voltage of a tandem light-emitting element. Moreover, Light-emitting elements 1 to 3 each have extremely favorable efficiency: external quantum efficiency of 19% or higher at around 1000 cd/m$^2$. Table 2 lists values of main characteristics of Light-emitting Elements 1 to 4 at around 1000 cd/m$^2$.

TABLE 2

|  | Voltage (V) | Current density (mA/cm²) | Current efficiency (cd/A) | Power efficiency (lm/W) | External quantum efficiency (%) | Energy efficiency (%) | Correlated color temperature (K) | duv |
|---|---|---|---|---|---|---|---|---|
| Light-emitting element 1 | 3.1 | 1.8 | 47 | 48 | 20 | 14 | 2570 | 0.011 |
| Light-emitting element 2 | 3.2 | 2.0 | 43 | 42 | 19 | 13 | 2520 | 0.01 |
| Light-emitting element 3 | 3.3 | 2.8 | 40 | 38 | 19 | 12 | 2180 | 0.006 |
| Light-emitting element 4 | 3.2 | 2.5 | 45 | 44 | 18 | 12 | 2930 | 0.016 |

Moreover, the emission spectrum in FIG. 17 shows that red light emission originating from [Ir(dmdppr-dmp)$_2$(acac)], green light emission originating from [Ir(tBuppm)$_2$(acac)], and blue light emission originating from 1,6mMem-FLPAPm were observed. This indicates that light emission was sufficiently obtained from both the first light-emitting layer 113a that was a fluorescent layer and the second light-emitting layer 113c that was a phosphorescent layer.

As described above, Light-emitting elements 1 to 4 had highly well-balanced, favorable characteristics and was able to be fabricated easily and inexpensively. The above-described results were attributed to the following: diffusion of excitons was suppressed and non-radiative decay of the triplet excitation energy was reduced by using the exciplex as an energy donor of the phosphorescent layer, and the emission efficiency was improved because of occurrence of delayed fluorescence due to triplet-triplet annihilation in the host material in the fluorescent layer. The use of the separation layer 113b suppresses energy transfer from the phosphorescent layer (the second light-emitting layer 113c) to the fluorescent layer (the first light-emitting layer 113a) at their interface; therefore, Light-emitting elements 1 to 3 can have more favorable characteristics.

EXAMPLE 2

In this example, a method of fabricating Light-emitting element 5 which is one embodiment of the present invention and characteristics thereof are described. Structural formulae of organic compounds used for Light-emitting element 5 are shown below.

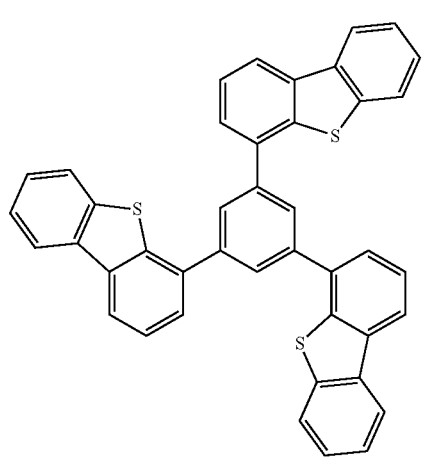

DBT3P-II (i)

-continued

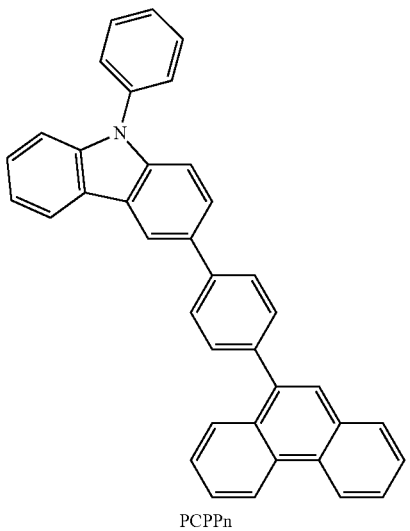

PCPPn (ii)

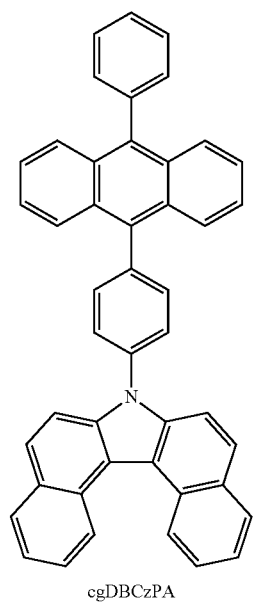

cgDBCzPA (iii)

(iv)

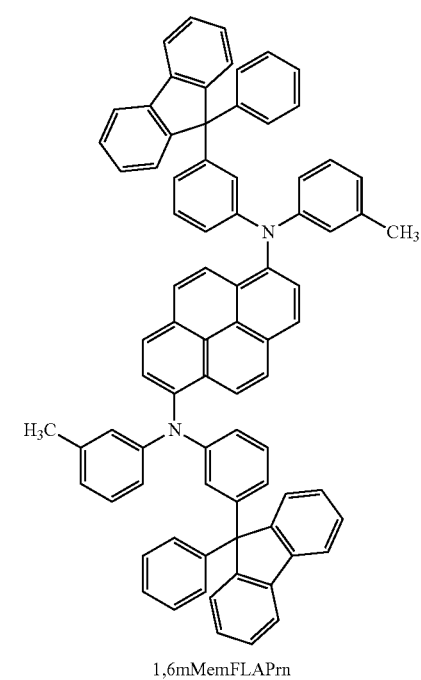

1,6mMemFLAPrn (v)

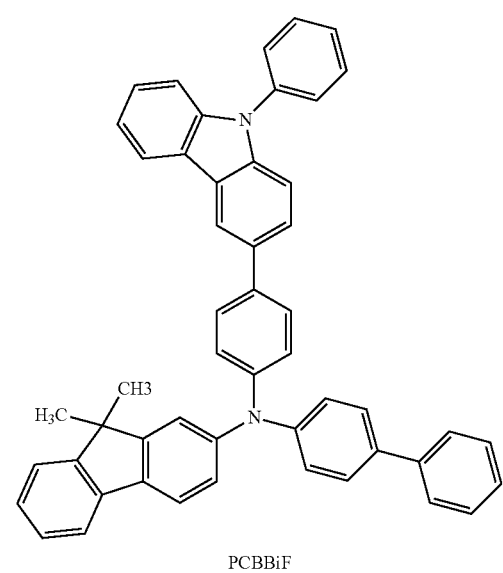

2mDBTBPDBq-II (vi)

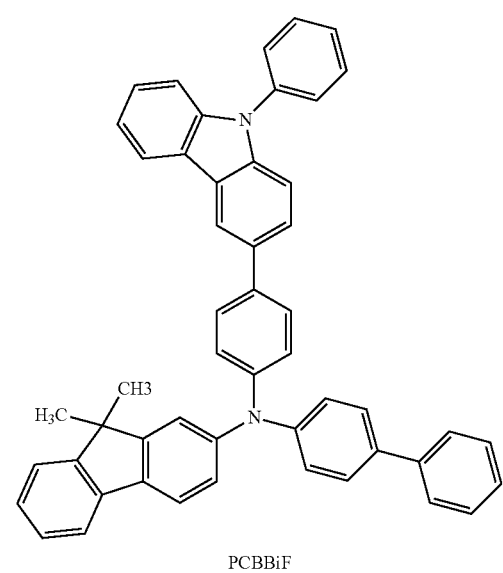

PCBBiF (vii)

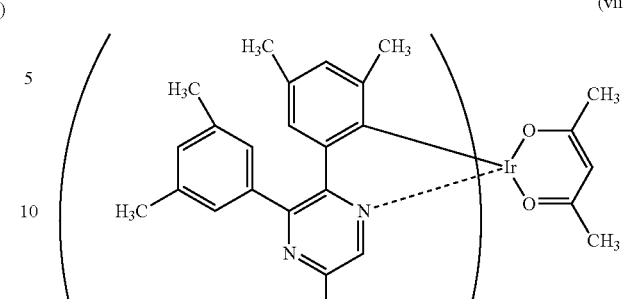

[Ir(dmdppr-dmp)$_2$(acac)]

(viii)

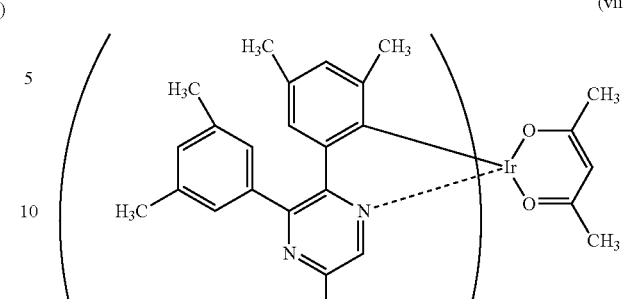

[Ir(tBuppm)$_2$(acac)]

(ix)

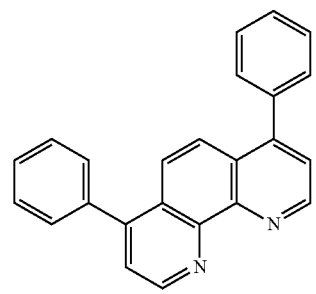

BPhen (Method of Fabricating Light-emitting Element 5)

A film of indium tin oxide containing silicon oxide (ITSO) was formed over a glass substrate by a sputtering method to form the first electrode 101. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 40 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, on the hole-injection layer 111, 3-[4-(9-phenanthryl)-phenyl]-9-phenyl-9H-carbazole (abbreviation: PCPPn) represented by Structural Formula (ii) was deposited to a thickness of 10 nm; thus, the hole-transport layer 112 was formed.

On the hole-transport layer 112, 7-[4-(10-phenyl-9-anthryl)phenyl]-7H-dibenzo[c,g]carbazole (abbreviation: cgDBCzPA) represented by Structural Formula (iii) and N,N'-bis(3-methylphenyl)-N,N'-bis[3-(9-phenyl-9H-fluoren-9-yl)phenyl]-pyrene-1,6-diamine (abbreviation: 1,6mMemFLPAPm) represented by Structural Formula (iv) were deposited by co-evaporation to a thickness of 5 nm such that the weight ratio of cgDBCzPA to 1,6mMemFL-PAPm was 1:0.04 (=cgDBCzPA: 1,6mMemFLPAPm); thus, the first light-emitting layer 113a that was a fluorescent layer was formed. Next, 2-[3'-(dibenzothiophen-4-yl)biphenyl-3-yl]dibenzo[f,h]quinoxaline (abbreviation: 2mDBTBPDBq-II) represented by Structural Formula (v) and N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (vi) were deposited by co-evaporation to a thickness of 2 nm such that the weight ratio of 2mDBTBPDBq-II to PCBBiF was 0.6:0.4 (=2mD-BTBPDBq-II:PCBBiF); thus, the separation layer 113b was formed. Then, the first phosphorescent layer 113c-1 was formed in such a manner that 2mDBTBPDBq-II, PCBBiF, and bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O')iridium(III) (abbreviation: [Ir(dmdppr-dmp)$_2$(acac)]) represented by Structural Formula (vii) were deposited by co-evaporation to a thickness of 5 nm such that the weight ratio of 2mDBTBPDBq-II to PCBBiF and [Ir (dmdppr-dmp)$_2$(acac)] was 0.5:0.5:0.05 (=2mDBTBPDBq-II:PCBBiF: [Ir(dmdppr-dmp)$_2$(acac)]); the second phosphorescent layer 113c-2 was successively formed in such a manner that 2mDBTBPDBq-II, PCBBiF, and bis[2-(6-tert-butyl-4-pyrimidinyl-xN3)phenyl-κC](2,4-pentanedionato-κ$^2$O,O')iridium(III) (abbreviation: [Ir(tBuppm)$_2$(acac)]) represented by Structural Formula (viii) were deposited by co-evaporation to a thickness of 20 nm such that the weight ratio of 2mDBTBPDBq-II to PCBBiF and [Ir(tBuppm)$_2$(acac)] was 0.7:0.3:0.05 (=2mDBTBPDBq-II:PCBBiF:[Ir (tBuppm)$_2$(acac)]). Through the above steps, the second light-emitting layer 113c that was a phosphorescent layer was formed.

Note that 2mDBTBPDBq-II and PCBBiF form an exciplex in the phosphorescent layer (the second light-emitting layer 113c). This emission wavelength overlaps absorption bands on the longest wavelength sides of [Ir(dmdppr-dmp)$_2$ (acac)] and [Ir(tBuppm)$_2$(acac)], so that energy transfer efficiency is high.

The singlet excitation energy of cgDBCzPA that is a host material in the fluorescent layer (the first light-emitting layer 113a) is higher than the singlet excitation energy of 1,6mMemFLPAPm that is a fluorescent substance. In addition, the triplet excitation energy of cgDBCzPA is lower than the triplet excitation energy of 1,6mMemFLPAPm. Thus, in the fluorescent layer (the first light-emitting layer 113a), regeneration of a singlet exciton associated with triplet-triplet annihilation and light emission are obtained easily.

After that, on the phosphorescent layer (the second light-emitting layer 113c), 2mDBTBPDBq-II was deposited to a thickness of 10 nm, and bathophenanthroline (abbreviation: BPhen) represented by Structural Formula (ix) was deposited to a thickness of 15 nm to form the electron-transport layer 114.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, Light-emitting element 5 of this example was fabricated.

Note that in all the above evaporation steps, evaporation was performed by a resistance-heating method.

In a glove box under a nitrogen atmosphere, Light-emitting element 5 was sealed with a glass substrate so as not to be exposed to the air (specifically, a sealant was applied onto an outer edge of the element, and at the time of sealing, UV treatment was performed and then heat treatment was performed at 80° C. for 1 hour). Then, the reliability of the light-emitting element was measured. Note that the measurement was performed at room temperature (in the atmosphere kept at 25° C.).

Table 3 shows the element structures of Light-emitting element 5.

TABLE 3

| Hole-injection layer | Hole-transport layer | First light-emitting layer | Separation layer | Second light-emitting layer | Electron-transport layer | | Electron-injection layer |
|---|---|---|---|---|---|---|---|
| DBT3P-II: MoOx | PCPPn | cgDBCzPA: 1,6mMem FLPAPrn | * | ** | *** | 2mDBT BPDBq-II | BPhen | LiF |
| 2:1 | | 1:0.04 | | | | | | |
| 40 nm | 10 nm | 5 nm | 2 nm | 5 nm | 20 nm | 10 nm | 15 nm | 1 nm |

\* 2mDBTBPDBq-II:PCBBiF = 0.6:0.4
\*\* 2mDBTBPDBq-II:PCBBiF:Ir(dmdppr-dmp)$_2$(acac) = 0.5:0.5:0.05
\*\*\* 2mDBTBPDBq-II:PCBBiF:Ir(tBuppm)$_2$(acac) = 0.7:0.3:0.05

Figure 18:
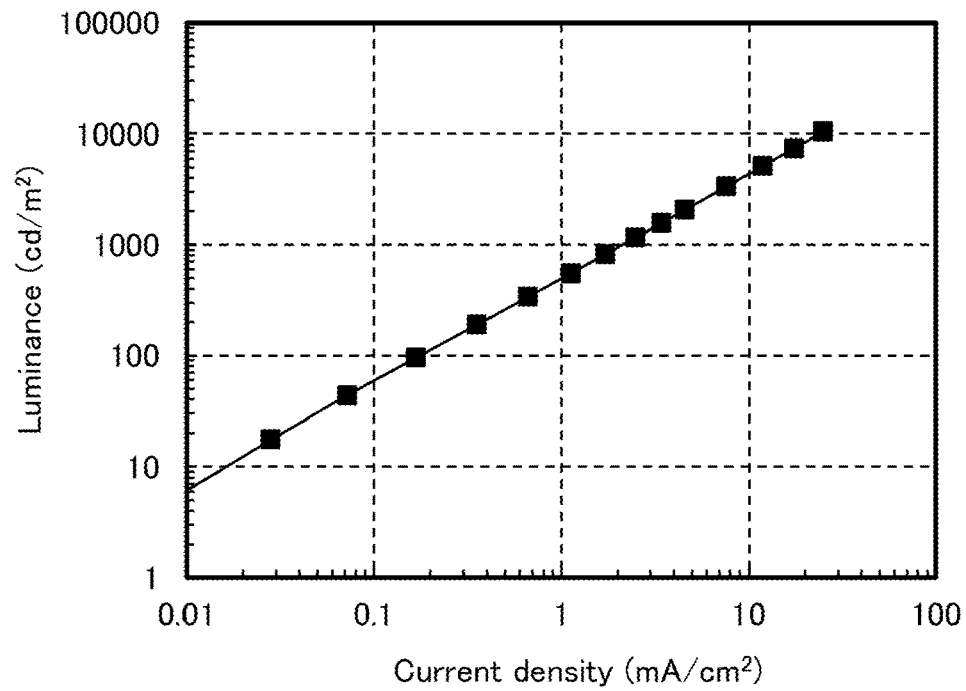
FIG. 18 shows the current density-luminance characteristics of Light-emitting element 5.
Figure 19:
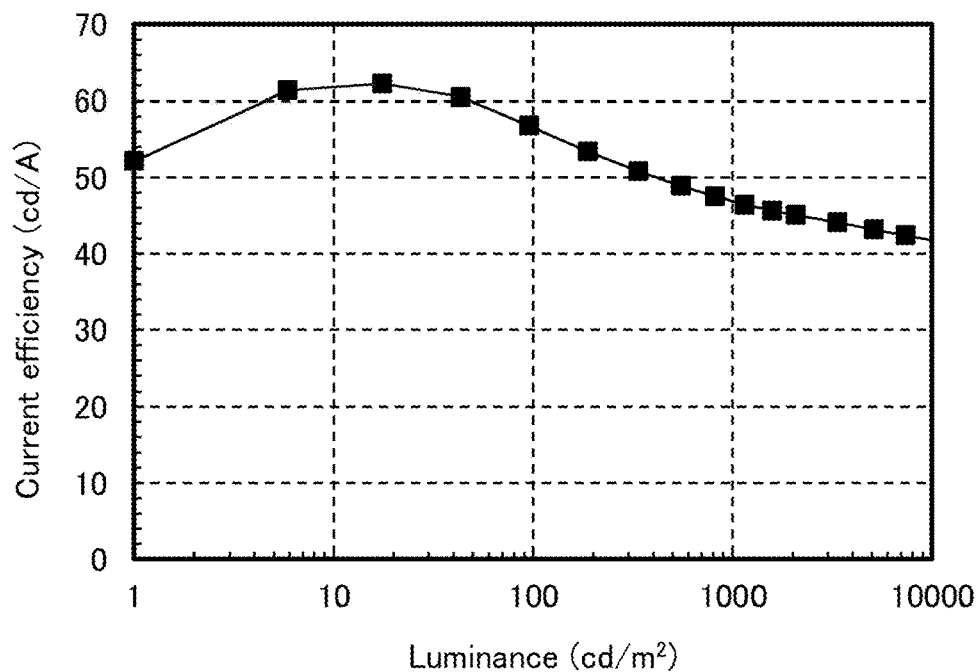
FIG. 19 shows the luminance-current efficiency characteristics of Light-emitting element 5.
Figure 20:
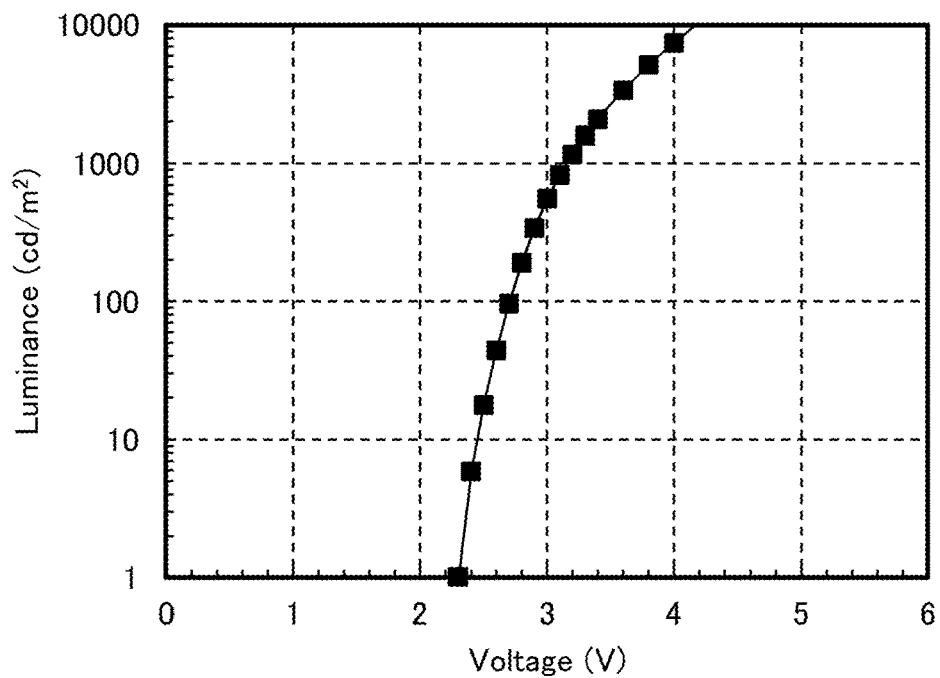
FIG. 20 shows the voltage-luminance characteristics of Light-emitting element 5.
Figure 21:
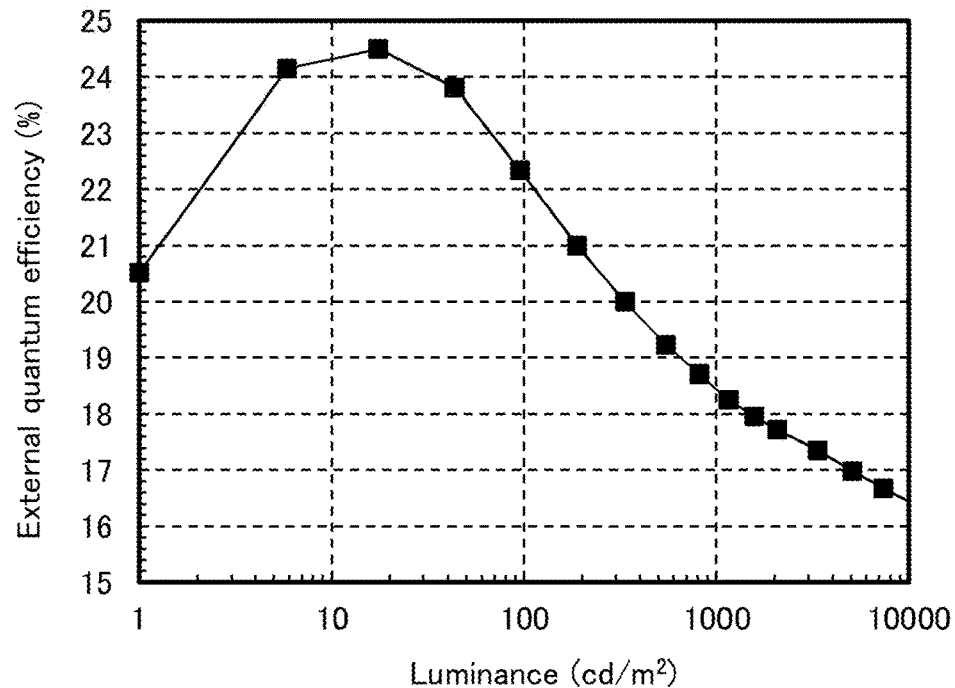
FIG. 21 shows the luminance-external quantum efficiency characteristics of Light-emitting element 5.
Figure 22:
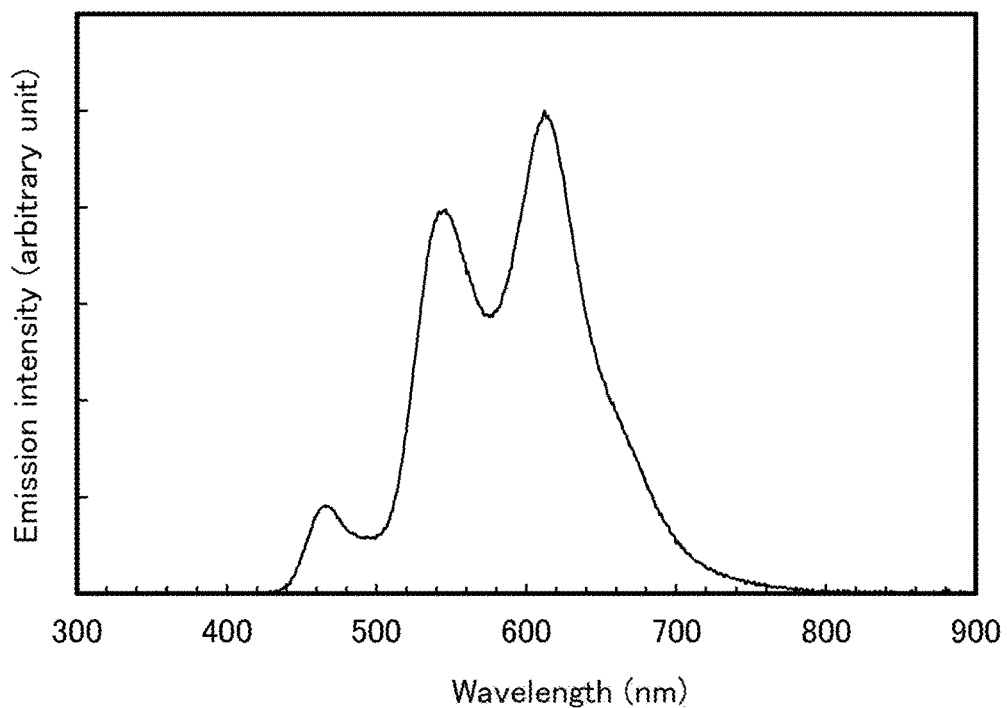
FIG. 22 shows the emission spectrum of Light-emitting element 5.
Figure 23:
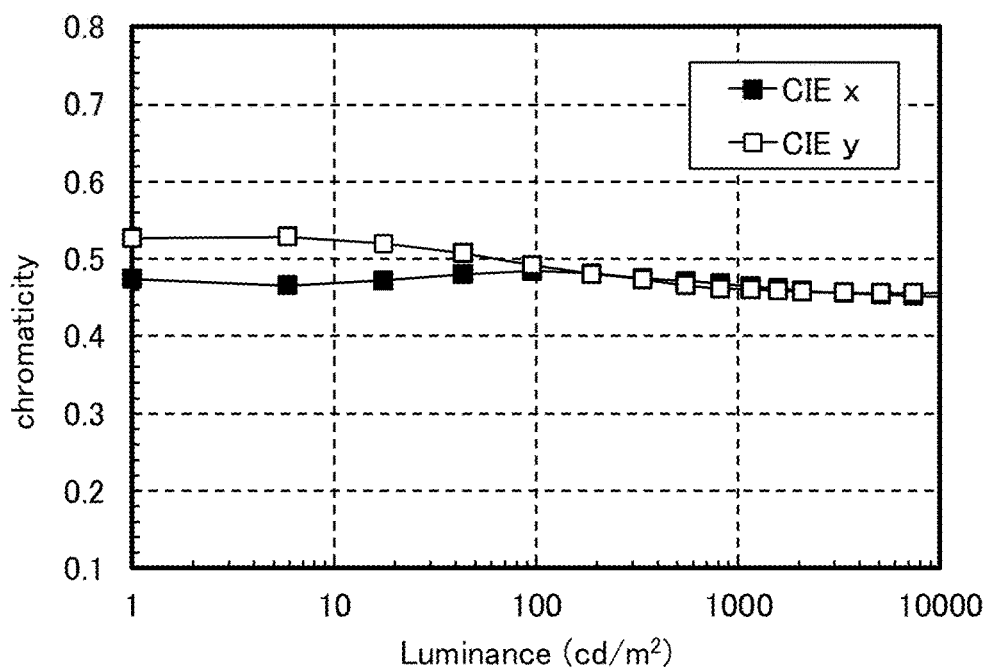
FIG. 23 shows the luminance-CIE chromaticity characteristics of Light-emitting element 5.

As for Light-emitting element 5, FIG. 18 shows the current density-luminance characteristics, FIG. 19 shows the luminance-current efficiency characteristics, FIG. 20 shows the voltage-luminance characteristics, FIG. 21 shows the luminance-external quantum efficiency characteristics, FIG. 22 shows the emission spectrum, and FIG. 23 shows the luminance-CIE chromaticity characteristics.

As can be seen from the characteristics, although Light-emitting element 5 did not include an intermediate layer, Light-emitting element 5 had a current efficiency of 40 cd/A or higher at around 1000 cd/m$^2$ and an external quantum efficiency of 18% or higher. This indicates that Light-emitting element 5 had high emission efficiency. The drive voltage is as low as in the 3-V range, which is much lower than the drive voltage of a tandem light-emitting element. Table 4 lists values of main characteristics of Light-emitting Element 5 at around 1000 cd/m$^2$.

tation energy was reduced by using the exciplex as an energy donor of the phosphorescent layer, and the emission efficiency was improved because of occurrence of delayed fluorescence due to triplet-triplet annihilation in the host material in the fluorescent layer. The use of the separation layer 113*b* suppresses energy transfer from the phosphorescent layer (the second light-emitting layer 113*c*) to the fluorescent layer (the first light-emitting layer 113*a*) at their interface; therefore, Light-emitting element 5 can have more favorable characteristics.

EXAMPLE 3

In this example, methods of fabricating Light-emitting elements 6 and 7 each of which is one embodiment of the

TABLE 4

| | Voltage (V) | Current density (mA/cm$^2$) | Current efficiency (cd/A) | Power efficiency (lm/W) | External quantum efficiency (%) | Energy efficiency (%) | Correlated color temperature (K) | duv |
|---|---|---|---|---|---|---|---|---|
| Light-emitting element 5 | 3.2 | 2.5 | 46 | 46 | 18 | 12 | 3010 | 0.017 |

Moreover, the emission spectrum in FIG. 22 shows that red light emission originating from [Ir(dmdppr-dmp)$_2$(acac)], green light emission originating from [Ir(tBuppm)$_2$(acac)], and blue light emission originating from 1,6mMem-FLPAPm were observed. This indicates that light emission was sufficiently obtained from both the first light-emitting layer 113*a* that was a fluorescent layer and the second light-emitting layer 113*c* that was a phosphorescent layer.

The luminance-CIE chromaticity characteristics shown in FIG. 23 indicate that Light-emitting element 5 has an extremely small color change in the practical luminance region. Note that the color change at around 100 cd/m$^2$ is due to a difference between light emission start voltages of phosphorescence and fluorescence. Since the phosphorescent layer has a lower light emission start voltage than the fluorescent layer, only phosphorescence is observed in a low luminance region, and fluorescence is also observed at around 100 cd/m$^2$. For this reason, the color change occurs at around 100 cd/m$^2$. In the practical luminance region where fluorescence and phosphorescence are both stable, color change is extremely small.

As described above, Light-emitting element 5 had highly well-balanced, favorable characteristics and was able to be fabricated easily and inexpensively. The above-described results were attributed to the following: diffusion of excitons was suppressed and non-radiative decay of the triplet excipresent invention and characteristics thereof are described. Structural formulae of organic compounds used for Light-emitting elements 6 and 7 are shown below.

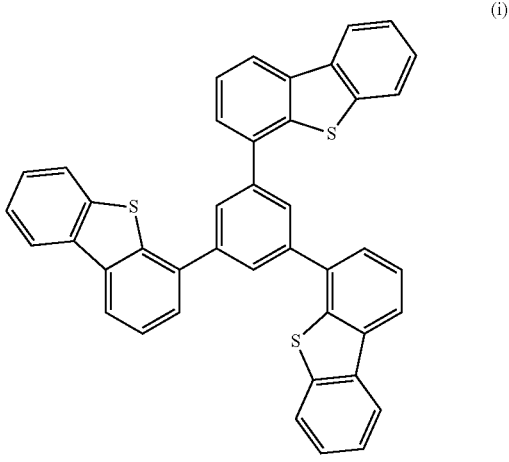

(i)

DBT3P-II

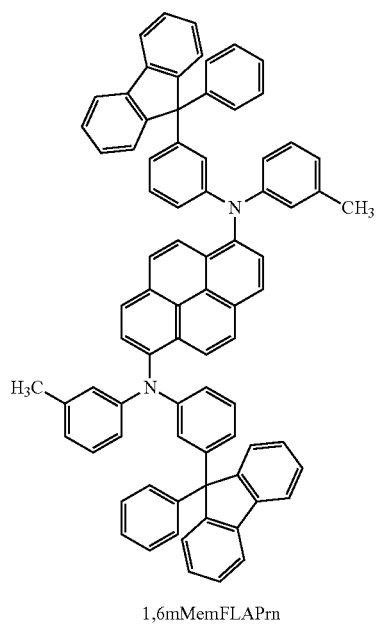
1,6mMemFLAPrn (iv)
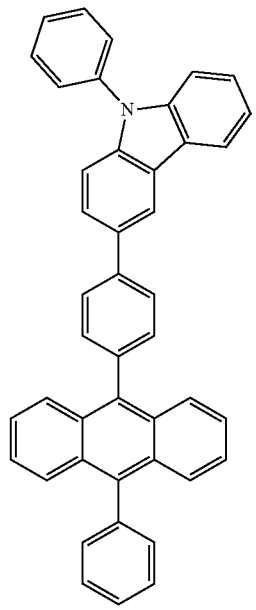
PCzPA (x)
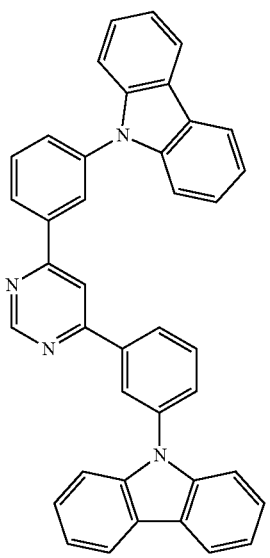
4,6mCzP2Pm (xi)
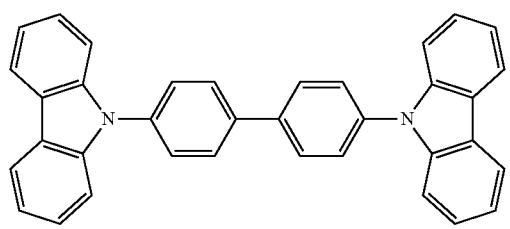
CBP (xii)
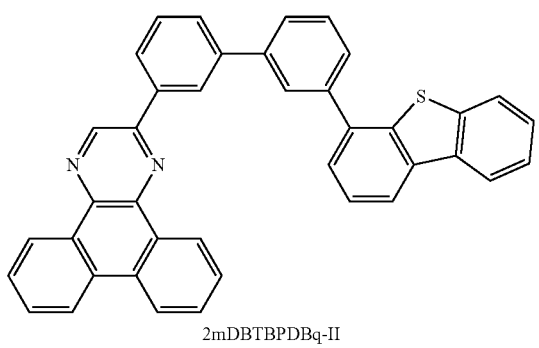
2mDBTBPDBq-II (v)

-continued

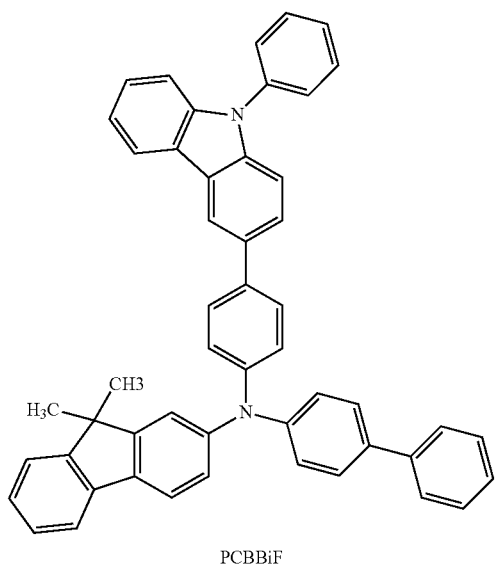

PCBBiF

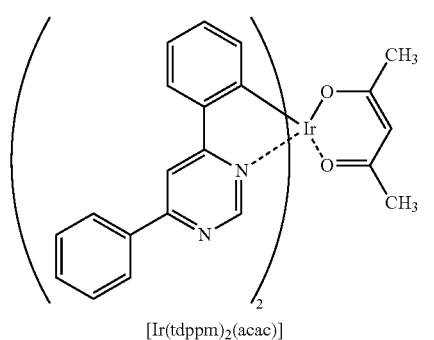

[Ir(tdppm)₂(acac)]

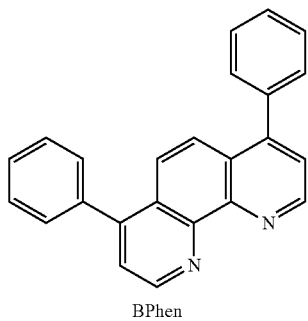

BPhen (Method of Fabricating Light-emitting Element 6)

A film of indium tin oxide containing silicon oxide (ITSO) was formed over a glass substrate by a sputtering method to form the first electrode 101. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 30 nm, and the weight ratio of DBT3P-II to molybdenum oxide was adjusted to 2:1 (=DBT3P-II:molybdenum oxide).

Next, on the hole-injection layer 111, 9-phenyl-3-[4-(10-phenyl-9-anthryl)phenyl]-9H-carbazole (abbreviation: PCzPA) represented by Structural Formula (x) was deposited to a thickness of 20 nm; thus, the hole-transport layer 112 was formed.

On the hole-transport layer 112, PCzPA and 1,6mMem-FLPAPm were deposited by co-evaporation to a thickness of 5 nm such that the weight ratio of PCzPA to 1,6mMemFL-PAPm was 1:0.05 (=PCzPA: 1,6mMemFLPAPm); thus, the first light-emitting layer 113a that was a fluorescent layer was formed. Next, 4,6-bis[3-(9H-carbazol-9-yl)phenyl]pyrimidine (abbreviation: 4,6mCzP2Pm) represented by Structural Formula (xi) and 4,4'-di(N-carbazolyl)biphenyl (abbreviation: CBP) represented by Structural Formula (xii) were deposited by co-evaporation to a thickness of 2 nm such that the weight ratio of 4,6mCzP2Pm to CBP was 0.4:0.6 (=4, 6mCzP2Pm:CBP); thus, the separation layer 113b was formed. Then, 2mDBTBPDBq-II, PCBBiF, and (acetylacetonato)bis(4,6-diphenylpyrimidinato)iridium(III) (abbreviation: [Ir(dppm)₂(acac)]) represented by Structural Formula (xiii) were deposited by co-evaporation to a thickness of 20 nm such that the weight ratio of 2mDBTBPDBq-II to PCBBiF and [Ir(dppm)₂(acac)] was 0.8:0.2:0.05 (=2mDBT-BPDBq-II:PCBBiF:[Ir(dppm)₂(acac)]); thus, the second light-emitting layer 113c that was a phosphorescent layer was formed.

Note that 2mDBTBPDBq-II and PCBBiF form an exciplex in the phosphorescent layer (the second light-emitting layer 113c). This emission wavelength overlaps absorption bands on the longest wavelength side of [Ir(dppm)₂(acac)], so that energy transfer efficiency is high.

The singlet excitation energy of PCzPA that is a host material in the fluorescent layer (the first light-emitting layer 113a) is higher than the singlet excitation energy of 1,6mMemFLPAPm that is a fluorescent substance. In addition, the triplet excitation energy of PCzPA is lower than the triplet excitation energy of 1,6mMemFLPAPm. Thus, in the fluorescent layer (the first light-emitting layer 113a), regeneration of a singlet exciton associated with triplet-triplet annihilation and light emission are obtained easily.

After that, on the phosphorescent layer (the second light-emitting layer 113c), 2mDBTBPDBq-II was deposited to a thickness of 10 nm, and BPhen was deposited to a thickness of 15 nm to form the electron-transport layer 114.

After the formation of the electron-transport layer 114, lithium fluoride (LiF) was deposited by evaporation to a thickness of 1 nm to form the electron-injection layer 115. Finally, aluminum was deposited by evaporation to a thickness of 200 nm to form the second electrode 102 functioning as a cathode. Through the above-described steps, Light-emitting element 6 of this example was fabricated.

Note that in all the above evaporation steps, evaporation was performed by a resistance-heating method.

(Method of Fabricating Light-emitting Element 7)

Light-emitting element 7 was fabricated in a manner similar to that of Light-emitting element 6 except that the separation layer 113*b* was formed with 4,6mCzP2Pm alone.

In a glove box under a nitrogen atmosphere, each of Light-emitting elements 6 and 7 was sealed with a glass substrate so as not to be exposed to the air (specifically, a sealant was applied onto an outer edge of the element, and at the time of sealing, UV treatment was performed and then heat treatment was performed at 80° C. for 1 hour). Then, the reliability of these light-emitting elements was measured. Note that the measurement was performed at room temperature (in the atmosphere kept at 25° C.).

Table 5 shows the element structures of Light-emitting elements 6 and 7.

Moreover, the emission spectrum shows that orange light emission originating from [Ir(dppm)$_2$(acac)] and blue light emission originating from 1,6mMemFLPAPrn were observed. This indicates that in Light-emitting elements 6 and 7, light emission was sufficiently obtained from both the first light-emitting layer 113*a* that was a fluorescent layer and the second light-emitting layer 113*c* that was a phosphorescent layer.

As described above, Light-emitting elements 6 and 7 have highly well-balanced favorable characteristics and can be fabricated easily and inexpensively. The above-described results were attributed to the following: diffusion of excitons was suppressed and non-radiative decay of the triplet excitation energy was reduced by using the exciplex as an energy donor of the phosphorescent layer, and the emission efficiency was improved because of occurrence of delayed fluorescence due to triplet-triplet annihilation in the host material of the fluorescent layer. In addition, the use of the separation layer 113*b* suppresses energy transfer from the phosphorescent layer (the second light-emitting layer 113*c*) to the fluorescent layer (the first light-emitting layer 113*a*) at their interface, which is also a reason of the favorable characteristics. Light-emitting element 6 has better characteristics than Light-emitting element 7; therefore, the separation layer 113*b* is preferably formed with a substance having a hole-transport property and a substance having an electron-transport property. Moreover, it is more preferable that these substances form an exciplex.

TABLE 5

| Hole-injection layer | Hole-transport layer | First light-emitting layer | Separation layer | Second light-emitting layer | Electron-transport layer | | Electron-injection layer |
|---|---|---|---|---|---|---|---|
| DBT3P-II: MoOx | PCzPA | PCzPA: 1,6mMem FLPAPrn | * | 2mDBT BPDBq-II:PCBBiF: Ir(dppm)$_2$(acac) | 2mDBT BPDBq-II | BPhen | LiF |
| 2:1 | | 1:0.05 | | 0.8:0.2:0.05 | | | |
| 30 nm | 20 nm | 10 nm | 2 nm | 20 nm | 10 nm | 15 nm | 1 nm |

Figure 24:
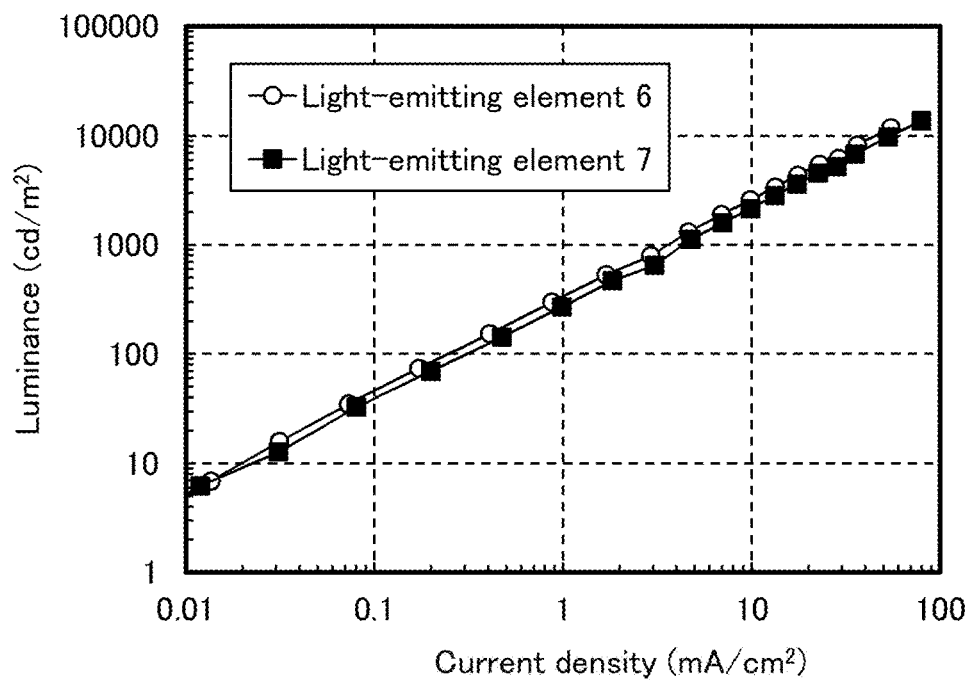
FIG. 24 shows the current density-luminance characteristics of Light-emitting elements 6 and 7.
Figure 25:
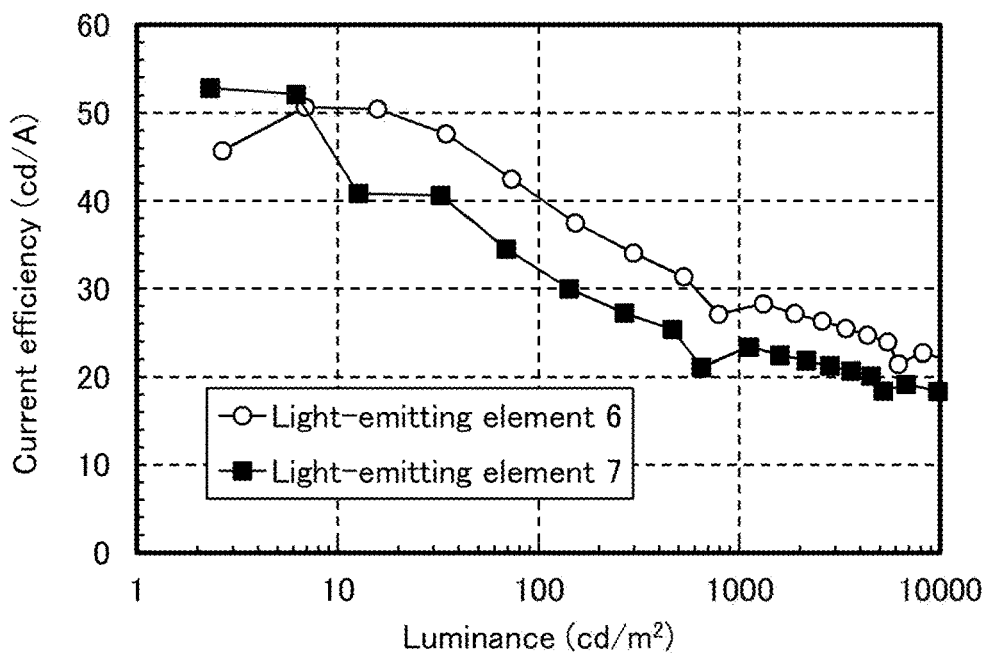
FIG. 25 shows the luminance-current efficiency characteristics of Light-emitting elements 6 and 7.
Figure 26:
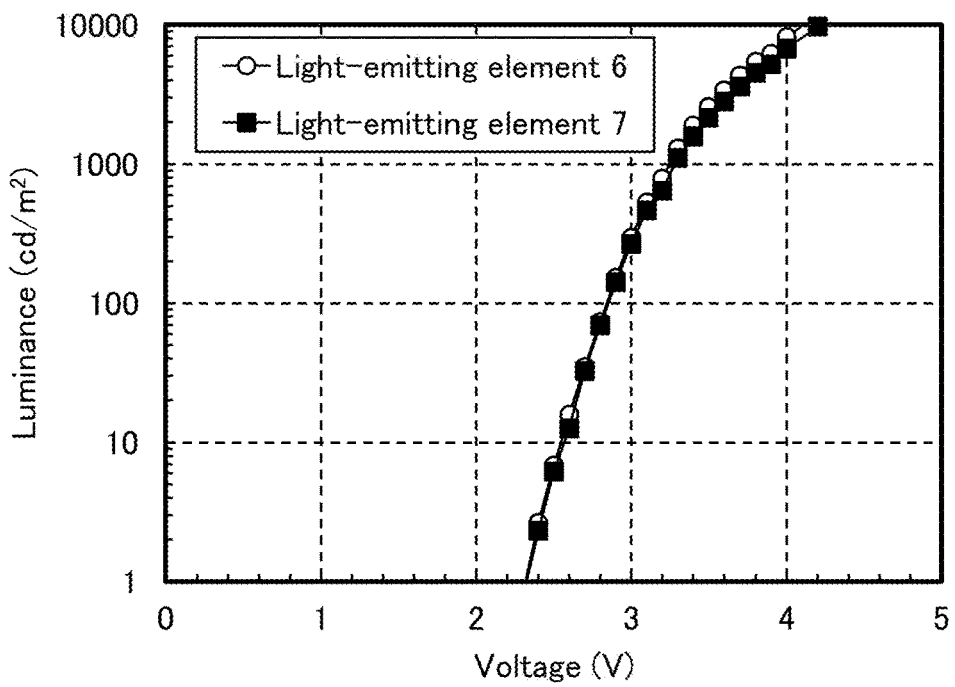
FIG. 26 shows the voltage-luminance characteristics of Light-emitting elements 6 and 7.
Figure 27:
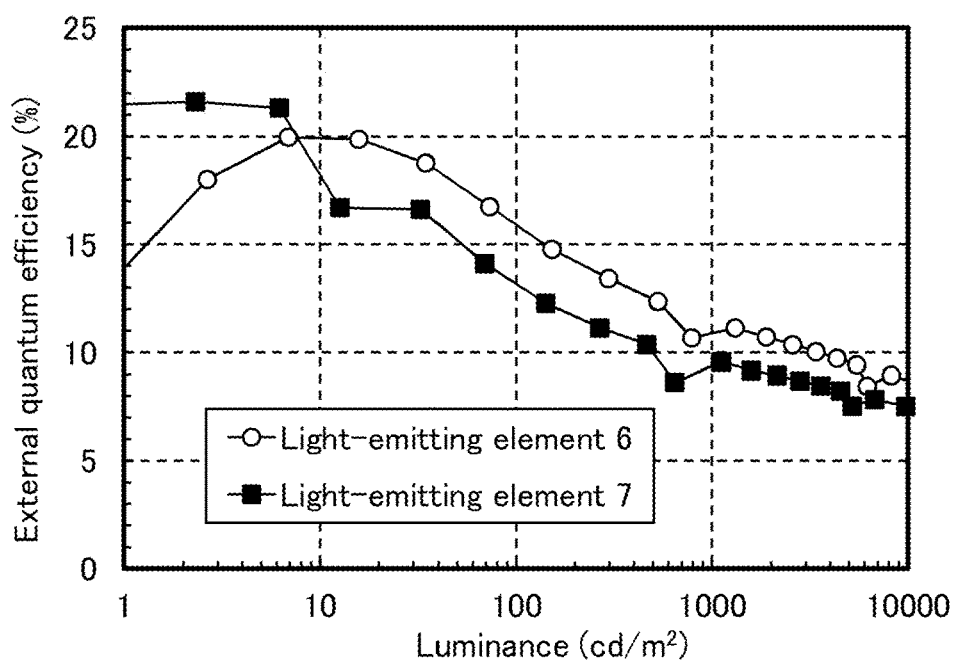
FIG. 27 shows the luminance-external quantum efficiency characteristics of Light-emitting elements 6 and 7.
Figure 28:
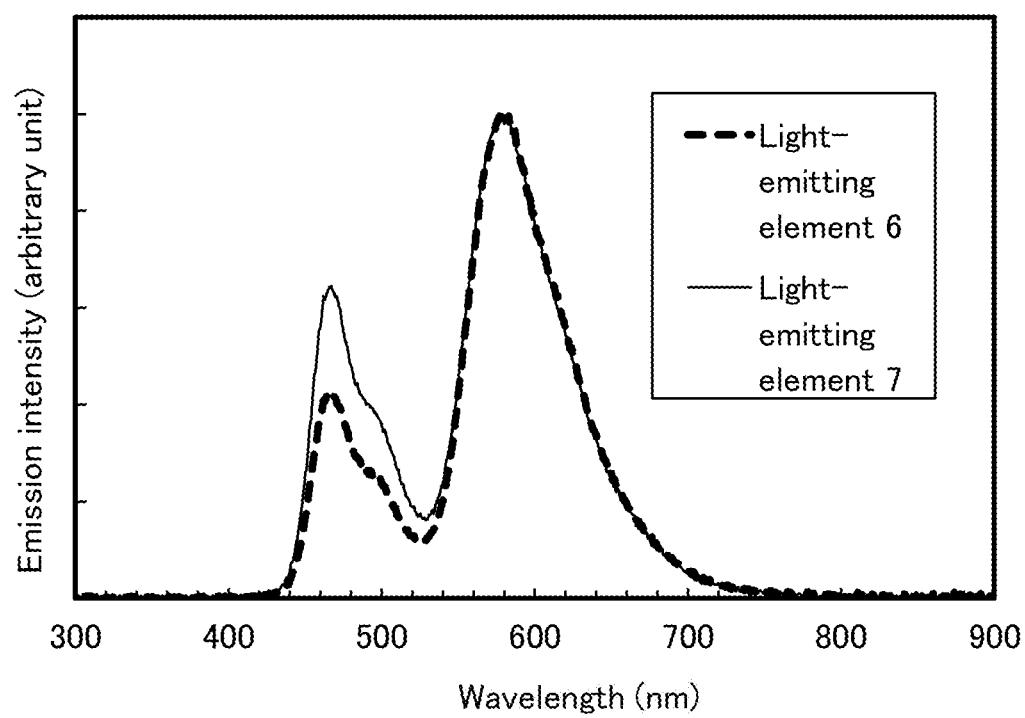
FIG. 28 shows the emission spectra of Light-emitting elements 6 and 7.

* Light-emitting element 6 4,6mCzP2Pm:CBP = 0.4:0.6
Light-emitting element 7 4,6mCzP2Pm FIG. 24 shows current density-luminance characteristics of Light-emitting elements 6 and 7. FIG. 25 shows luminance-current efficiency characteristics Light-emitting elements 6 and 7. FIG. 26 shows voltage-luminance characteristics of Light-emitting elements 6 and 7. FIG. 27 shows luminance-external quantum efficiency characteristics of Light-emitting elements 6 and 7. FIG. 28 shows emission spectra of Light-emitting elements 6 and 7.

The above results show that Light-emitting element 6 and Light-emitting element 7 each have favorable emission efficiency of a current efficiency of 20 cd/A or higher at around 1000 cd/m$^2$. In addition, the drive voltage is in the 3-V range, which is much lower than that of a tandem light-emitting element. Table 6 lists values of main characteristics of Light-emitting Elements 6 and 7 at around 1000 cd/m$^2$.

EXAMPLE 4

In this example, a method of fabricating Light-emitting element 8 which is one embodiment of the present invention and characteristics thereof are described. In Light-emitting element 8, the first light-emitting layer 113*a* was formed on the cathode side and the second light-emitting layer 113*c* was formed on the anode side. Structural formulae of organic compounds used for Light-emitting element 8 are shown below.

TABLE 6

| | Voltage (V) | Current density (mA/cm$^2$) | Current efficiency (cd/A) | Power efficiency (lm/W) | External quantum efficiency (%) | Energy efficiency (%) | Correlated color temperature (K) | duv |
|---|---|---|---|---|---|---|---|---|
| Light-emitting element 6 | 3.1 | 1.7 | 31 | 32 | 12 | 9 | 2710 | 0.003 |
| Light-emitting element 7 | 3.3 | 4.8 | 23 | 22 | 10 | 6 | 3540 | 0.009 |

(i)
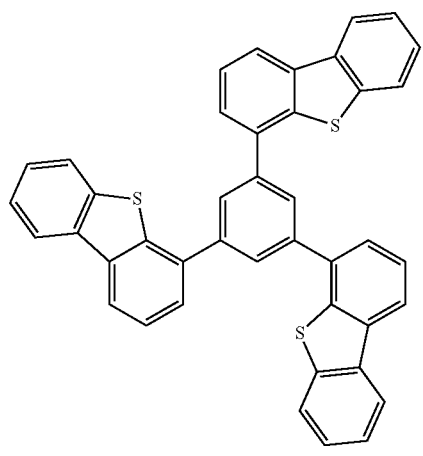
DBT3P-II
(vi)
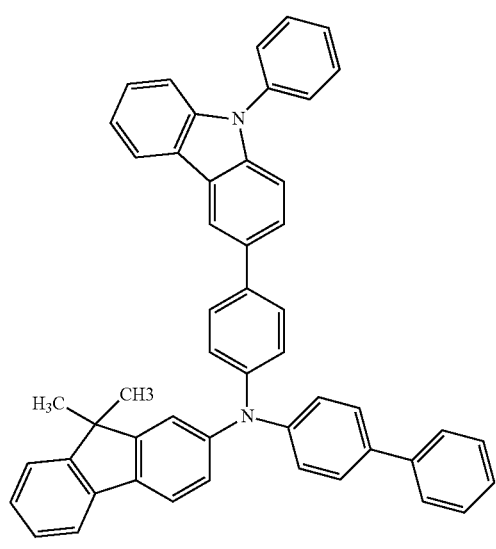
PCBBiF
(v)
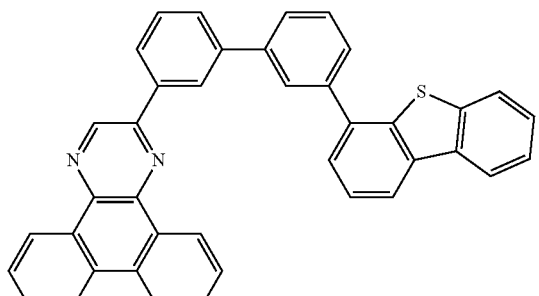
2mDBTBPDBq-II
-continued
(vii)
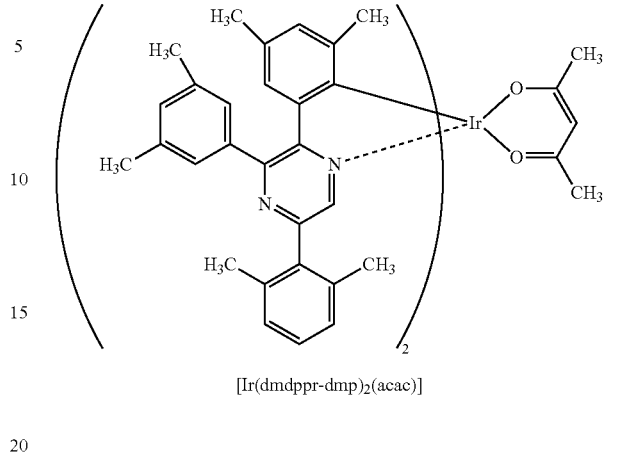
[Ir(dmdppr-dmp)$_2$(acac)]
(viii)
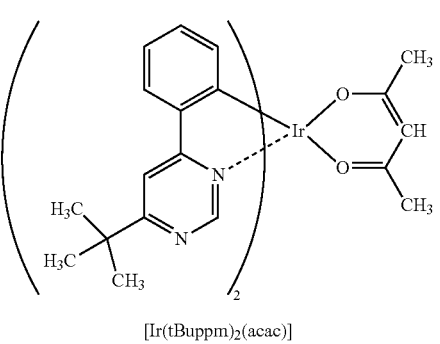
[Ir(tBuppm)$_2$(acac)]
(iii)
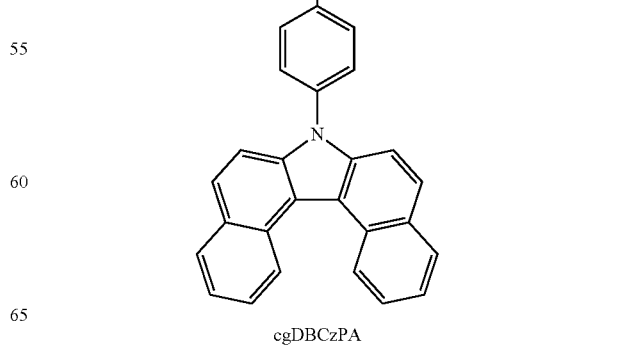
cgDBCzPA -continued

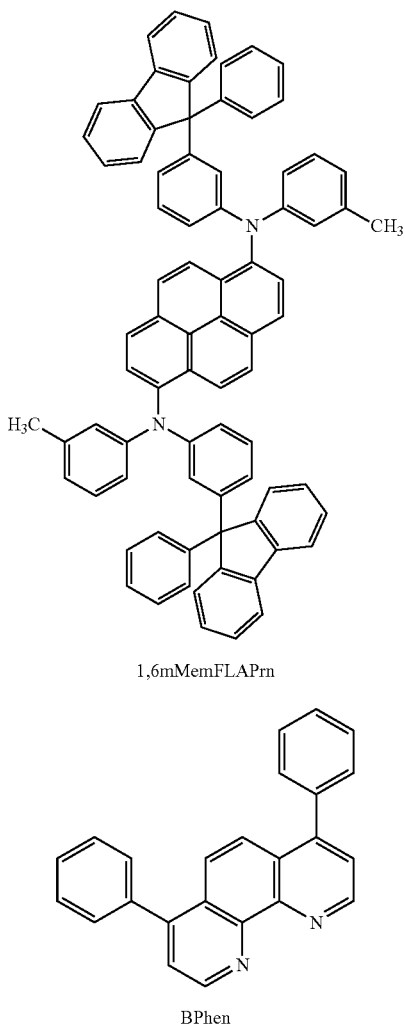

1,6mMemFLAPrn (iv)

(ix)

BPhen (Method of Fabricating Light-emitting Element 8)

A film of indium tin oxide (ITO) was deposited over a glass substrate with a high refractive index (n=1.84) to a thickness of 110 nm by a sputtering method to form the first electrode 101. The electrode area was 2 mm×2 mm.

Next, in pretreatment for forming the light-emitting element over the substrate, a surface of the substrate was washed with water and then UV ozone treatment was performed for 370 seconds.

After that, the substrate was transferred into a vacuum evaporation apparatus where the pressure had been reduced to approximately $10^{-4}$ Pa, and was subjected to vacuum baking at 190° C. for 60 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 30 nm, and the weight ratio of DBT3P-II to molybdenum oxide was adjusted to 1:0.5 (=DBT3P-II: molybdenum oxide).

Next, on the hole-injection layer 111, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (vi) was deposited to a thickness of 20 nm; thus, the hole-transport layer 112 was formed.

Then, on the hole-transport layer 112, the first phosphorescent layer 113c-1 was formed in such a manner that 2-[3'-(dibenzothiophen-4-yl)biphenyl-3-yl]dibenzo[f,h]quinoxaline (abbreviation: 2mDBTBPDBq-II) represented by Structural Formula (v), N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (vi), and bis{4,6-dimethyl-2-[5-(2,6-dimethylphenyl)-3-(3,5-dimethylphenyl)-2-pyrazinyl-κN]phenyl-κC}(2,4-pentanedionato-κ²O,O')iridium(III) (abbreviation: [Ir(dmdppr-dmp)$_2$(acac)]) represented by Structural Formula (vii) were deposited by co-evaporation to a thickness of 15 nm such that the weight ratio of 2mDBTBPDBq-II to PCBBiF and [Ir(dmdppr-dmp)$_2$(acac)] was 0.1:0.9:0.06 (=2mDBTBPDBq-II:PCBBiF: [Ir(dmdppr-dmp)$_2$(acac)]); the second phosphorescent layer 113c-2 was successively formed in such a manner that 2mDBTBPDBq-II, PCBBiF, and bis[2-(6-tert-butyl-4-pyrimidinyl-κN3)phenyl-κC](2,4-pentanedionato-κ²O,O')iridium(III) (abbreviation: [Ir(tBuppm)$_2$(acac)]) represented by Structural Formula (viii) were deposited by co-evaporation to a thickness of 5 nm such that the weight ratio of 2mDBTBPDBq-II to PCBBiF and [Ir(tBuppm)$_2$(acac)] was 0.5:0.5:0.06 (=2mDBTBPDBq-II:PCBBiF:[Ir(tBuppm)$_2$(acac)]). Through the above steps, the second light-emitting layer 113c that was a phosphorescent layer was formed. After that, 2mDBTBPDBq-II and PCBBiF were deposited by co-evaporation to a thickness of 2 nm such that the weight ratio of 2mDBTBPDBq-II to PCBBiF was 0.5:0.5 (=2mDBTBPDBq-II:PCBBiF); thus, the separation layer 113b was formed. Then, 7-[4-(10-phenyl-9-anthryl)phenyl]-7H-dibenzo[c,g]carbazole (abbreviation: cgDBCzPA) represented by Structural Formula (iii) and N,N'-bis(3-methylphenyl)-N,N'-bis[3-(9-phenyl-9H-fluoren-9-yl)phenyl]pyrene-1,6-diamine (abbreviation: 1,6mMemFLPAPm) represented by Structural Formula (iv) were deposited by co-evaporation to a thickness of 20 nm such that the weight ratio of cgDBCzPA to 1,6mMemFLPAPm was 1:0.025 (=cgDBCzPA:1,6mMemFLPAPm); thus, the first light-emitting layer 113a that was a fluorescent layer was formed. Through the above-described steps, the light-emitting layer 113 was formed.

Note that 2mDBTBPDBq-II and PCBBiF form an exciplex in the phosphorescent layer (the second light-emitting layer 113c) and the separation layer 113b. This emission wavelength overlaps absorption bands on the longest wavelength sides of [Ir(dmdppr-dmp)$_2$(acac)] and [Ir(tBuppm)$_2$(acac)], so that energy transfer efficiency is high.

The singlet excitation energy of cgDBCzPA that is a host material in the fluorescent layer (the first light-emitting layer 113a) is higher than the singlet excitation energy of 1,6mMemFLPAPrn that is a fluorescent substance. In addition, the triplet excitation energy of cgDBCzPA is lower than the triplet excitation energy of 1,6mMemFLPAPm. Thus, in the fluorescent layer (the first light-emitting layer 113a), regeneration of a singlet exciton associated with triplet-triplet annihilation and light emission are obtained easily.

After that, on the phosphorescent layer (the first light-emitting layer 113a), cgDBCzPA was deposited to a thickness of 10 nm, and bathophenanthroline (abbreviation: BPhen) represented by Structural Formula (ix) was deposited to a thickness of 15 nm to form the electron-transport layer 114.

After the formation of the electron-transport layer 114, lithium fluoride (LiF) was deposited by evaporation to a thickness of 1 nm to form the electron-injection layer 115. Finally, an alloy of silver and magnesium (1:0.5) was deposited to a thickness of 1 nm and silver was deposited to a thickness of 150 nm by evaporation to form the second electrode 102 functioning as a cathode. Through the above-described steps, Light-emitting element 8 of this example was fabricated. Note that in all the above evaporation steps, evaporation was performed by a resistance-heating method.

Table 7 shows the element structure of Light-emitting element 8.

TABLE 7

| Hole-injection layer | Hole-transport layer | Second light-emitting layer | Separation layer | First light-emitting layer | Electron-transport layer | | Electron-injection layer |
|---|---|---|---|---|---|---|---|
| DBT3P-II: MoOx 1:0.5 | PCBBiF | * | ** | *** | cgDBCzPA: 1,6mMem FLPAPrn 1:0.03 | cgDBCzPA | BPhen | LiF |
| 30 nm | 20 nm | 15 nm | 5 nm | 2 nm | 5 nm | 10 nm | 15 nm | 1 nm |

* 2mDBTBPDBq-II:PCBBiF:Ir(dmdppr-dmp)₂(acac) = 0.1:0.9:0.06
** 2mDBTBPDBq-II:PCBBiF:Ir(tBuppm)₂(acac) = 0.5:0.5:0.06
*** 2mDBTBPDBq-II:PCBBiF = 0.5:0.5

In a glove box under a nitrogen atmosphere, Light-emitting element 8 was sealed with a glass substrate so as not to be exposed to the air (specifically, a sealant was applied onto an outer edge of the element, and at the time of sealing, UV treatment was performed and then heat treatment was performed at 80° C. for 1 hour). Then, the characteristics of the light-emitting element were measured. Note that the measurement was performed with an integrating sphere at room temperature (in the atmosphere kept at 25° C.). Table 8 shows values of the characteristics at a current density of 3.75 mA/cm².

TABLE 8

| | Voltage (V) | Correlated color temperature (K) | duv | General color rendering index Ra | Power efficiency (lm/W) | External quantum efficiency (%) |
|---|---|---|---|---|---|---|
| Light-emitting element 8 | 2.8 | 2840 | 0.0149 | 87 | 57 | 21 |

Light-emitting element 8 exhibited favorable external quantum efficiency and power efficiency. Light-emitting element 8 had a very low drive voltage of 2.8 V as compared with a tandem light-emitting element.

Figure 29:
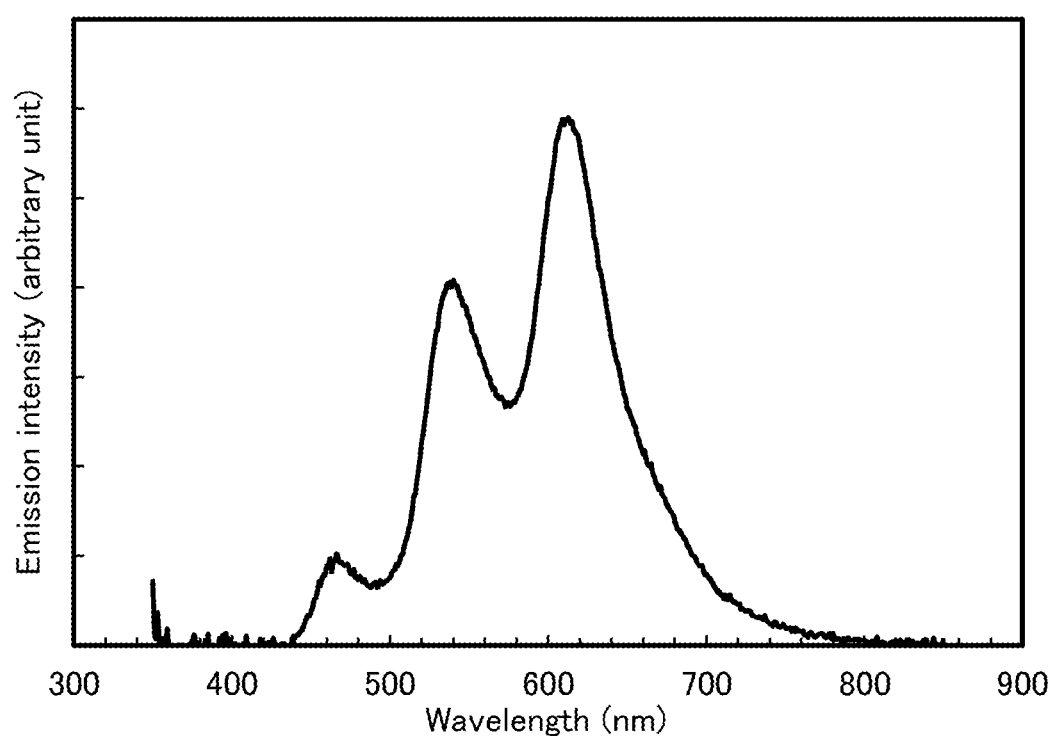
FIG. 29 shows the emission spectrum of Light-emitting element 8.

FIG. 29 shows the emission spectrum of Light-emitting element 8. As can be seen from the emission spectrum, red light emission originating from [Ir(dmdppr-dmp)₂(acac)], green light emission originating from [Ir(tBuppm)₂(acac)], and blue light emission originating from 1,6mMemFLPAPm were observed. This indicates that light emission was sufficiently obtained from both the first light-emitting layer 113a that was a fluorescent layer and the second light-emitting layer 113c that was a phosphorescent layer.

Light-emitting element 8 had a general color rendering index (Ra) of 87, which means that Light-emitting element 8 had a favorable color rendering property, and had small duv (a deviation from blackbody radiation locus); thus, Light-emitting element 8 is suitably used for lighting. Furthermore, Light-emitting element 8 had a color temperature of 2840 K that is incandescent color.

As described above, Light-emitting element 8 had well-balanced, favorable characteristics and was able to be fabricated easily and inexpensively. The above-described results were attributed to the following: diffusion of excitons was suppressed and non-radiative decay of the triplet excitation energy was reduced by using the exciplex as an energy donor of the phosphorescent layer, and the emission efficiency was improved because of occurrence of delayed fluorescence due to triplet-triplet annihilation in the host material in the fluorescent layer.

EXAMPLE 5

In this example, a method of fabricating Light-emitting element 9 which is one embodiment of the present invention and characteristics thereof are described. Structural formulae of organic compounds used for Light-emitting element 9 are shown below.

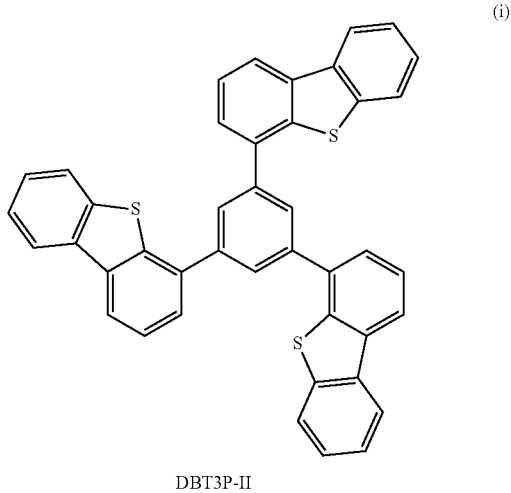

DBT3P-II (i)

(ii)
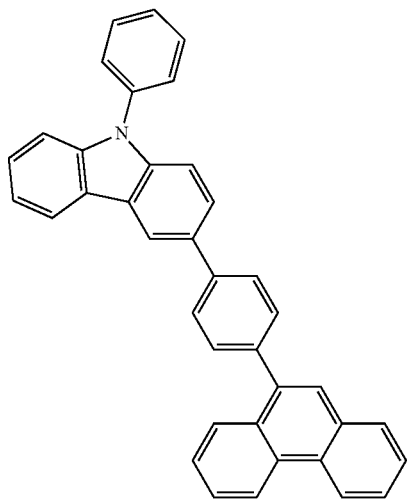
PCPPn
(iii)
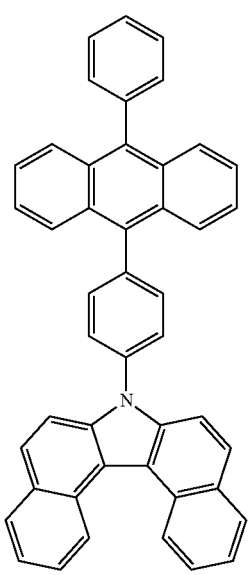
cgDBCzPA
(iv)
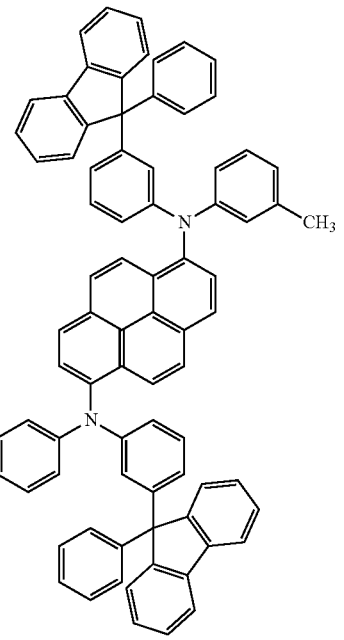
1,6mMemFLAPrn
(v)
2mDBTBPDBq-II
(vi)
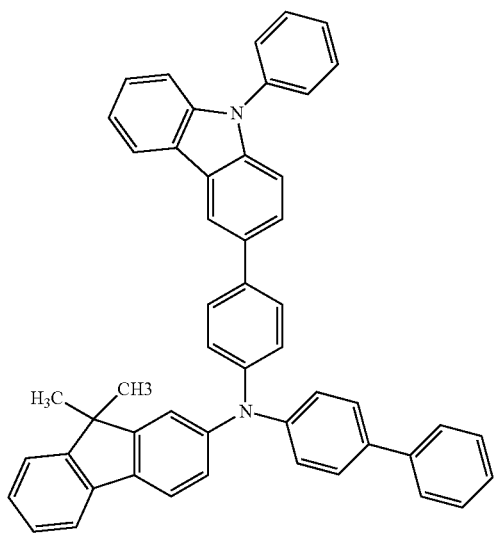
PCBBiF -continued

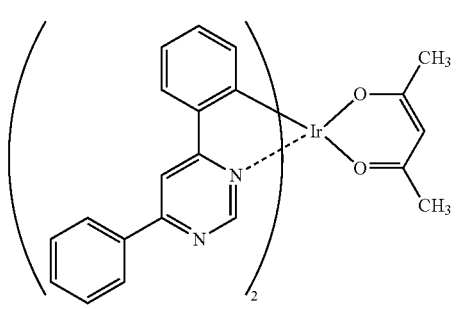

Ir(dppm)₂(acac) (xiv)

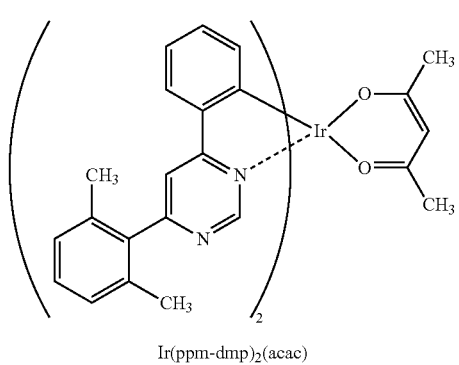

Ir(ppm-dmp)₂(acac) (xv)

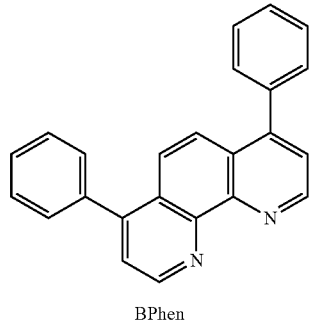

BPhen (ix)

(Method of Fabricating Light-emitting Element 9)

A film of indium tin oxide containing silicon oxide (ITSO) was formed over a glass substrate by a sputtering method to form the first electrode 101. The thickness was 110 nm and the electrode area was 2 mm×2 mm. Here, the first electrode 101 functions as an anode of the light-emitting element.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate provided with the first electrode 101 was fixed to a substrate holder provided in the vacuum evaporation apparatus so that the surface on which the first electrode 101 was formed faced downward. The pressure in the vacuum evaporation apparatus was reduced to about $10^{-4}$ Pa. After that, on the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating to form the hole-injection layer 111. The thickness was set to 15 nm, and the weight ratio of DBT3P-II to molybdenum oxide was adjusted to 2:1 (=DBT3P-II: molybdenum oxide).

Next, on the hole-injection layer 111, 3-[4-(9-phenanthryl)-phenyl]-9-phenyl-9H-carbazole (abbreviation: PCPPn) represented by Structural Formula (ii) was deposited to a thickness of 20 nm; thus, the hole-transport layer 112 was formed.

Then, on the hole-transport layer 112, 7-[4-(10-phenyl-9-anthryl)phenyl]-7H-dibenzo[c,g]carbazole (abbreviation: cgDBCzPA) represented by Structural Formula (iii) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by Structural Formula (iv) were deposited by co-evaporation to a thickness of 5 nm such that the weight ratio of cgDBCzPA to 1,6mMemFLPAPm was 2:0.1 (=cgDBCzPA:1,6mMemFLPAPm); thus, the first light-emitting layer 113a that was a fluorescent layer was formed. Next, 2-[3'-(dibenzothiophen-4-yl)biphenyl-3-yl]dibenzo[f,h]quinoxaline (abbreviation: 2mDBTBPDBq-II) represented by Structural Formula (v) and N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (vi) were deposited by co-evaporation to a thickness of 2 nm such that the weight ratio of 2mDBTBPDBq-II to PCBBiF was 0.4:1.6 (=2mDBTBPDBq-II:PCBBiF); thus, the separation layer 113b was formed. After that, the first phosphorescent layer 113c-1 was formed in such a manner that 2mDBTBPDBq-II, PCBBiF, and (acetylacetonato)bis(4,6-diphenylpyrimidinato)iridium (III) (abbreviation: [Ir(dppm)₂(acac)]) represented by Structural Formula (xiv) were deposited by co-evaporation to a thickness of 5 nm such that the weight ratio of 2mDBTBPDBq-II to PCBBiF and [Ir(dppm)₂(acac)] was 0.8:1.2:0.12 (=2mDBTBPDBq-II:PCBBiF: [Ir(dppm)₂(acac)]); the second phosphorescent layer 113c-2 was successively formed in such a manner that 2mDBTBPDBq-II, PCBBiF, and bis{2-[6-(2,6-dimethylphenyl)-4-pyrimidinyl-κN3]phenyl-κC}(2,4-pentanedionato-κO,O')iridium(III) (abbreviation: [Ir(ppm-dmp)₂(acac)]) represented by Structural Formula (xv) were deposited by co-evaporation to a thickness of 15 nm such that the weight ratio of 2mDBTBPDBq-II to PCBBiF and [Ir(ppm-dmp)₂(acac)] was 1.6:0.4:0.12 (=2mDBTBPDBq-II:PCBBiF:[Ir(ppm-dmp)₂(acac)]).

Through the above steps, the second light-emitting layer 113c that was a phosphorescent layer was formed. As described above, the light-emitting layer 113 in Light-emitting element 9 was formed of the first light-emitting layer 113a and the second light-emitting layer 113c.

Note that 2mDBTBPDBq-II and PCBBiF form an exciplex in the phosphorescent layer (the second light-emitting layer 113c). This emission wavelength overlaps absorption bands on the longest wavelength sides of [Ir(dppm)₂(acac)] and [Ir(ppm-dmp)₂(acac)], so that energy transfer efficiency is high.

The singlet excitation energy of cgDBCzPA that is a host material in the fluorescent layer (the first light-emitting layer 113a) is higher than the singlet excitation energy of 1,6mMemFLPAPrn that is a fluorescent substance. In addition, the triplet excitation energy of cgDBCzPA is lower than the triplet excitation energy of 1,6mMemFLPAPm. Thus, in the fluorescent layer (the first light-emitting layer 113a), regeneration of a singlet exciton associated with triplet-triplet annihilation and light emission are obtained easily.

After that, on the phosphorescent layer (the second light-emitting layer 113c), 2mDBTBPDBq-II was deposited to a thickness of 10 nm, and bathophenanthroline (abbreviation:

BPhen) represented by Structural Formula (ix) was deposited to a thickness of 15 nm to form the electron-transport layer 114.

After the formation of the electron-transport layer 114, lithium fluoride (LiF) was deposited by evaporation to a thickness of 1 nm; thus, the electron-injection layer 115 was formed. Finally, silver (Ag) and magnesium (Mg) were deposited by co-evaporation to a thickness of 1 nm such that the ratio of silver to magnesium was 1:0.5; thus, the second electrode 102 functioning as a cathode was formed. Then, silver was deposited to a thickness of 150 nm by a sputtering method. Through the above steps, Light-emitting element 9 of this example was fabricated.

Note that in all the above evaporation steps, evaporation was performed by a resistance-heating method.

In a glove box under a nitrogen atmosphere, Light-emitting element 9 was sealed with a glass substrate so as not to be exposed to the air (specifically, a sealant was applied onto an outer edge of the element, and at the time of sealing, UV treatment was performed and then heat treatment was performed at 80° C. for 1 hour). Then, the reliability of the light-emitting element was measured. Note that the measurement was performed at room temperature (in the atmosphere kept at 25° C.).

Table 9 shows the element structure of Light-emitting element 9.

$_2$(acac)] and fluorescence originating from 1,6mMemFLPA-Prn were both observed. This indicates that light emission was sufficiently obtained from both the first light-emitting layer 113a that was the fluorescent layer and the second light-emitting layer 113c that was the phosphorescent layer.

As described above, Light-emitting element 9 exhibits white light emission with extremely high emission efficiency and was able to be fabricated easily and inexpensively. The results were attributed to the following: diffusion of excitons was suppressed and non-radiative decay of the triplet excitation energy was reduced by using the exciplex as an energy donor of the phosphorescent layer, and the emission efficiency was improved because of occurrence of delayed fluorescence due to triplet-triplet annihilation in the host material of the fluorescent layer. The use of the separation layer 113b suppresses energy transfer from the phosphorescent layer (the second light-emitting layer 113c) to the fluorescent layer (the first light-emitting layer 113a) at their interface; therefore, Light-emitting element 9 can have more favorable characteristics.

An organic EL lighting device was manufactured in the following manner: an element with a structure which is similar to the structure of Light-emitting element 9 and which includes a 70-nm-thick first electrode was formed over a glass substrate with a refractive index of 1.84 such

TABLE 9

| Hole-injection layer | Hole-transport layer | First light-emitting layer | Separation layer | Second light-emitting layer | | | Election-transport layer | | Election-injection layer |
|---|---|---|---|---|---|---|---|---|---|
| DBT3P-II:MoOx 2:1 | PCPPn | cgDBCzPA:1,6mMemFLPAPrn 2:0.1 | * | ** | | *** | 2mDBTBPDBq-II | BPhen | LiF |
| 15 nm | 20 nm | 5 nm | 2 nm | 5 nm | | 15 nm | 10 nm | 15 nm | 1 nm |

* 2mDBTBPDBq-II:PCBBiF = 0.4:1.6
** 2mDBTBPDBq-II:PCBBiF:Ir(dppm)$_2$(acac) = 0.8:1.2:0.12
*** 2mDBTBPDBq-II:PCBBiF:Ir(ppm-dmp)$_2$(acac) = 1.6:0.4:0.12

Figure 30:
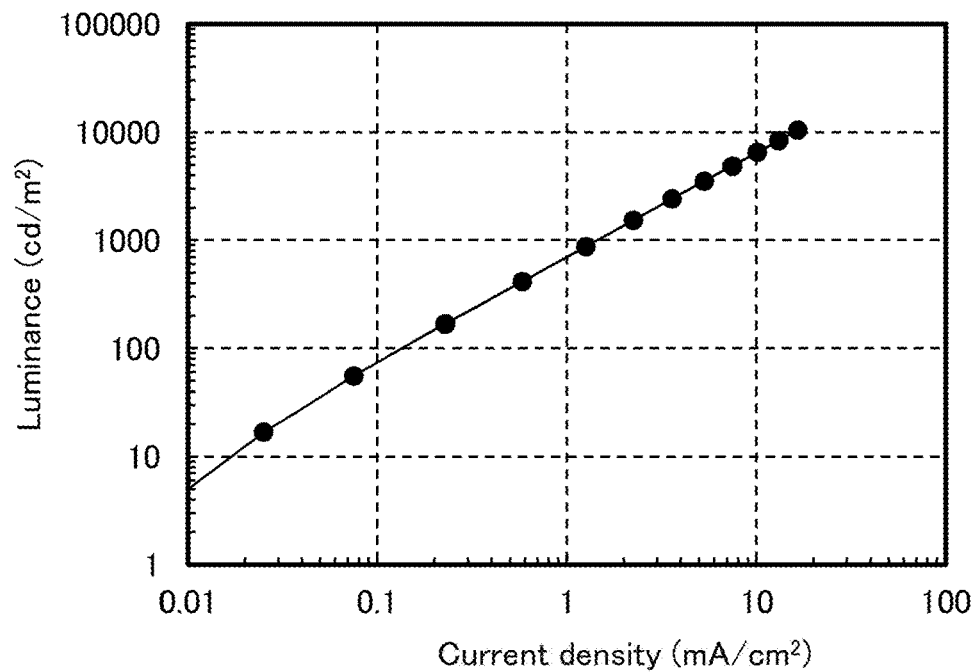
FIG. 30 shows the current density-luminance characteristics of Light-emitting element 9.
Figure 31:
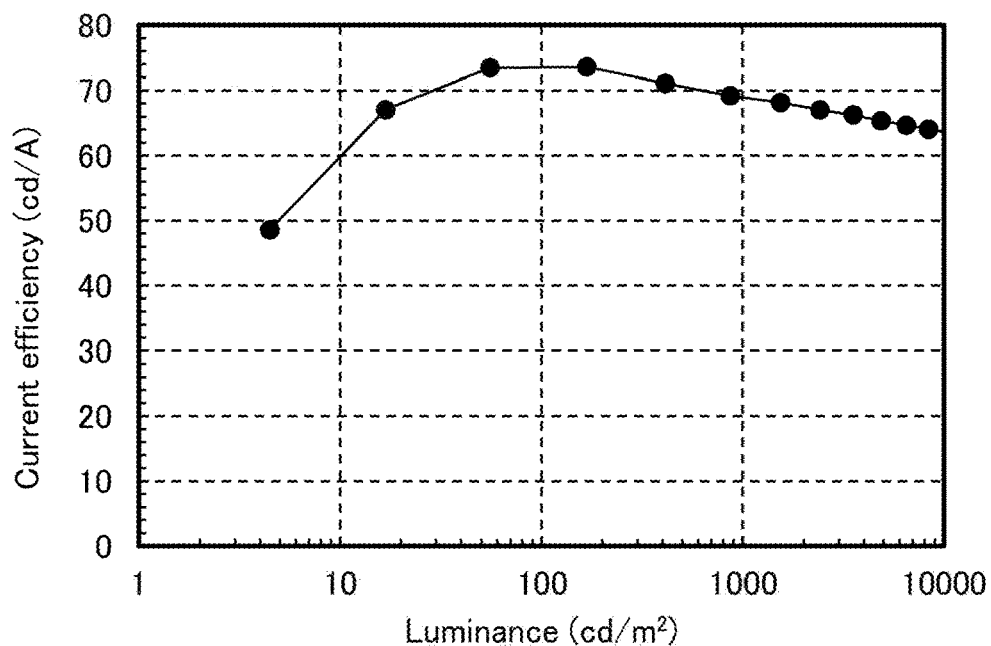
FIG. 31 shows the luminance-current efficiency characteristics of Light-emitting element 9.
Figure 32:
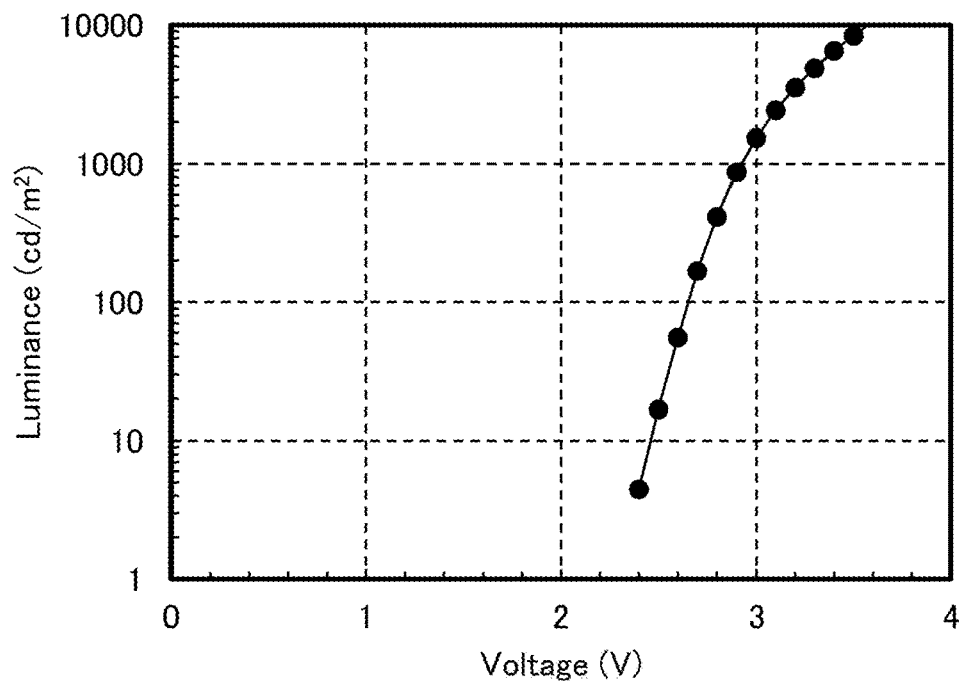
FIG. 32 shows the voltage-luminance characteristics of Light-emitting element 9.
Figure 33:
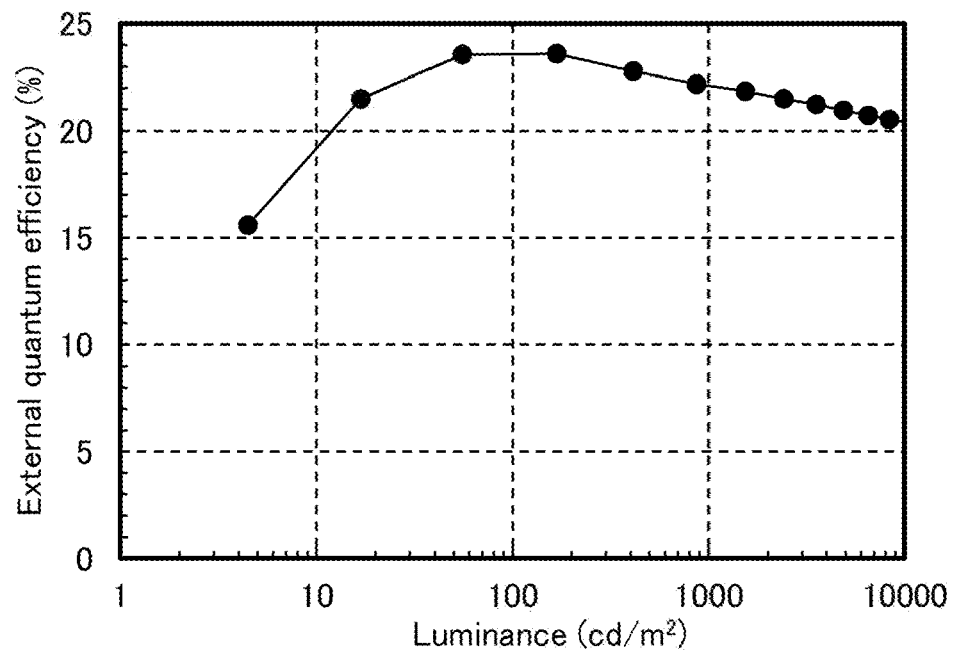
FIG. 33 shows the luminance-external quantum efficiency characteristics of Light-emitting element 9.
Figure 34:
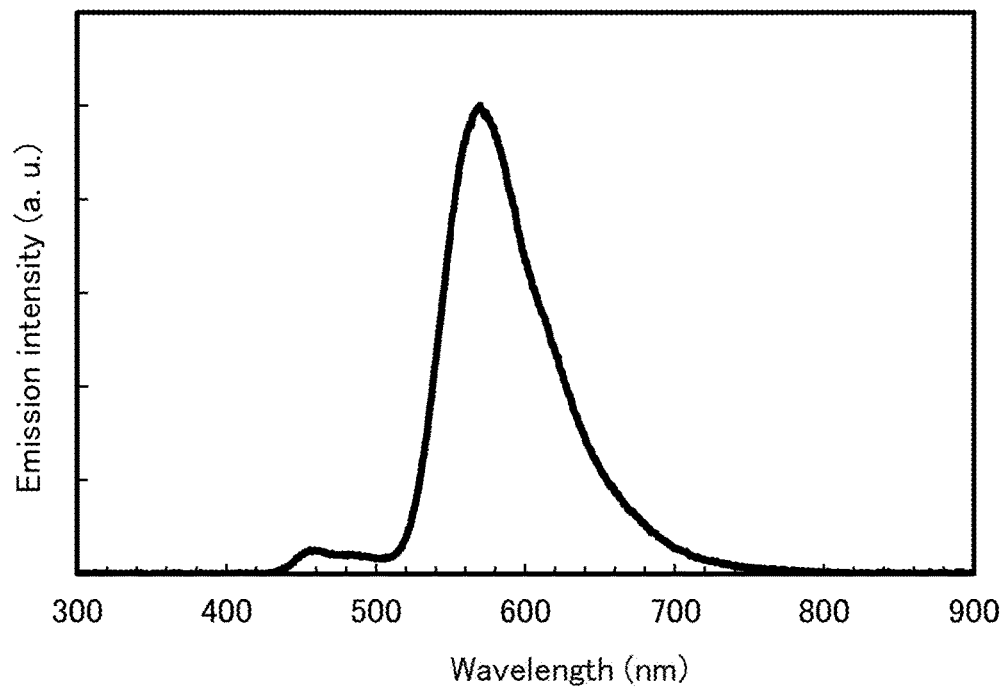
FIG. 34 shows the emission spectrum of Light-emitting element 9.

FIG. 30 shows current density-luminance characteristics of Light-emitting element 9. FIG. 31 shows luminance-current efficiency characteristics Light-emitting element 9. FIG. 32 shows voltage-luminance characteristics of Light-emitting element 9. FIG. 33 shows luminance-external quantum efficiency characteristics of Light-emitting element 9. FIG. 34 shows emission spectra of Light-emitting element 9.

As can be seen from the characteristics, although Light-emitting element 9 did not include an intermediate layer, Light-emitting element 9 had a current efficiency of approximately 70 cd/A at around 1000 cd/m$^2$ and an external quantum efficiency of 22% or higher. This indicates that Light-emitting element 9 had very high emission efficiency. The drive voltage is 2.9 V, which is much lower than the drive voltage of a tandem light-emitting element.

that an emission area became 90 mm×90 mm; and a surface of the substrate from which light is emitted was frosted.

Figure 35:
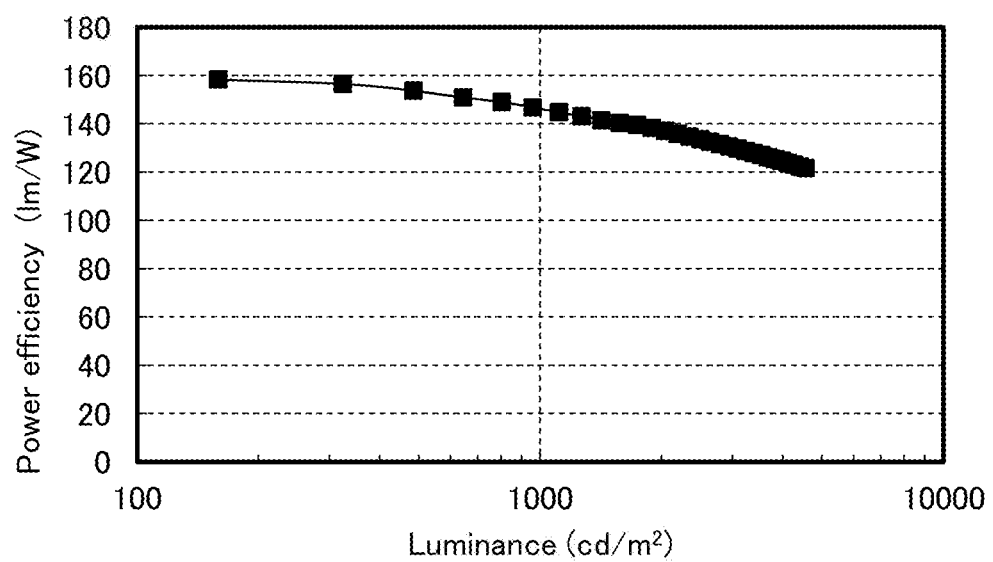
FIG. 35 shows the luminance-power efficiency characteristics of a lighting device in Example 5.

FIG. 35 shows the luminance-power efficiency characteristics of the organic EL lighting device. The organic EL lighting device had a color temperature of 2700K and duv=0.019, which confirm to the standards of incandescent color, and had an extremely high power efficiency of 140 lm/W at a luminance of around 1500 cd/m$^2$.

EXPLANATION OF REFERENCE

101: first electrode, 102: second electrode, 103: EL layer, 111: hole-injection layer, 112: hole-transport layer, 113: light-emitting layer, 113a: first light-emitting layer, 113b: separation layer, 113c: second light-emitting layer, 113c-

TABLE 10

| | Voltage (V) | Current density (mA/cm$^2$) | Current efficiency (cd/A) | Power efficiency (lm/W) | External quantum efficiency (%) | Correlated color temperature (K) |
|---|---|---|---|---|---|---|
| Light-emitting element 9 | 2.9 | 1.3 | 69 | 75 | 22 | 2730 |

As can be seen from the emission spectrum, phosphorescence originating from [Ir(dppm)$_2$(acac)] and [Ir(ppm-dmp)

1: first phosphorescent layer, 113c-2: second phosphorescent layer, 114: electron-transport layer, 115: electron-injection layer, 400: substrate, 401: first electrode, 403: EL layer, 404: second electrode, 405: sealant, 406: sealant, 407: sealing substrate, 412: pad, 420: IC chip, 501: first electrode, 502: second electrode, 511: first light-emitting unit, 512: second light-emitting unit, 513: charge-generation layer, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching FET, 612: current control FET, 613: first electrode, 614: insulator, 616: EL layer, 617: second electrode, 618: light-emitting element, 623: n-channel FET, 624: p-channel FET, 901: housing, 902: liquid crystal layer, 903: backlight unit, 904: housing, 905: driver IC, 906: terminal, 951: substrate, 952: electrode, 953: insulating layer, 954: partition wall layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: first electrode of light-emitting element, 1024R: first electrode of light-emitting element, 1024G: first electrode of light-emitting element, 1024B: first electrode of light-emitting element, 1025: partition wall, 1028: EL layer, 1029: second electrode of light-emitting element, 1031: sealing substrate, 1032: sealant, 1033: transparent base material, 1034R: red coloring layer, 1034G: green coloring layer, 1034B: blue coloring layer, 1035: black layer (black matrix), 1036: overcoat layer, 1037: third interlayer insulating film, 1040: pixel portion, 1041: driver circuit portion, 1042: peripheral portion, 2001: housing, 2002: light source, 3001: lighting device, 5000: display region, 5001: display region, 5002: display region, 5003: display region, 5004: display region, 5005: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7301: housing, 7302: housing, 7303: joint portion, 7304: display portion, 7305: display portion, 7306: speaker, 7307: recording medium insertion portion, 7308: LED lamp, 7309: operation key, 7310: connection terminal, 7311: sensor, 7401: housing, 7402: display portion, 7403: operation button, 7404: external connection port, 7405: speaker, 7406: microphone, 9033: clip, 9034: switch, 9035: power supply switch, 9036: switch, 9038: operation switch, 9630: housing, 9631: display portion, 9631*a*: display portion, 9631*b*: display portion, 9632*a*: touch panel region, 9632*b*: touch panel region, 9633: solar cell, 9634: charge and discharge control circuit, 9635: battery, 9636: DC-DC converter, 9637: operation key, 9638: converter, 9639: button This application is based on Japanese Patent Application serial no. 2013-249486 filed with Japan Patent Office on Dec. 2, 2013, Japanese Patent Application serial no. 2014-097803 filed with Japan Patent Office on May 9, 2014, and Japanese Patent Application serial no. 2014-180913 filed with Japan Patent Office on Sep. 5, 2014, the entire contents of which are hereby incorporated by reference.

The invention claimed is:

1. A light-emitting device comprising:
an anode, a plurality of light-emitting layers, a first layer and a cathode,
wherein the plurality of light-emitting layers comprises:
a first light-emitting layer over the anode, the first light-emitting layer comprising a fluorescent substance and a host material;
a second light-emitting layer over the first light-emitting layer; and
a third light-emitting layer over and in contact with the second light-emitting layer; and
wherein the first layer is positioned between the first light-emitting layer and the second light-emitting layer,
wherein the cathode is positioned over the third light-emitting layer,
wherein one of the second light-emitting layer and the third light-emitting layer comprises:
a first light-emitting substance which is configured to convert triplet excitation energy into light emission;
a first organic compound; and
a second organic compound,
wherein the first organic compound and the second organic compound are configured to form an exciplex, and
wherein a difference between an energy value of a peak wavelength of an emission spectrum of the exciplex and an energy value of a peak wavelength of a lowest-energy absorption band of the first light-emitting substance is 0.2 eV or less.

2. The light-emitting device according to claim 1, wherein the second light-emitting layer comprises a second light-emitting substance which is configured to convert triplet excitation energy into light emission.

3. The light-emitting device according to claim 1, wherein the first light-emitting substance is a phosphorescent material.

4. The light-emitting device according to claim 1,
wherein the second light-emitting layer comprises a second light-emitting substance which is configured to convert triplet excitation energy into light emission, and
wherein each of the first light-emitting substance and the second light-emitting substance is a phosphorescent material.

5. The light-emitting device according to claim 1,
wherein a peak wavelength of a spectrum emitted from the first light-emitting layer is shorter than a peak wavelength of a spectrum emitted from the second light-emitting layer, and
wherein the peak wavelength of the spectrum emitted from the first light-emitting layer is shorter than a peak wavelength of a spectrum emitted from the third light-emitting layer.

6. The light-emitting device according to claim 1, wherein a peak wavelength of a spectrum emitted from the third light-emitting layer is shorter than a peak wavelength of a spectrum emitted from the second light-emitting layer.

7. The light-emitting device according to claim 1, wherein a triplet excited level of the host material is lower than a triplet excited level of the fluorescent substance.

8. The light-emitting device according to claim 1, wherein the host material has an anthracene skeleton.

9. The light-emitting device according to claim 1, wherein the fluorescent substance is a pyrenediamine compound.

10. A light-emitting device comprising:
a first light-emitting element, a second light-emitting element, a third light-emitting element and a fourth light-emitting element, each comprising an anode, a plurality of light-emitting layers, a first layer and a cathode,
wherein the plurality of light-emitting layers each comprises:
a first light-emitting layer over the anode and between the anode and the first layer, the first light-emitting layer each comprising a fluorescent substance and a host material;
a second light-emitting layer over the first layer; and
a third light-emitting layer over and in contact with the second light-emitting layer and between the second light-emitting layer and the cathode,
wherein one of the second light-emitting layer and the third light-emitting layer each comprises:
a first light-emitting substance which is configured to convert triplet excitation energy into light emission;
a first organic compound; and
a second organic compound,
wherein the first organic compound and the second organic compound are configured to form an exciplex, and
wherein a difference between an energy value of a peak wavelength of an emission spectrum of the exciplex and an energy value of a peak wavelength of a lowest-energy absorption band of the first light-emitting substance is 0.2 eV or less,
wherein the first light-emitting element and a red color filter overlap each other,
wherein the second light-emitting element and a green color filter overlap each other,
wherein the third light-emitting element and a blue color filter overlap each other, and
wherein the fourth light-emitting element has a region which overlap none of the red color filter, the green color filter or the blue color filter.

11. The light-emitting device according to claim 10, wherein the second light-emitting layer comprises a second light-emitting substance which is configured to convert triplet excitation energy into light emission.

12. The light-emitting device according to claim 10, wherein the first light-emitting substance is a phosphorescent material.

13. The light-emitting device according to claim 10, wherein the second light-emitting layer comprises a second light-emitting substance which is configured to convert triplet excitation energy into light emission, and
wherein each of the first light-emitting substance and the second light-emitting substance is a phosphorescent material.

14. The light-emitting device according to claim 10, wherein a peak wavelength of a spectrum emitted from the first light-emitting layer is shorter than a peak wavelength of a spectrum emitted from the second light-emitting layer, and
wherein the peak wavelength of the spectrum emitted from the first light-emitting layer is shorter than a peak wavelength of a spectrum emitted from the third light-emitting layer.

15. The light-emitting device according to claim 10, wherein a peak wavelength of a spectrum emitted from the third light-emitting layer is shorter than a peak wavelength of a spectrum emitted from the second light-emitting layer.

16. The light-emitting device according to claim 10, wherein a triplet excited level of the host material is lower than a triplet excited level of the fluorescent substance.

17. The light-emitting device according to claim 10, wherein the host material has an anthracene skeleton.

18. The light-emitting device according to claim 10, wherein the fluorescent substance is a pyrenediamine compound.

* * * * *